(12) United States Patent
Lee et al.

(10) Patent No.: US 12,720,785 B2
(45) Date of Patent: Aug. 25, 2026

(54) NANOSHEET CHANNEL FORMATION METHOD AND STRUCTURE

(71) Applicant: Taiwan Semiconductor Manufacturing Co., Ltd., Hsinchu (TW)

(72) Inventors: Da-Yuan Lee, Jhubei (TW); Weng Chang, Hsinchu (TW)

(73) Assignee: Taiwan Semicondutor Manufacturing Co., Ltd., Hsinchu (TW)

( * ) Notice: Subject to any disclaimer, the term of this patent is extended or adjusted under 35 U.S.C. 154(b) by 936 days.

(21) Appl. No.: 17/832,979

(22) Filed: Jun. 6, 2022

(65) Prior Publication Data

US 2023/0131688 A1 Apr. 27, 2023

Related U.S. Application Data

(60) Provisional application No. 63/270,241, filed on Oct. 21, 2021.

(51) Int. Cl.

| | |
|---|---|
| ***H10D 30/01*** | (2025.01) |
| ***H10D 30/43*** | (2025.01) |
| ***H10D 30/67*** | (2025.01) |
| ***H10D 62/10*** | (2025.01) |
| ***H10D 64/01*** | (2025.01) |
| ***H10P 14/20*** | (2026.01) |
| ***H10P 50/64*** | (2026.01) |
| ***H10P 70/00*** | (2026.01) |

(52) U.S. Cl.

CPC ......... *H10D 30/031* (2025.01); *H10D 30/014* (2025.01); *H10D 30/43* (2025.01); *H10D 30/6735* (2025.01); *H10D 30/6757* (2025.01); *H10D 62/121* (2025.01); *H10D 64/017* (2025.01); *H10D 64/018* (2025.01); *H10P 14/3462* (2026.01); *H10P 50/642* (2026.01); *H10P 70/20* (2026.01)

(58) Field of Classification Search

CPC ......... H01L 21/02057; H01L 21/02343; H01L 21/02359; H01L 29/0635; H01L 23/0223; H01L 21/0223; H01L 21/02252; H01L 21/0225; H01L 21/30604; H10D 30/019; H10D 30/031; H10D 30/014; H10D 30/43; H10D 30/6735; H10D 30/6757; H10D 62/121; H10D 64/017; H10D 64/018; H10D 30/791; H10D 84/0167; H10D 84/038; H10D 84/85; H10D 84/853; B82Y 10/00; H10P 14/3462; H10P 50/642; H10P 70/20

See application file for complete search history.

(56) References Cited

U.S. PATENT DOCUMENTS

| | | | |
|---|---|---|---|
| 9,209,247 | B2 | 12/2015 | Colinge et al. |
| 9,236,267 | B2 | 1/2016 | De et al. |
| 9,412,817 | B2 | 8/2016 | Yang et al. |

(Continued)

*Primary Examiner* — Jessica S Manno
*Assistant Examiner* — Ricky Verdes
(74) *Attorney, Agent, or Firm* — Slater Matsil, LLP

(57) ABSTRACT

Embodiments include a nanoFET device and method for forming the same, the nanoFET having channel regions which have been thinned during a gate replacement process to remove etching residue. In some embodiments, the channel regions become dog bone shaped. In some embodiments, the ends of the channel regions have vertical protrusions or horns resulting from a previous trimming process which is performed prior to depositing sidewall spacers.

20 Claims, 53 Drawing Sheets

(56) References Cited

U.S. PATENT DOCUMENTS

| | | | | |
|---|---|---|---|---|
| 9,412,828 | B2 | 8/2016 | Ching et al. | |
| 9,472,618 | B2 | 10/2016 | Oxland | |
| 9,502,265 | B1 | 11/2016 | Jiang et al. | |
| 9,520,482 | B1 | 12/2016 | Chang et al. | |
| 9,536,738 | B2 | 1/2017 | Huang et al. | |
| 9,576,814 | B2 | 2/2017 | Wu et al. | |
| 9,608,116 | B2 | 3/2017 | Ching et al. | |
| 10,243,061 | B1 * | 3/2019 | Cheng | H01L 23/291 |
| 2021/0134677 | A1 | 5/2021 | Pan et al. | |
| 2021/0134970 | A1 | 5/2021 | Lee et al. | |
| 2021/0296318 | A1 | 9/2021 | Wang et al. | |
| 2021/0408289 | A1 * | 12/2021 | Guha | H10D 62/151 |

* cited by examiner 81
86
t2
t3
t1
t2
88
76
54C
52C
54B
52B
54A
52A
66
71
86
89
52r

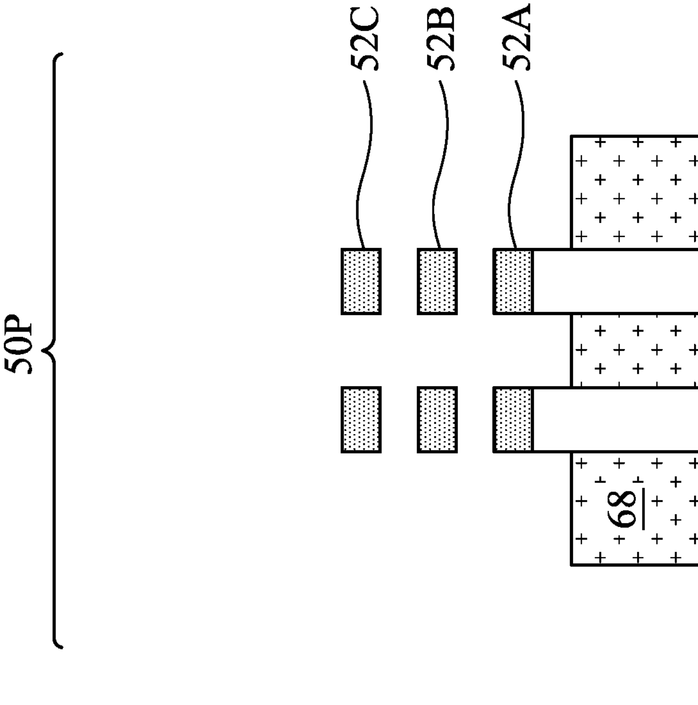
Figure 19A
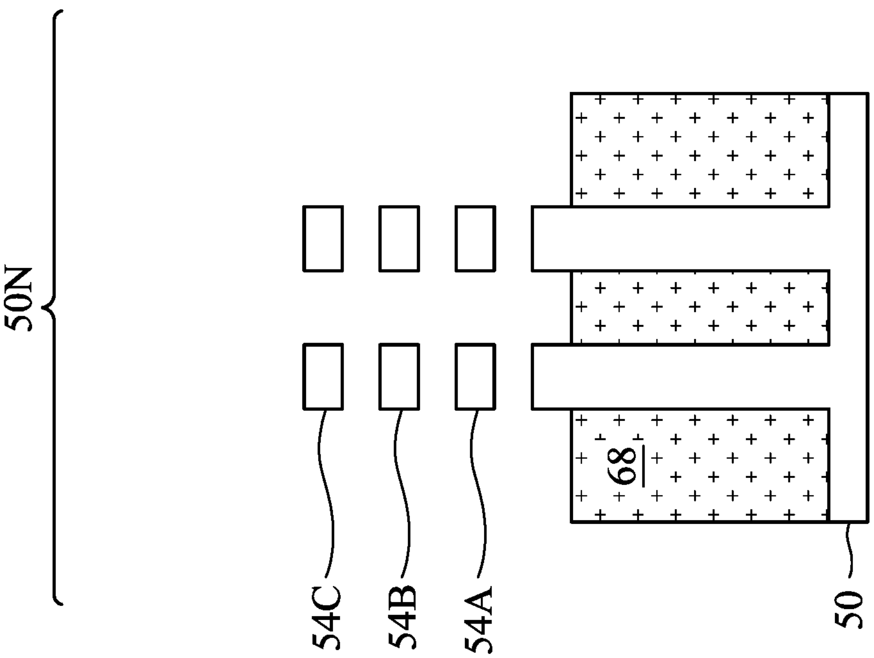

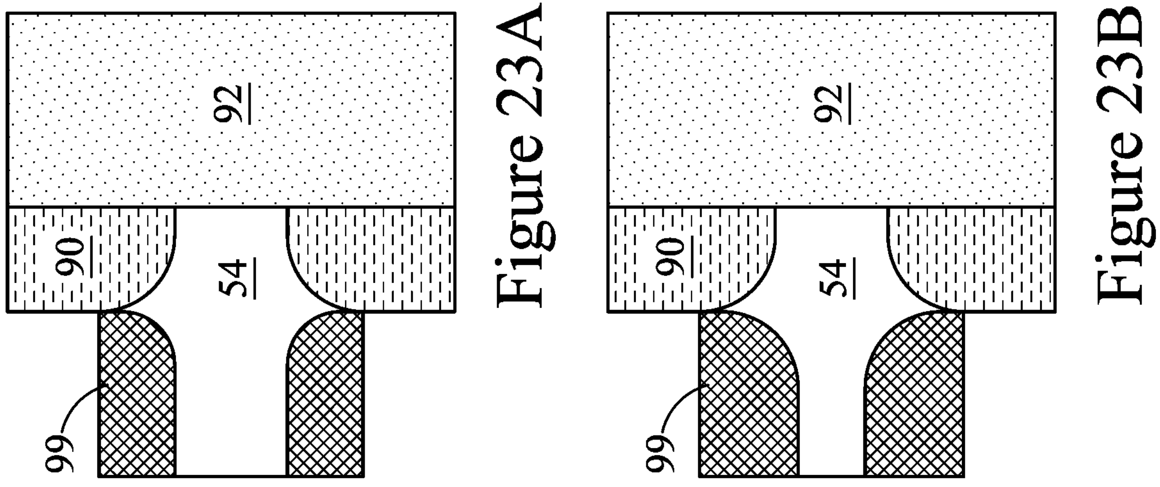
Figure 23A
Figure 23B
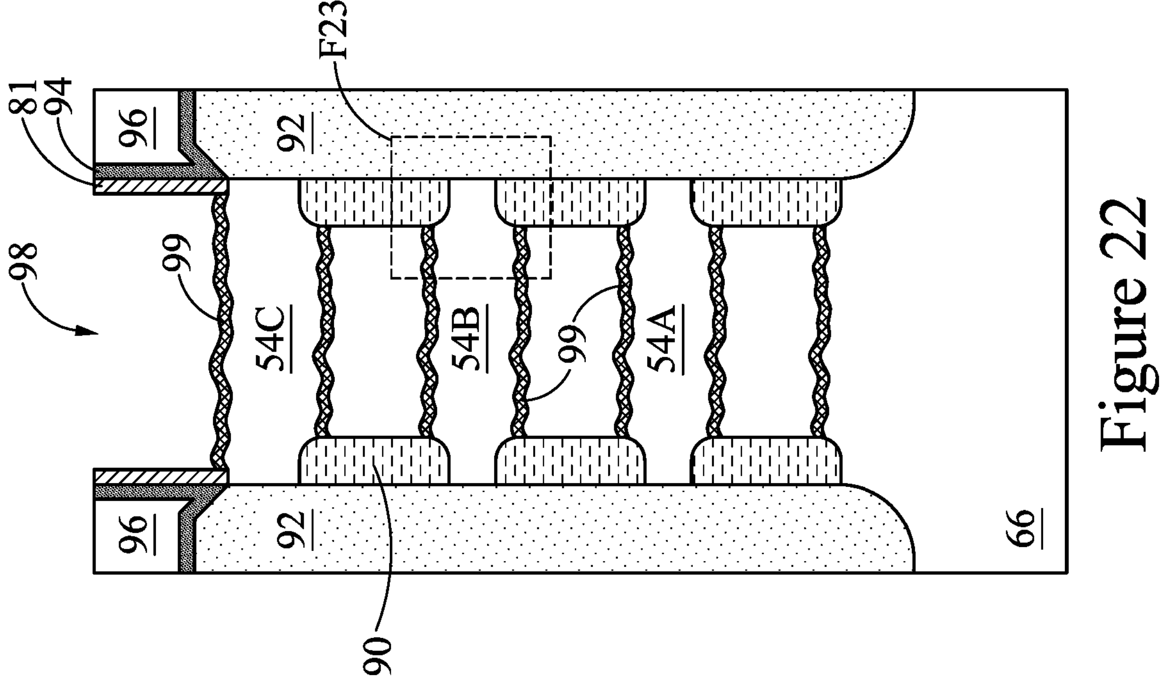
Figure 22

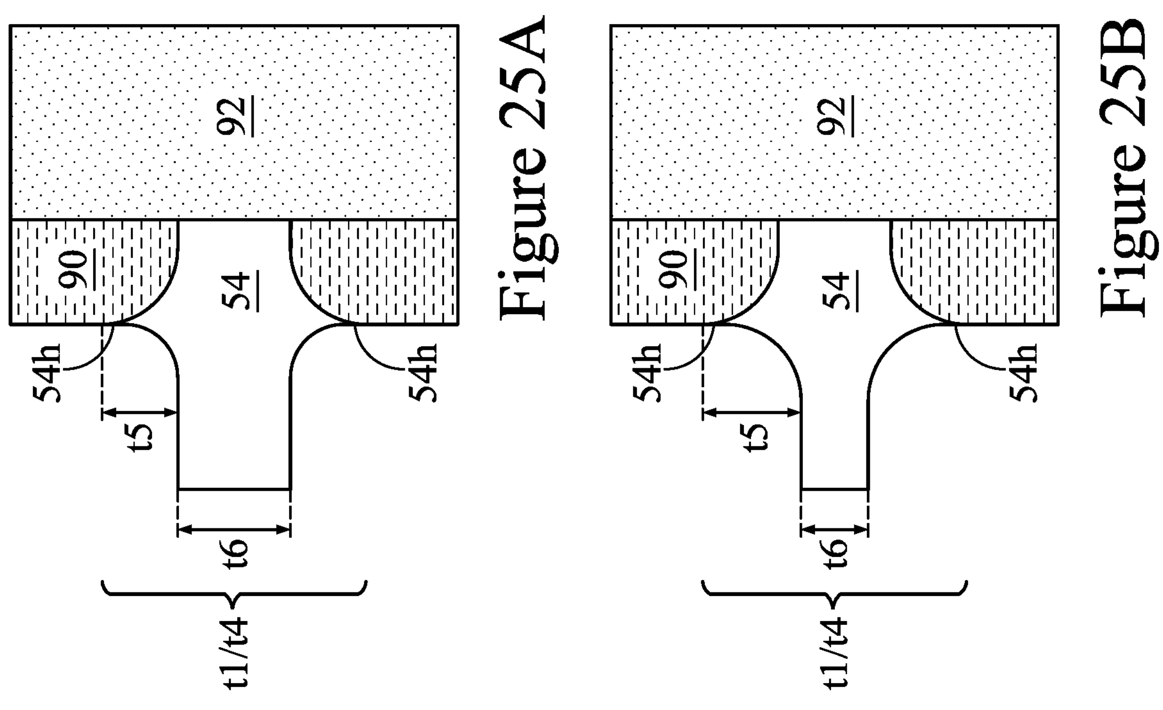
Figure 25A
Figure 25B
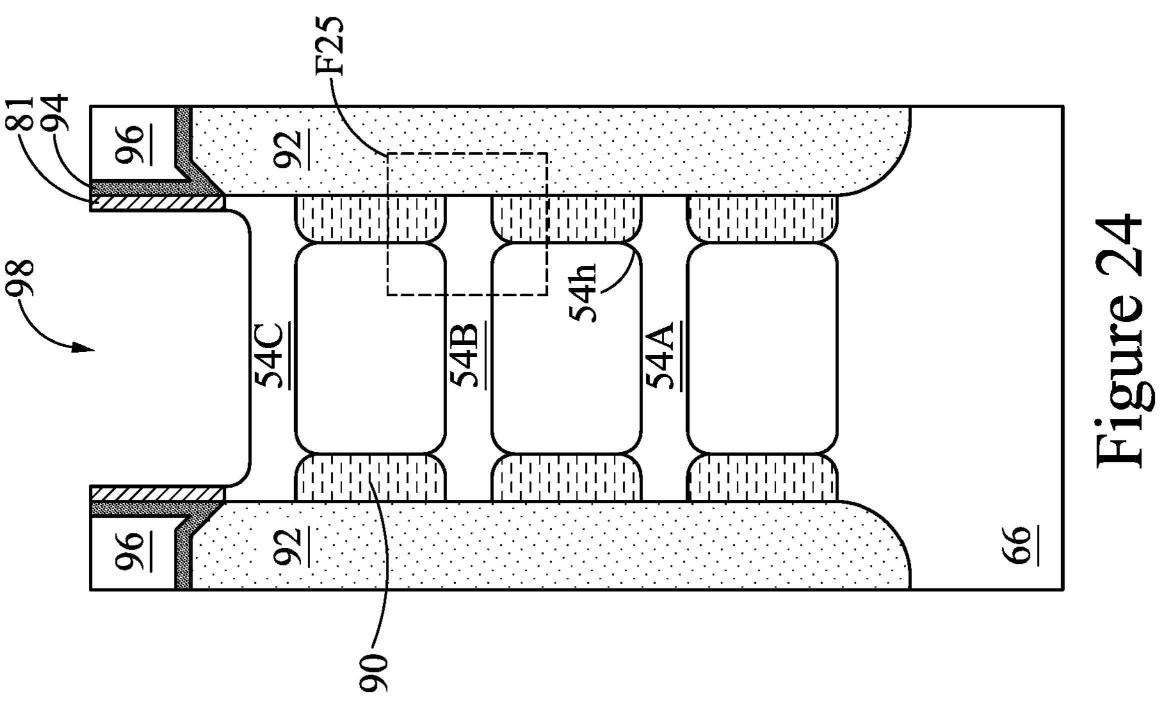
Figure 24

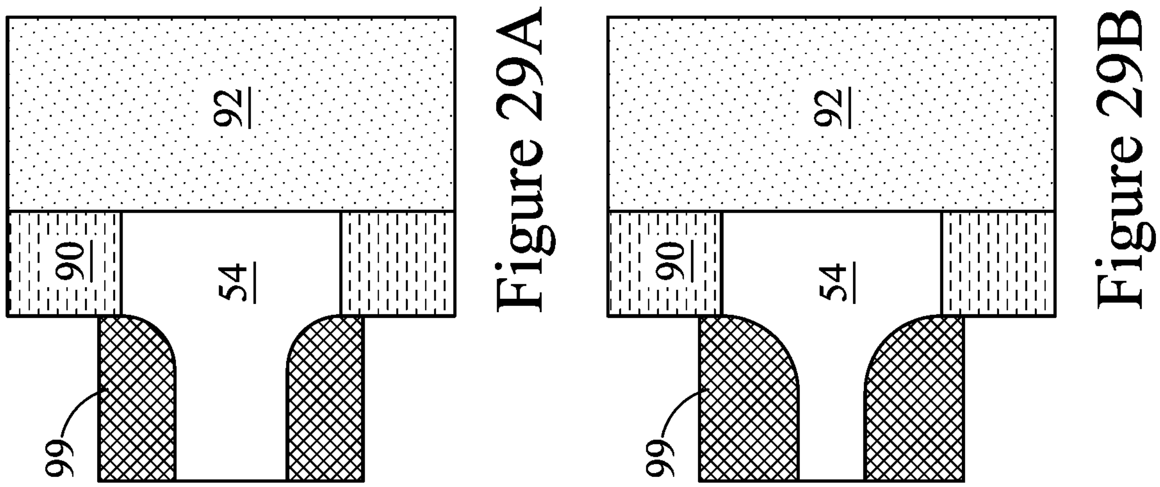
92
90
54
99
Figure 29A
92
90
54
99
Figure 29B
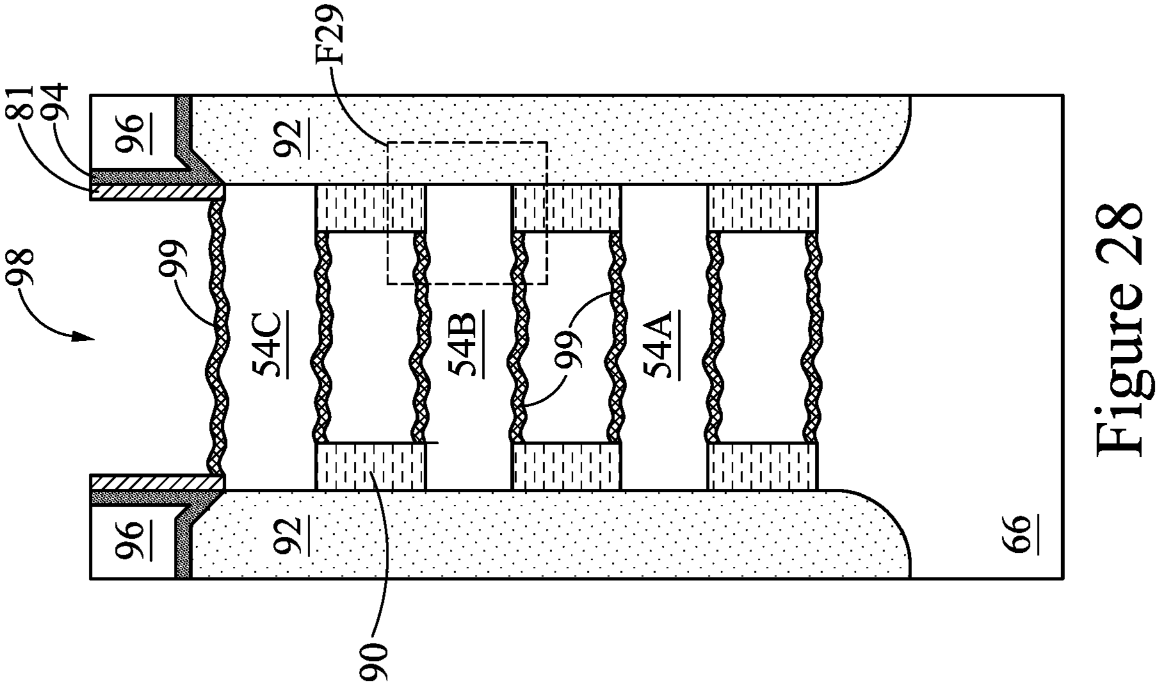
81
94
96
92
F29
98
99
54C
54B
54A
99
90
96
92
66
Figure 28

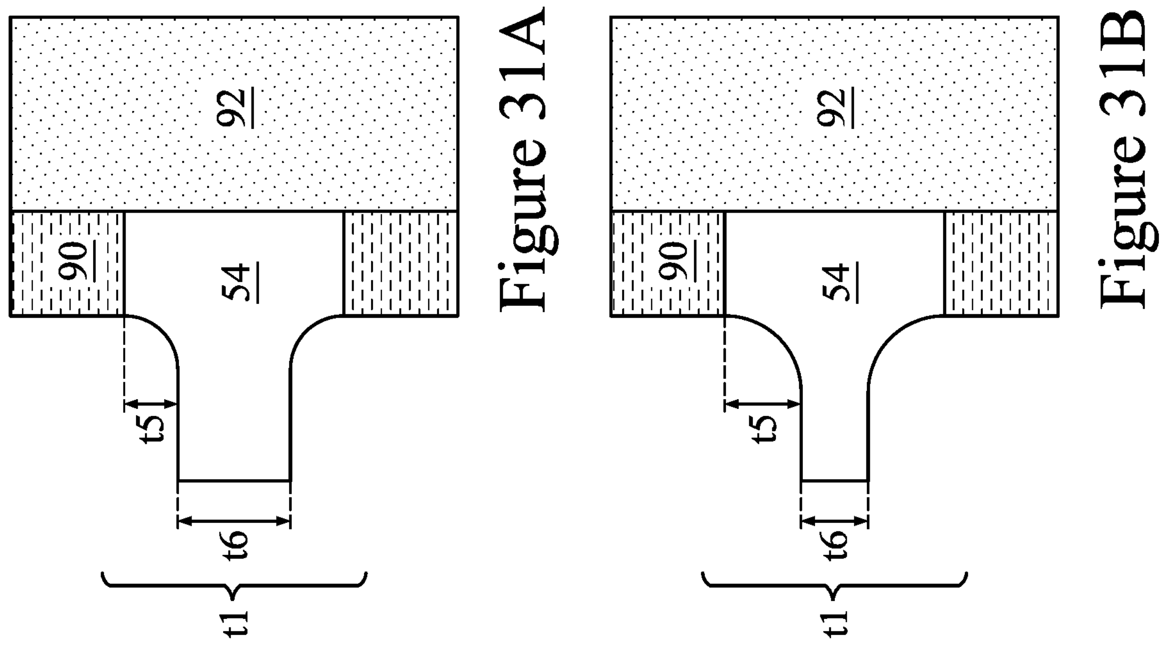
Figure 31A
Figure 31B
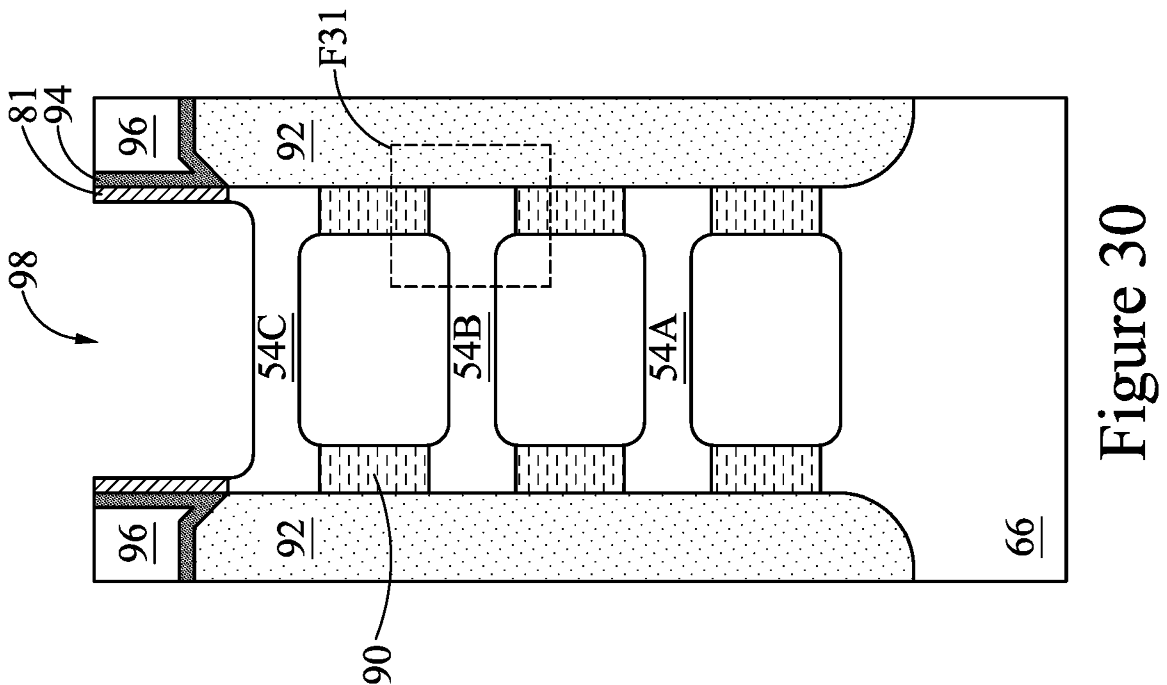
Figure 30

50P
81
52C
52B
52A
92
102
100
96
94
90
66
50

NANOSHEET CHANNEL FORMATION METHOD AND STRUCTURE

PRIORITY CLAIM AND CROSS-REFERENCE

This application claims the benefit of U.S. Provisional Application No. 63/270,241, filed on Oct. 21, 2021, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3, 4, 5, 6A, 6B, 7A, 7B 8A, 8B, 9A, 9B, 10A, 10B, 11, 12, 13, 14A, 14B, 14C, 14D, 15A, 15B, 16A, 16B, 16C, 17A, 17B, 17C, 18A, 18B, 19A, 19B, 20, 21, 22, 23A, 23B, 24, 25A, 25B, 25C, 25D, 25E, 26, 27, 28, 29A, 29B, 30, 31A, 31B, 31C, 31D, 31E, 32A, 32B, 33A, 33B, 34A, 34B, and 34C are cross-sectional or perspective views of intermediate stages in the manufacturing of nano-FETs, in accordance with some embodiments.

DETAILED DESCRIPTION

Figure 1:
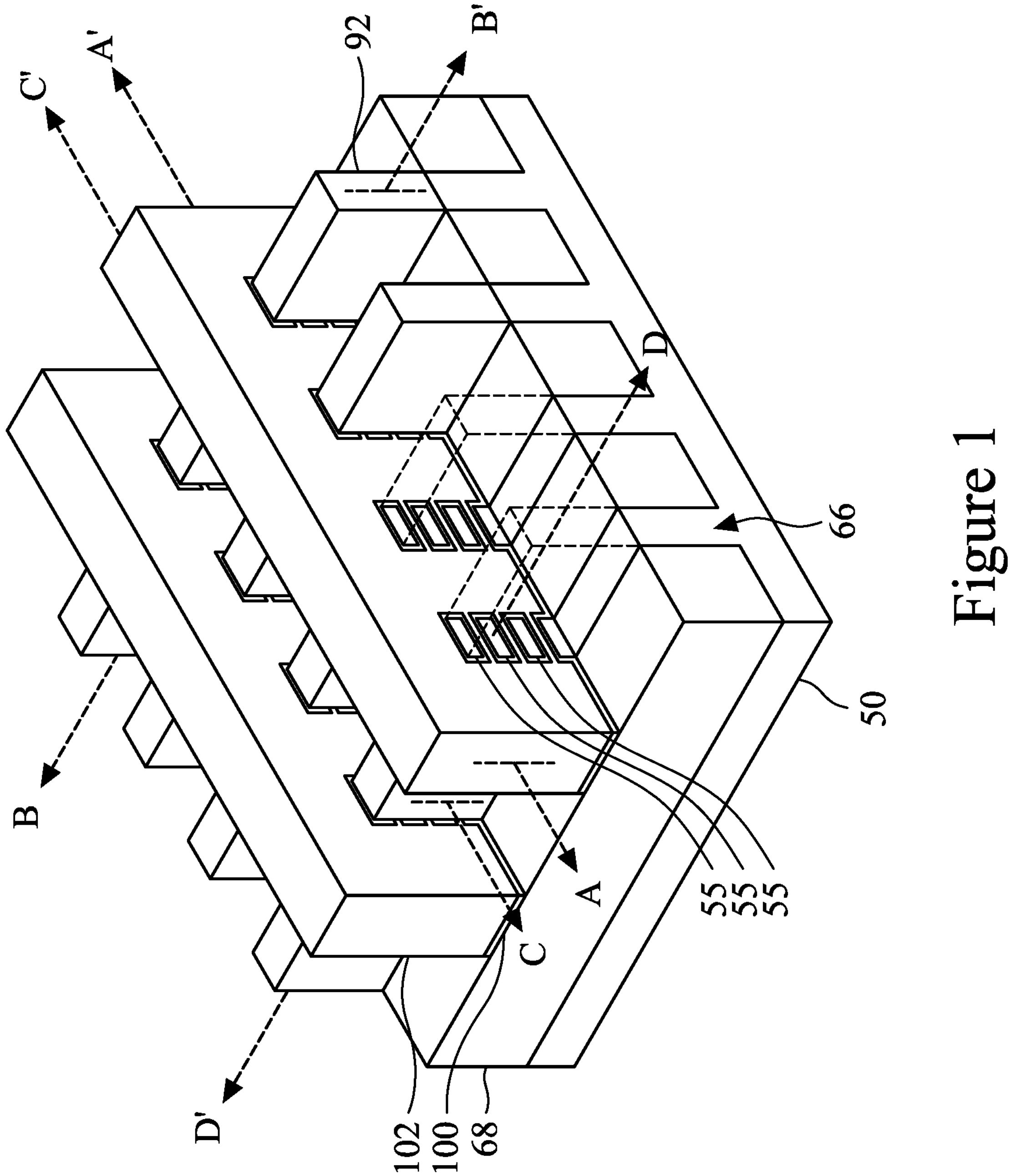
FIG. 1 illustrates an example of a nanostructure field-effect transistor (nano-FET) in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Nano-FETs (e.g., nanowire FETs, nanosheet FETs (Nano-FETs), or the like) may used alternating nanostructure layers which are deposited over a substrate and patterned into fin structures. A gate is formed over the fin structures and on either side of the gate source/drain regions may be formed. Under the gate, some of the nanostructure layers are selectively etched to form channels between the source/drain regions. When the nanostructure layers are selectively etched, the etching can leave behind residue which can negatively impact the performance of the channels. Also, although the etching is selective to the material removed to release the channels, the surface of the remaining channels can have a rough texture, at least in part due to the residue from the etching process. The rough texture can also negatively impact channel performance as it interfaces with the gate work function layers. For example, the residue and rough texture can impact channel mobility, interface state density, and threshold voltage fluctuation due to work function shift. Embodiments address these issues by providing a process for residue removal and smoothing after releasing the channels under the gates.

In addition, in some embodiments, a similar process may be used when etching the spacer recesses adjacent the openings for the source/drain regions, as will be discussed in greater detail below. This process can also remove residue resulting from etching the spacer recesses from tips of the channel region and provide a smoothed surface for interfacing with the subsequently deposited source/drain regions. Embodiments may use an oxidation process to oxidize the remaining residue as well as a portion of the underlying channel material, followed by a cleaning/etching step which effectively removes the residue and smooths the channel surface.

FIG. 1 illustrates an example of nano-FETs (e.g., nanowire FETs, nanosheet FETs (Nano-FETs), or the like) in a three-dimensional view, in accordance with some embodiments. The nano-FETs comprise nanostructures 55 (e.g., nanosheets, nanowire, or the like) over fins 66 on a substrate 50 (e.g., a semiconductor substrate), wherein the nanostructures 55 act as channel regions for the nano-FETs. The nanostructure 55 may include p-type nanostructures, n-type nanostructures, or a combination thereof. Isolation regions 68 are disposed between adjacent fins 66, which may protrude above and from between neighboring isolation regions 68. Although the isolation regions 68 are described/illustrated as being separate from the substrate 50, as used herein, the term "substrate" may refer to the semiconductor substrate alone or a combination of the semiconductor substrate and the isolation regions. Additionally, although a bottom portion of the fins 66 are illustrated as being single, continuous materials with the substrate 50, the bottom portion of the fins 66 and/or the substrate 50 may comprise a single material or a plurality of materials. In this context, the fins 66 refer to the portion extending between the neighboring isolation regions 68.

Gate dielectric layers 100 are over top surfaces of the fins 66 and along top surfaces, sidewalls, and bottom surfaces of the nanostructures 55. Gate electrodes 102 are over the gate dielectric layers 100. Epitaxial source/drain regions 92 (e.g., source regions and/or drain regions) are disposed on the fins 66 on opposing sides of the gate dielectric layers 100 and the gate electrodes 102.

FIG. 1 further illustrates reference cross-sections that are used in later figures. Cross-section A-A' is along a longitudinal axis of a gate electrode 102 and in a direction, for example, perpendicular to the direction of current flow between the epitaxial source/drain regions 92 of a nano-FET. Cross-section B-B' is perpendicular to cross-section A-A' and is parallel to a longitudinal axis of a fin 66 of the nano-FET and in a direction of, for example, a current flow between the epitaxial source/drain regions 92 of the nano-FET. Cross-section C-C' is parallel to cross-section A-A' and extends through epitaxial source/drain regions of the nano-FETs. Subsequent figures refer to these reference cross-sections for clarity.

Some embodiments discussed herein are discussed in the context of nano-FETs formed using a gate-last process. In other embodiments, a gate-first process may be used. Also, some embodiments contemplate aspects used in planar devices, such as planar FETs or in fin field-effect transistors (FinFETs).

Figure 25C:
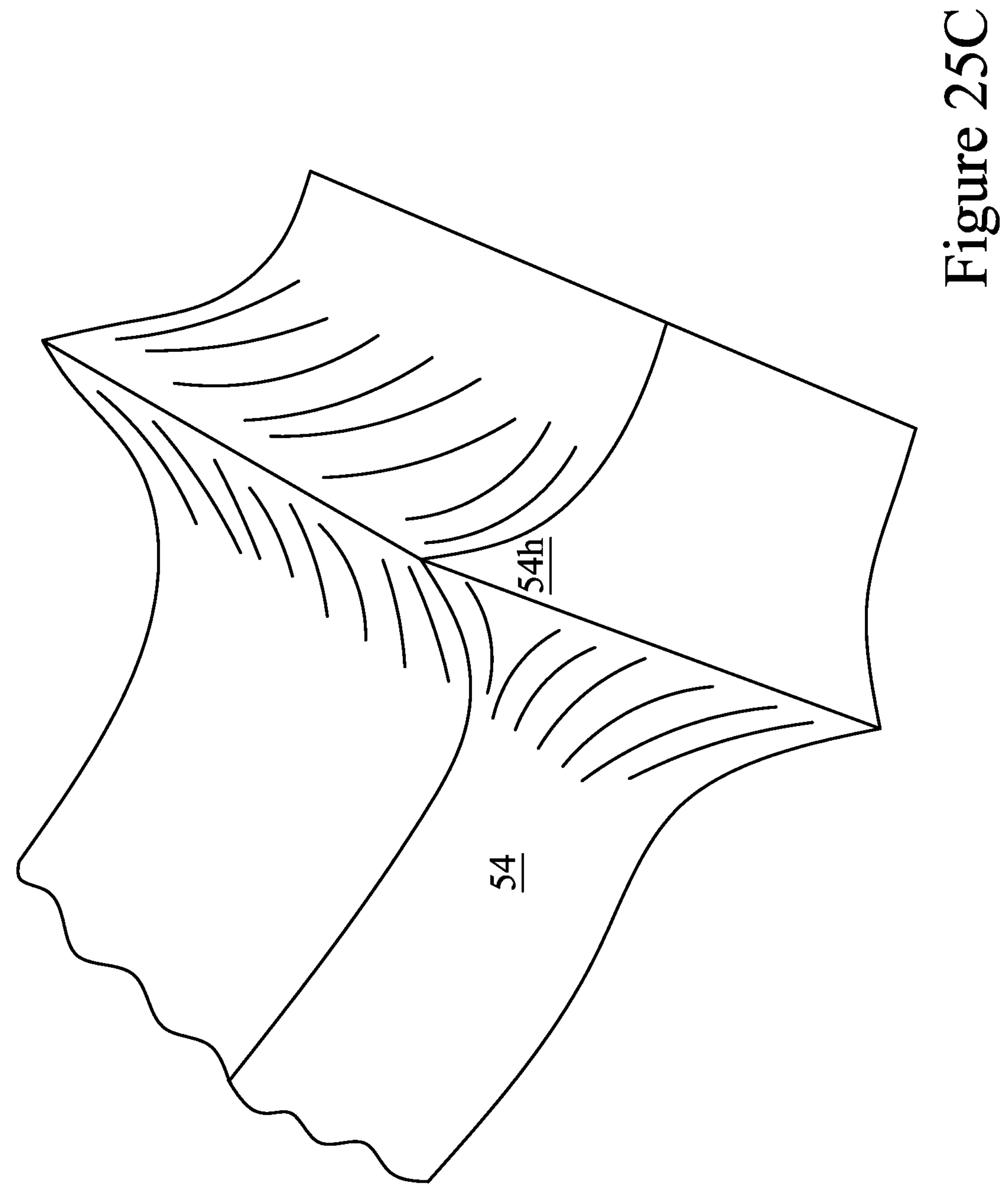

FIGS. 2 through 34C are views of intermediate stages in the manufacturing of nano-FETs, in accordance with some embodiments. FIGS. 2 through 5, 6A, 16A, 17A, 18A, 19A, 32A, and 34A illustrate reference cross-section A-A' illustrated in FIG. 1. FIGS. 6B, 7B, 8B, 9B, 10B, 11, 12, 13, 14B, 14C, 14D, 15B, 16B, 17B, 18B, 19B, 20, 21, 22, 23A, 23B, 24, 25A, 25B, 26, 27, 28, 29A, 29B, 30, 31A, 31B, 32B, 33A, 33B, and 34B illustrate reference cross-section B-B' illustrated in FIG. 1. FIGS. 7A, 8A, 9A, 10A, 14A, 15A, 16C, 17C, and 34C, illustrate reference cross-section C-C' illustrated in FIG. 1. FIGS. 25C and 30C illustrate perspective views of an isolated end portion of the second nanostructures 54 after a channel smoothing and residue removal process. FIGS. 25D, 25E, 31D, and 31E illustrate reference horizontal cross-section D-D' illustrated in FIG. 1.

Figure 2:
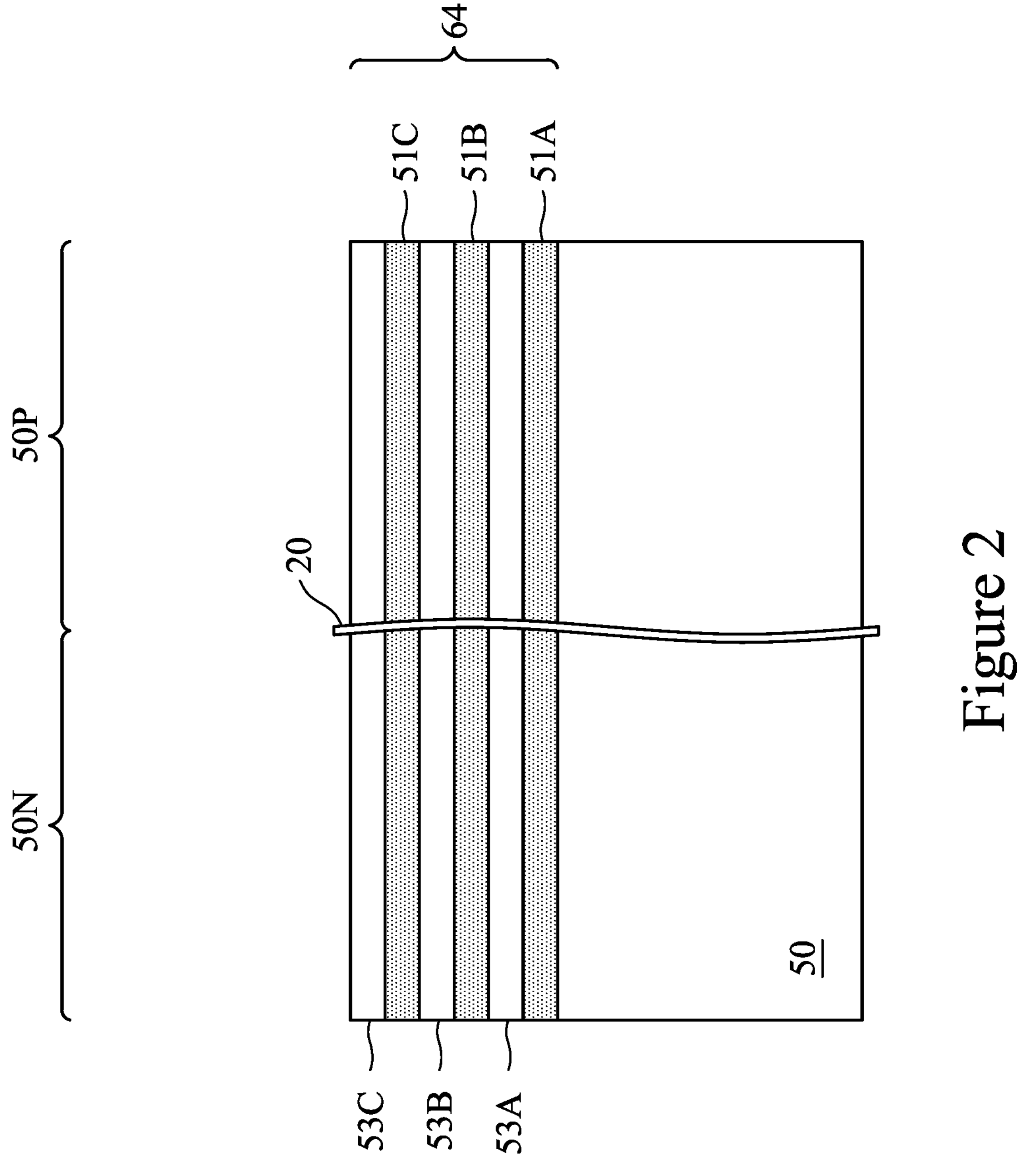

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has an n-type region 50N and a p-type region 50P. The n-type region 50N can be for forming n-type devices, such as NMOS transistors, e.g., n-type nano-FETs, and the p-type region 50P can be for forming p-type devices, such as PMOS transistors, e.g., p-type nano-FETs. The n-type region 50N may be physically separated from the p-type region 50P (as illustrated by divider 20), and any number of device features (e.g., other active devices, doped regions, isolation structures, etc.) may be disposed between the n-type region 50N and the p-type region 50P. Although one n-type region 50N and one p-type region 50P are illustrated, any number of n-type regions 50N and p-type regions 50P may be provided.

Further in FIG. 2, a multi-layer stack 64 is formed over the substrate 50. The multi-layer stack 64 includes alternating layers of first semiconductor layers 51A-C (collectively referred to as first semiconductor layers 51) and second semiconductor layers 53A-C (collectively referred to as second semiconductor layers 53). For purposes of illustration and as discussed in greater detail below, the second semiconductor layers 53 will be removed and the first semiconductor layers 51 will be patterned to form channel regions of nano-FETs in the p-type region 50P. Also, the first semiconductor layers 51 will be removed and the second semiconductor layers 53 will be patterned to form channel regions of nano-FETs in the n-type region 50N. Nevertheless, in some embodiments the first semiconductor layers 51 may be removed and the second semiconductor layers 53 may be patterned to form channel regions of nano-FETs in the n-type region 50N, and the second semiconductor layers 53 may be removed and the first semiconductor layers 51 may be patterned to form channel regions of nano-FETs in the p-type region 50P.

In still other embodiments, the first semiconductor layers 51 may be removed and the second semiconductor layers 53 may be patterned to form channel regions of nano-FETS in both the n-type region 50N and the p-type region 50P. In other embodiments, the second semiconductor layers 53 may be removed and the first semiconductor layers 51 may be patterned to form channel regions of nano-FETs in both the n-type region 50N and the p-type region 50P. In such embodiments, the channel regions in both the n-type region 50N and the p-type region 50P may have a same material composition (e.g., silicon, or the another semiconductor material) and be formed simultaneously. FIGS. 35A, 35B, 35C, 35D, and 35E illustrate a structure resulting from such embodiments where the channel regions in both the p-type region 50P and the n-type region 50N comprise silicon, for example.

The multi-layer stack 64 is illustrated as including three layers of each of the first semiconductor layers 51 and the second semiconductor layers 53 for illustrative purposes. In some embodiments, the multi-layer stack 64 may include any number of the first semiconductor layers 51 and the second semiconductor layers 53. Each of the layers of the multi-layer stack 64 may be epitaxially grown using a process such as chemical vapor deposition (CVD), atomic layer deposition (ALD), vapor phase epitaxy (VPE), molecular beam epitaxy (MBE), or the like. In various embodiments, the first semiconductor layers 51 may be formed of a first semiconductor material suitable for p-type nano-FETs, such as silicon germanium, or the like, and the second semiconductor layers 53 may be formed of a second semiconductor material suitable for n-type nano-FETs, such as silicon, silicon carbon, or the like. The multi-layer stack 64 is illustrated as having a bottommost semiconductor layer suitable for p-type nano-FETs for illustrative purposes. In some embodiments, multi-layer stack 64 may be formed such that the bottommost layer is a semiconductor layer suitable for n-type nano-FETs.

The first semiconductor materials and the second semiconductor materials may be materials having a high-etch selectivity to one another. As such, the first semiconductor layers 51 of the first semiconductor material may be removed without significantly removing the second semiconductor layers 53 of the second semiconductor material in the n-type region 50N, thereby allowing the second semiconductor layers 53 to be patterned to form channel regions of n-type nano-FETs. Similarly, the second semiconductor layers 53 of the second semiconductor material may be removed without significantly removing the first semiconductor layers 51 of the first semiconductor material in the p-type region 50P, thereby allowing the first semiconductor layers 51 to be patterned to form channel regions of p-type nano-FETs.

Figure 3:
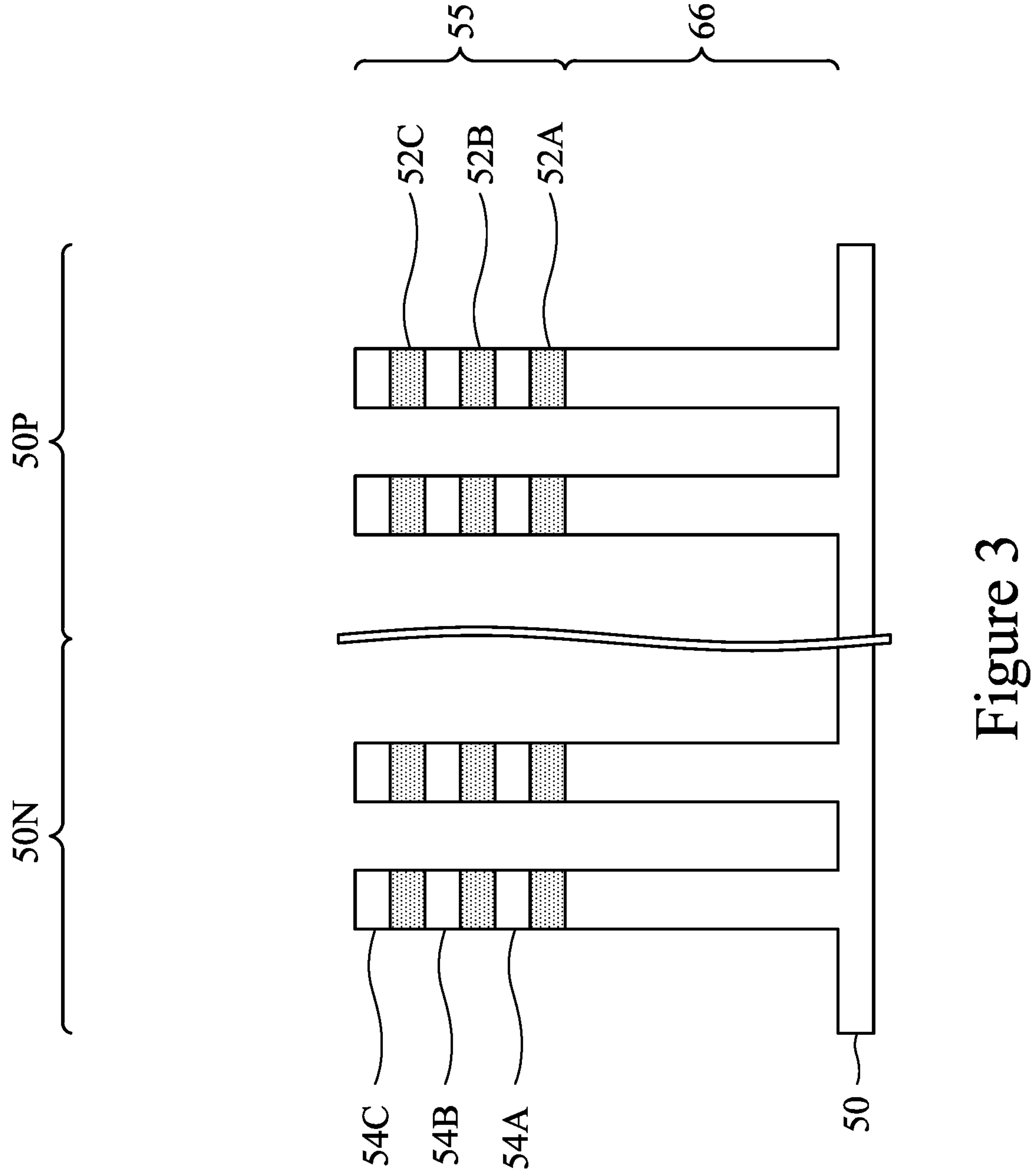

Referring now to FIG. 3, fins 66 are formed in the substrate 50 and nanostructures 55 are formed in the multi-layer stack 64, in accordance with some embodiments. In some embodiments, the nanostructures 55 and the fins 66 may be formed in the multi-layer stack 64 and the substrate 50, respectively, by etching trenches in the multi-layer stack 64 and the substrate 50. The etching may be any acceptable etch process, such as a reactive ion etch (RIE), neutral beam etch (NBE), the like, or a combination thereof. The etching may be anisotropic. Forming the nanostructures 55 by etching the multi-layer stack 64 may further define first nanostructures 52A-C (collectively referred to as the first nanostructures 52) from the first semiconductor layers 51 and define second nanostructures 54A-C (collectively referred to as the second nanostructures 54) from the second semiconductor layers 53. The first nanostructures 52 and the second nanostructures 54 may further be collectively referred to as nanostructures 55.

The fins 66 and the nanostructures 55 may be patterned by any suitable method. For example, the fins 66 and the nanostructures 55 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins 66.

FIG. 3 illustrates the fins 66 in the n-type region 50N and the p-type region 50P as having substantially equal widths for illustrative purposes. In some embodiments, widths of the fins 66 in the n-type region 50N may be greater or thinner than the fins 66 in the p-type region 50P. Further, while each of the fins 66 and the nanostructures 55 are illustrated as having a consistent width throughout, in other embodiments, the fins 66 and/or the nanostructures 55 may have tapered sidewalls such that a width of each of the fins 66 and/or the nanostructures 55 continuously increases in a direction towards the substrate 50. In such embodiments, each of the nanostructures 55 may have a different width and be trapezoidal in shape.

Figure 4:
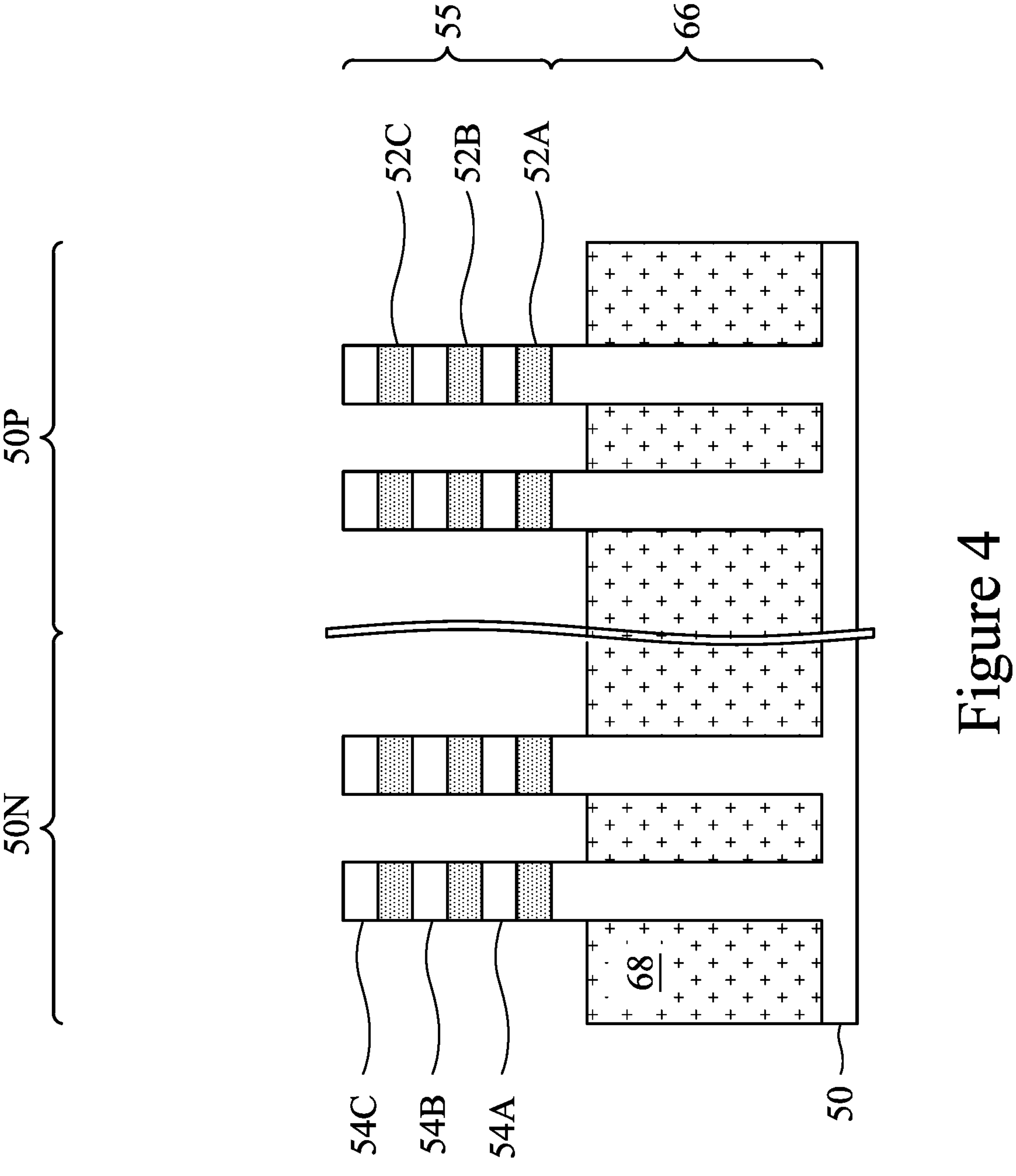

In FIG. 4, shallow trench isolation (STI) regions 68 are formed adjacent the fins 66. The STI regions 68 may be formed by depositing an insulation material over the substrate 50, the fins 66, and nanostructures 55, and between adjacent fins 66. The insulation material may be an oxide, such as silicon oxide, a nitride, the like, or a combination thereof, and may be formed by high-density plasma CVD (HDP-CVD), flowable CVD (FCVD), the like, or a combination thereof. Other insulation materials formed by any acceptable process may be used. In the illustrated embodiment, the insulation material is silicon oxide formed by an FCVD process. An anneal process may be performed once the insulation material is formed. In an embodiment, the insulation material is formed such that excess insulation material covers the nanostructures 55. Although the insulation material is illustrated as a single layer, some embodiments may utilize multiple layers. For example, in some embodiments a liner (not separately illustrated) may first be formed along a surface of the substrate 50, the fins 66, and the nanostructures 55. Thereafter, a fill material, such as those discussed above may be formed over the liner.

A removal process is then applied to the insulation material to remove excess insulation material over the nanostructures 55. In some embodiments, a planarization process such as a chemical mechanical polish (CMP), an etch-back process, combinations thereof, or the like may be utilized. The planarization process exposes the nanostructures 55 such that top surfaces of the nanostructures 55 and the insulation material are level after the planarization process is complete.

The insulation material is then recessed to form the STI regions 68. The insulation material is recessed such that upper portions of fins 66 in the n-type region 50N and the p-type region 50P protrude from between neighboring STI regions 68. Further, the top surfaces of the STI regions 68 may have a flat surface as illustrated, a convex surface, a concave surface (such as dishing), or a combination thereof. The top surfaces of the STI regions 68 may be formed flat, convex, and/or concave by an appropriate etch. The STI regions 68 may be recessed using an acceptable etching process, such as one that is selective to the material of the insulation material (e.g., etches the material of the insulation material at a faster rate than the material of the fins 66 and the nanostructures 55). For example, an oxide removal using, for example, dilute hydrofluoric (dHF) acid may be used.

The process described above with respect to FIGS. 2 through 4 is just one example of how the fins 66 and the nanostructures 55 may be formed. In some embodiments, the fins 66 and/or the nanostructures 55 may be formed using a mask and an epitaxial growth process. For example, a dielectric layer can be formed over a top surface of the substrate 50, and trenches can be etched through the dielectric layer to expose the underlying substrate 50. Epitaxial structures can be epitaxially grown in the trenches, and the dielectric layer can be recessed such that the epitaxial structures protrude from the dielectric layer to form the fins 66 and/or the nanostructures 55. The epitaxial structures may comprise the alternating semiconductor materials discussed above, such as the first semiconductor materials and the second semiconductor materials. In some embodiments where epitaxial structures are epitaxially grown, the epitaxially grown materials may be in situ doped during growth, which may obviate prior and/or subsequent implantations, although in situ and implantation doping may be used together.

Additionally, the first semiconductor layers 51 (and resulting first nanostructures 52) and the second semiconductor layers 53 (and resulting second nanostructures 54) are illustrated and discussed herein as comprising the same materials in the p-type region 50P and the n-type region 50N for illustrative purposes only. As such, in some embodiments one or both of the first semiconductor layers 51 and the second semiconductor layers 53 may be different materials or formed in a different order in the p-type region 50P and the n-type region 50N.

Further in FIG. 4, appropriate wells (not separately illustrated) may be formed in the fins 66, the nanostructures 55, and/or the STI regions 68. In embodiments with different well types, different implant steps for the n-type region 50N and the p-type region 50P may be achieved using a photoresist or other masks (not separately illustrated). For example, a photoresist may be formed over the fins 66 and the STI regions 68 in the n-type region 50N and the p-type region 50P. The photoresist is patterned to expose the p-type region 50P. The photoresist can be formed by using a spin-on technique and can be patterned using acceptable photolithography techniques. Once the photoresist is patterned, an n-type impurity implant is performed in the p-type region 50P, and the photoresist may act as a mask to substantially prevent n-type impurities from being implanted into the n-type region 50N. The n-type impurities may be phosphorus, arsenic, antimony, or the like implanted in the region to a concentration in a range from about $10^{13}$ atoms/$cm^3$ to about $10^{14}$ atoms/$cm^3$. After the implant, the photoresist is removed, such as by an acceptable ashing process.

Following or prior to the implanting of the p-type region 50P, a photoresist or other masks (not separately illustrated) is formed over the fins 66, the nanostructures 55, and the STI regions 68 in the p-type region 50P and the n-type region 50N. The photoresist is patterned to expose the n-type region 50N. The photoresist can be formed by using a spin-on technique and can be patterned using acceptable photolithography techniques. Once the photoresist is patterned, a p-type impurity implant may be performed in the n-type region 50N, and the photoresist may act as a mask to substantially prevent p-type impurities from being implanted into the p-type region 50P. The p-type impurities may be boron, boron fluoride, indium, or the like implanted in the region to a concentration in a range from about $10^{13}$ atoms/$cm^3$ to about $10^{14}$ atoms/$cm^3$. After the implant, the photoresist may be removed, such as by an acceptable ashing process.

After the implants of the n-type region 50N and the p-type region 50P, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

Figure 5:
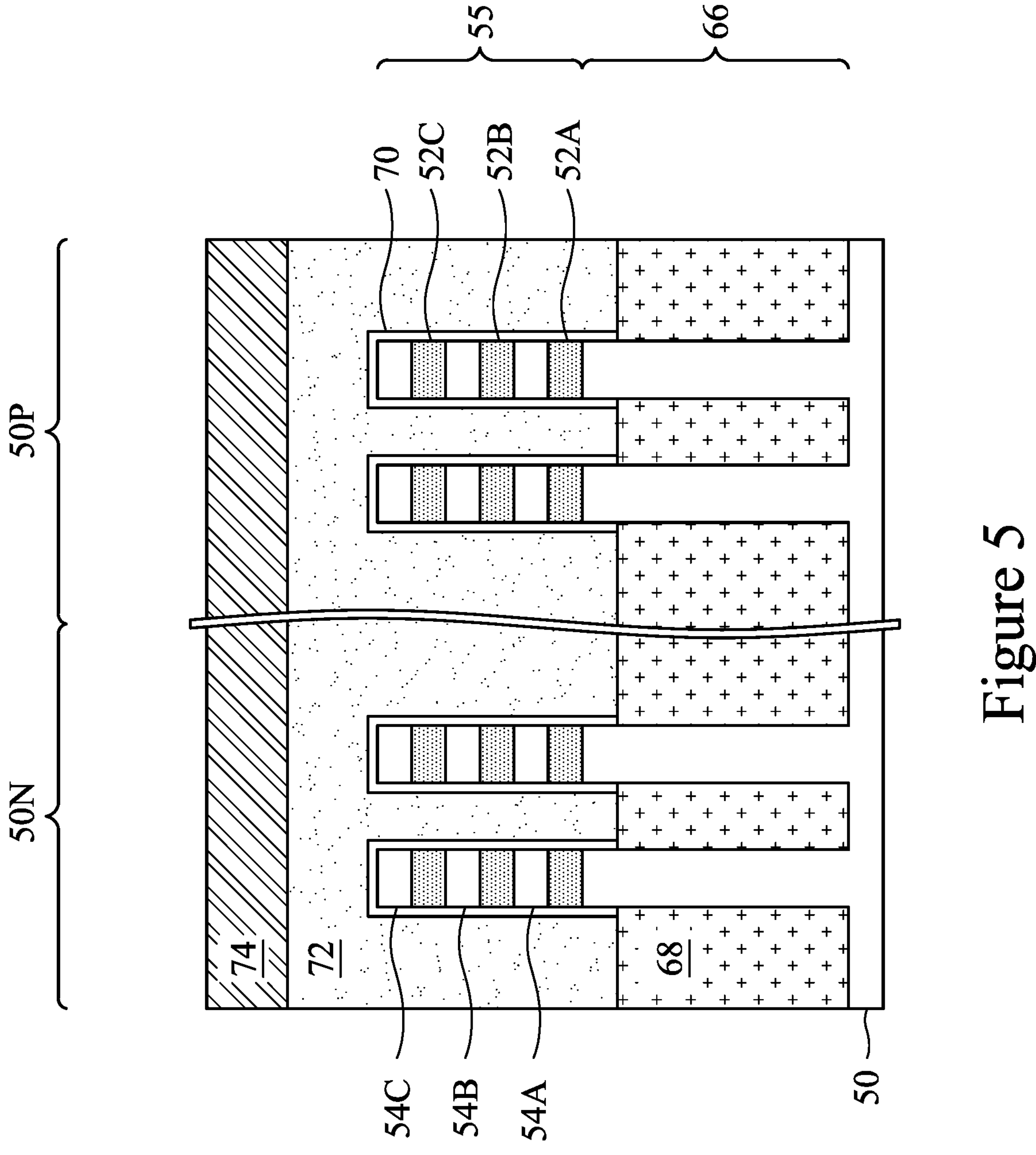

In FIG. 5, a dummy dielectric layer 70 is formed on the fins 66 and/or the nanostructures 55. The dummy dielectric layer 70 may be, for example, silicon oxide, silicon nitride, a combination thereof, or the like, and may be deposited or thermally grown according to acceptable techniques. A dummy gate layer 72 is formed over the dummy dielectric layer 70, and a mask layer 74 is formed over the dummy gate layer 72. The dummy gate layer 72 may be deposited over the dummy dielectric layer 70 and then planarized, such as by a CMP. The mask layer 74 may be deposited over the dummy gate layer 72. The dummy gate layer 72 may be a conductive or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer 72 may be deposited by physical vapor deposition (PVD), CVD, sputter deposition, or other techniques for depositing the selected material. The dummy gate layer 72 may be made of other materials that have a high etching selectivity from the etching of isolation regions. The mask layer 74 may include, for example, silicon nitride, silicon oxynitride, or the like. In this example, a single dummy gate layer 72 and a single mask layer 74 are formed across the n-type region 50N and the p-type region 50P. It is noted that the dummy dielectric layer 70 is shown covering only the fins 66 and the nanostructures 55 for illustrative purposes only. In some embodiments, the dummy dielectric layer 70 may be deposited such that the dummy dielectric layer 70 covers the STI regions 68, such that the dummy dielectric layer 70 extends between the dummy gate layer 72 and the STI regions 68.

Figure 6A:
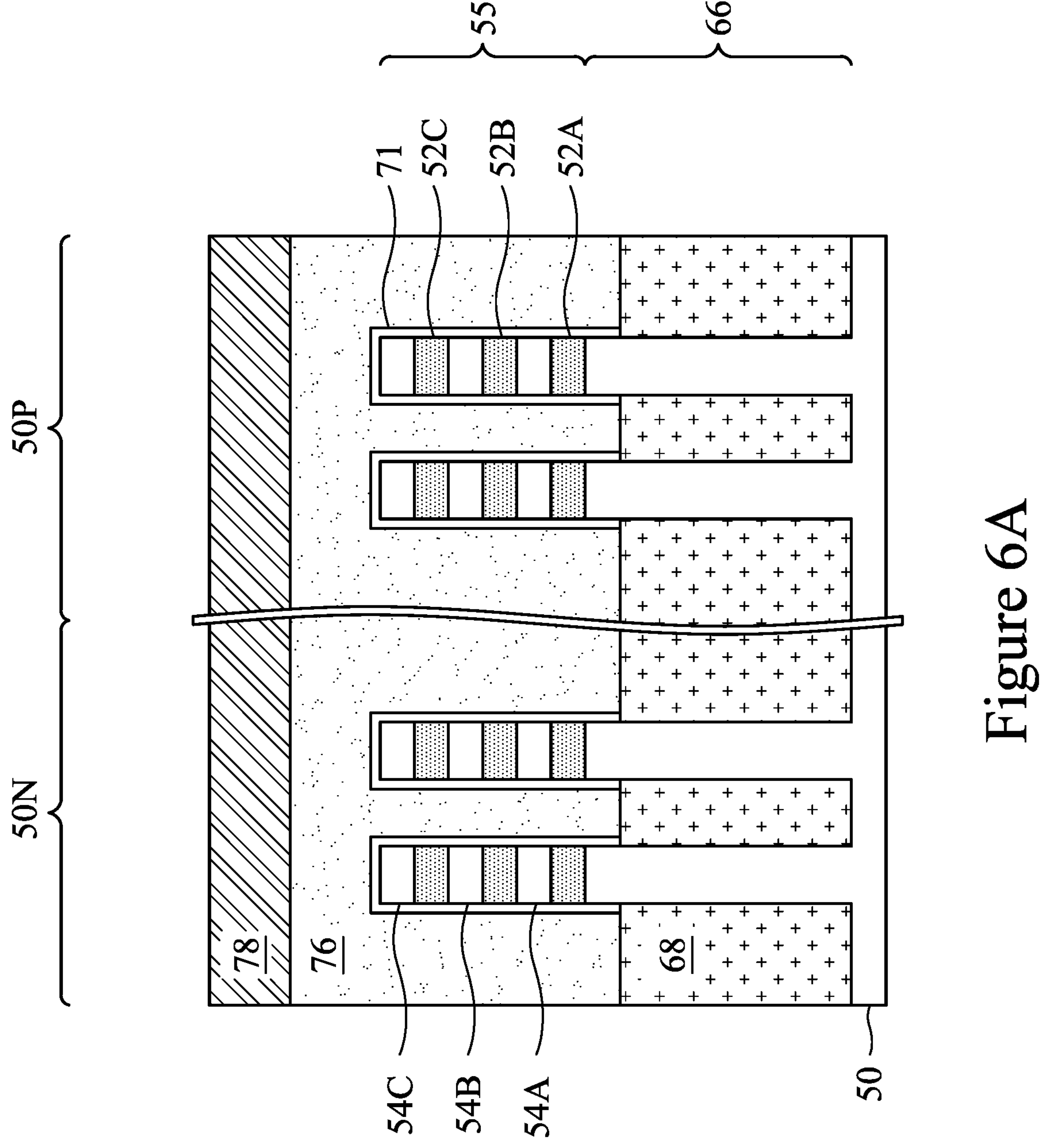
Figure 6B:
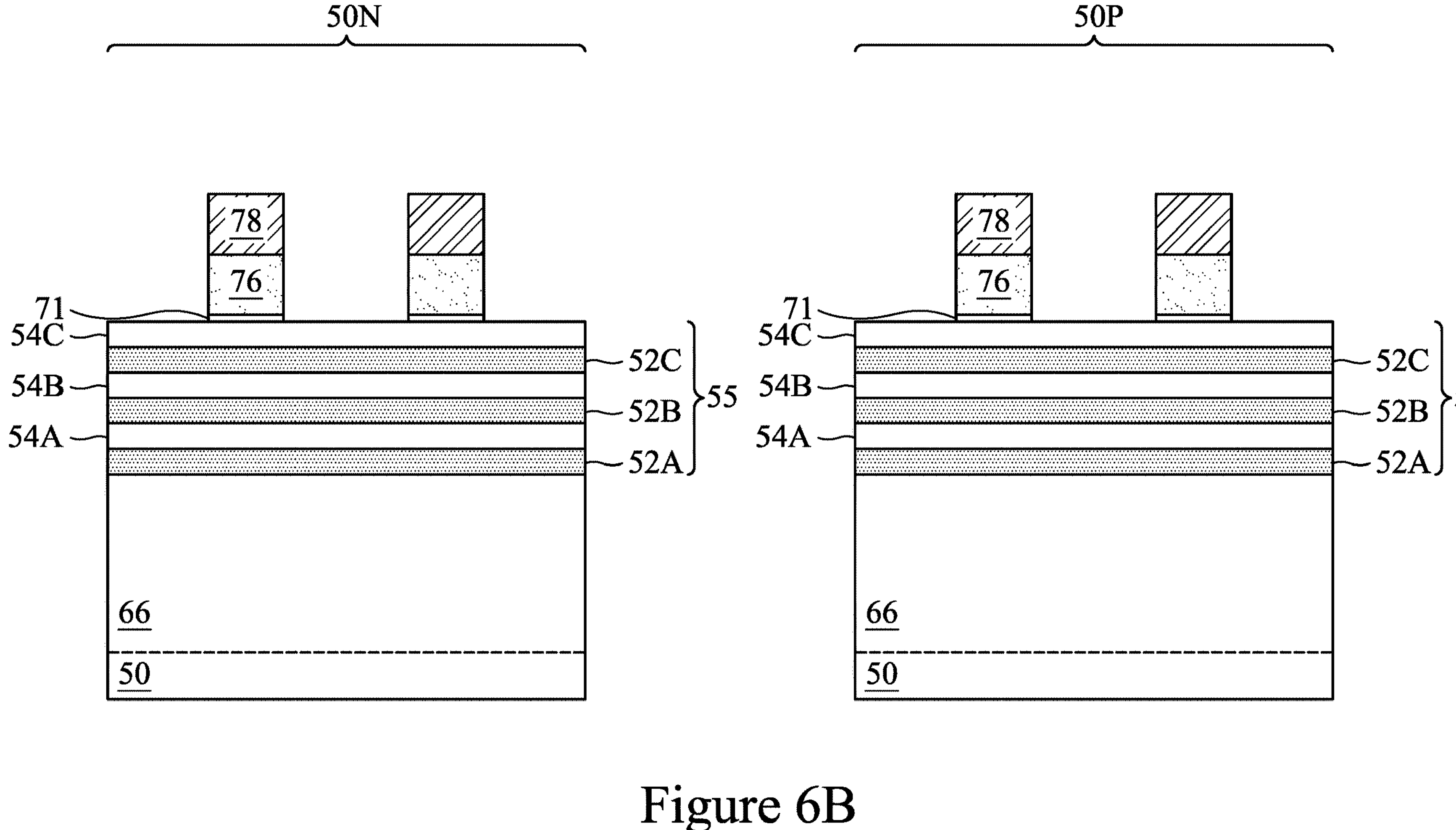

FIGS. 6A through 18C illustrate various additional steps in the manufacturing of embodiment devices. FIGS. 6A, 7A, 8A, 9A, 10A, 11A, 12A, 12C, 13A, 13C, 14A, 15A, and 18C illustrate features in either the regions 50N or the regions 50P. In FIGS. 6A and 6B, the mask layer 74 (see FIG. 5) may be patterned using acceptable photolithography and etching techniques to form masks 78. The pattern of the masks 78 then may be transferred to the dummy gate layer 72 and to the dummy dielectric layer 70 to form dummy gates 76 and dummy gate dielectrics 71, respectively. The dummy gates 76 cover respective channel regions of the fins 66. The pattern of the masks 78 may be used to physically separate each of the dummy gates 76 from adjacent dummy gates 76. The dummy gates 76 may also have a lengthwise direction substantially perpendicular to the lengthwise direction of respective fins 66.

Figure 7A:
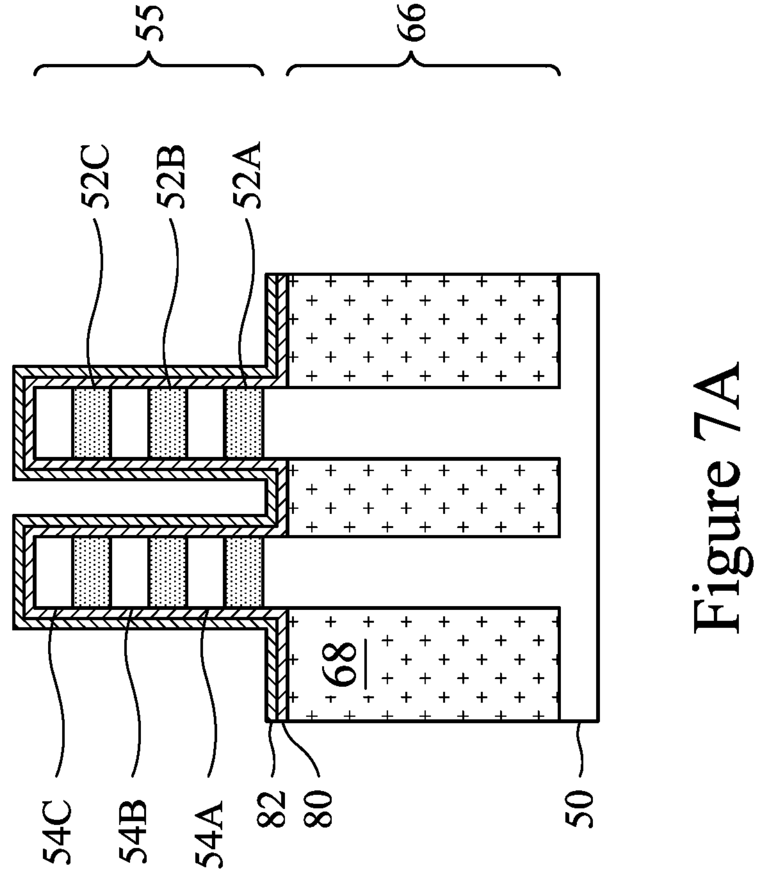
Figure 7B:
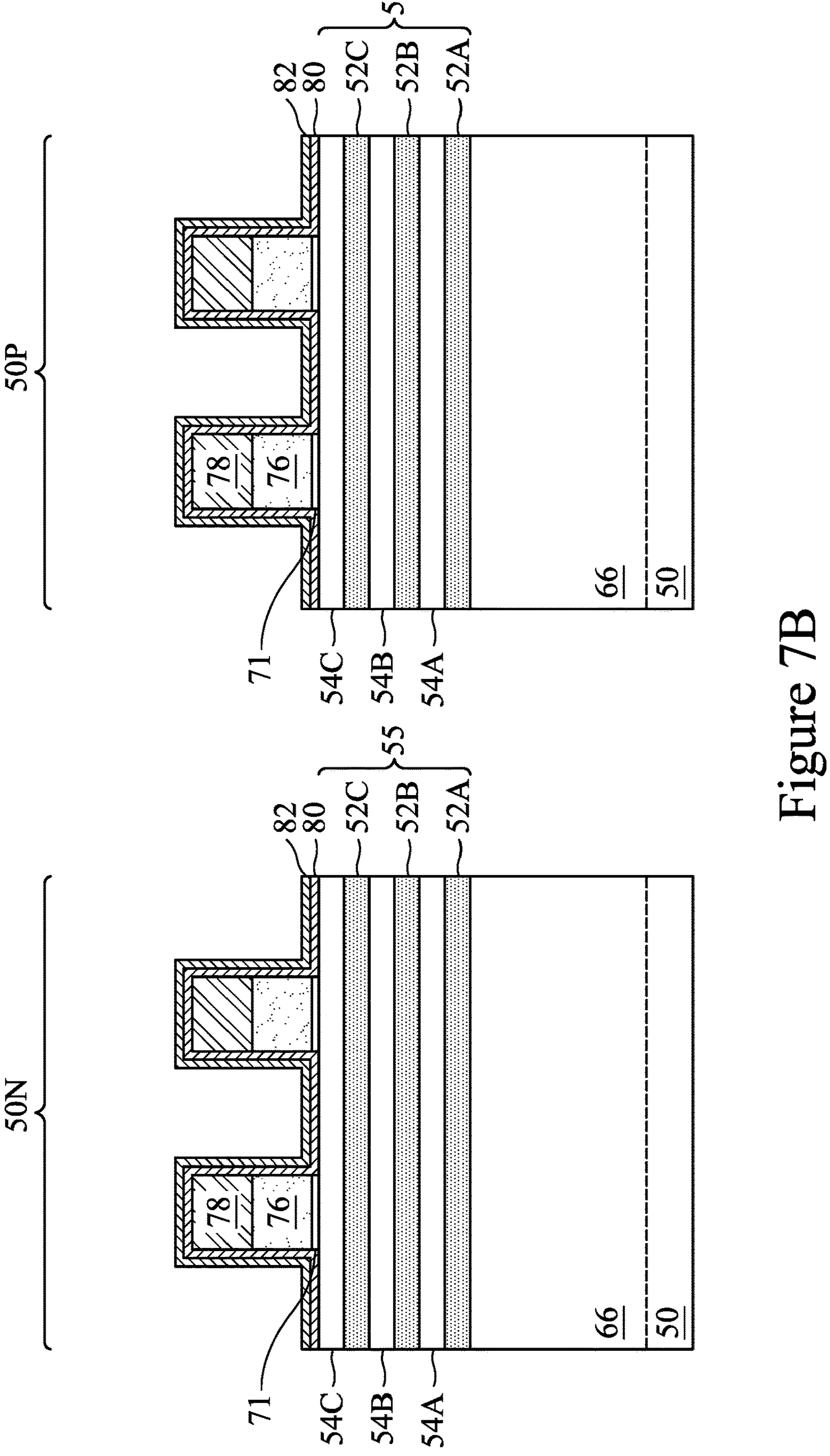

In FIGS. 7A and 7B, a first spacer layer 80 and a second spacer layer 82 are formed over the structures illustrated in FIGS. 6A and 6B, respectively. The first spacer layer 80 and the second spacer layer 82 will be subsequently patterned to act as spacers for forming self-aligned source/drain regions. In FIGS. 7A and 7B, the first spacer layer 80 is formed on top surfaces of the STI regions 68; top surfaces and sidewalls of the fins 66, the nanostructures 55, and the masks 78; and sidewalls of the dummy gates 76 and the dummy gate dielectric 71. The second spacer layer 82 is deposited over the first spacer layer 80. The first spacer layer 80 may be formed of silicon oxide, silicon nitride, silicon oxynitride, or the like, using techniques such as thermal oxidation or deposited by CVD, ALD, or the like. The second spacer layer 82 may be formed of a material having a different etch rate than the material of the first spacer layer 80, such as silicon oxide, silicon nitride, silicon oxynitride, or the like, and may be deposited by CVD, ALD, or the like.

After the first spacer layer 80 is formed and prior to forming the second spacer layer 82, implants for lightly doped source/drain (LDD) regions (not separately illustrated) may be performed. In embodiments with different device types, similar to the implants discussed above in FIG. 4, a mask, such as a photoresist, may be formed over the n-type region 50N, while exposing the p-type region 50P, and appropriate type (e.g., p-type) impurities may be implanted into the exposed fins 66 and nanostructures 55 in the p-type region 50P. The mask may then be removed. Subsequently, a mask, such as a photoresist, may be formed over the p-type region 50P while exposing the n-type region 50N, and appropriate type impurities (e.g., n-type) may be implanted into the exposed fins 66 and nanostructures 55 in the n-type region 50N. The mask may then be removed. The n-type impurities may be the any of the n-type impurities previously discussed, and the p-type impurities may be the any of the p-type impurities previously discussed. The lightly doped source/drain regions may have a concentration of impurities in a range from about $1\times10^{15}$ atoms/$cm^3$ to about $1\times10^{19}$ atoms/$cm^3$. An anneal may be used to repair implant damage and to activate the implanted impurities.

Figure 8A:
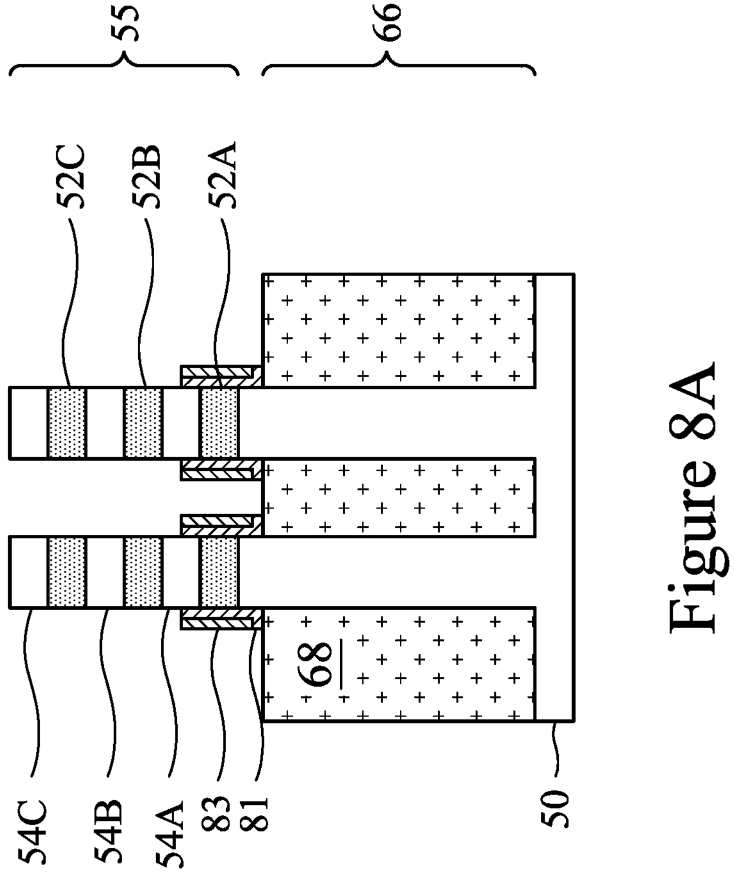
Figure 8B:
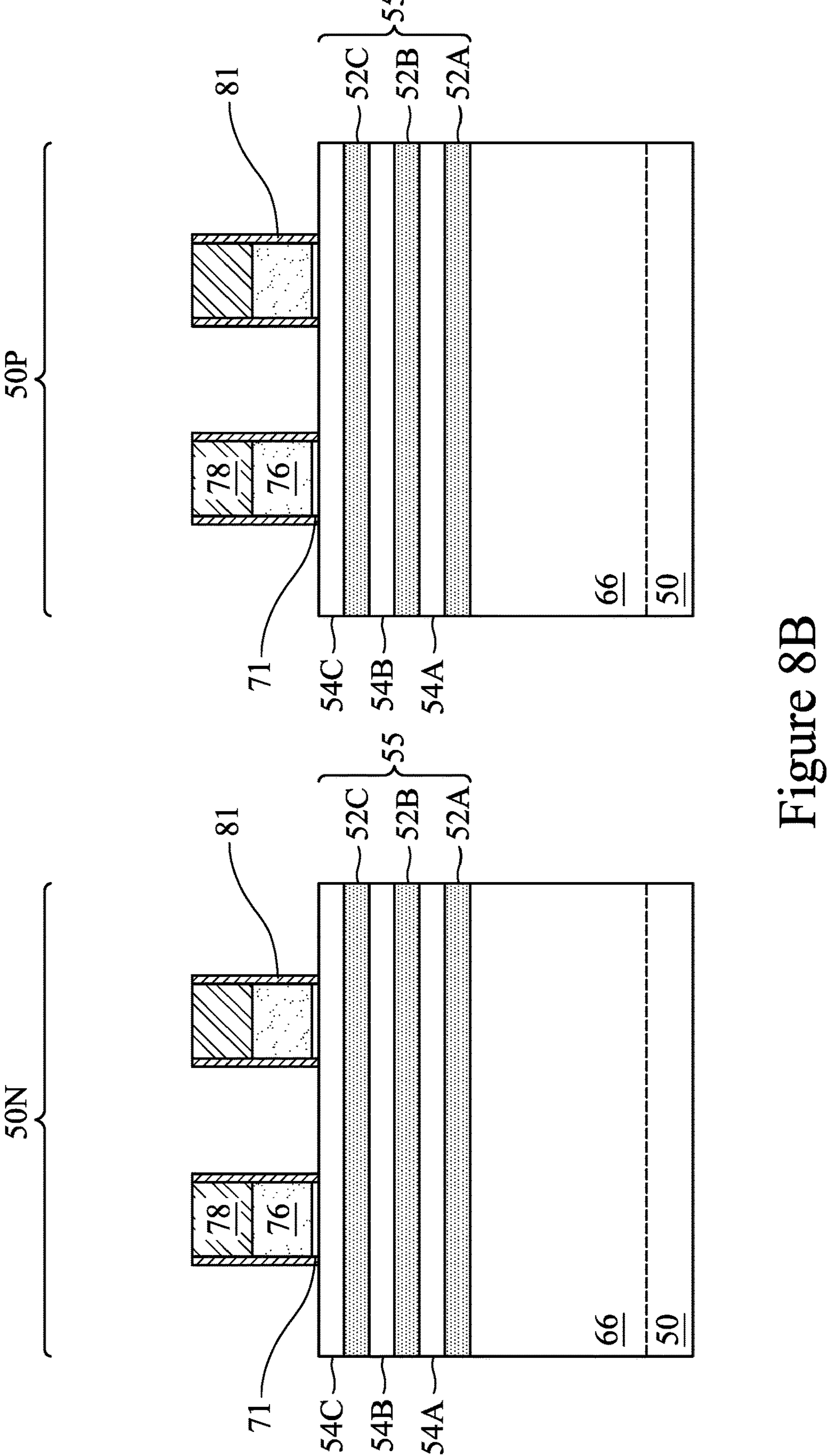

In FIGS. 8A and 8B, the first spacer layer 80 and the second spacer layer 82 are etched to form first spacers 81 and second spacers 83. As will be discussed in greater detail below, the first spacers 81 and the second spacers 83 act to self-aligned subsequently formed source drain regions, as well as to protect sidewalls of the fins 66 and/or nanostructure 55 during subsequent processing. The first spacer layer 80 and the second spacer layer 82 may be etched using a suitable etching process, such as an isotropic etching process (e.g., a wet etching process), an anisotropic etching process (e.g., a dry etching process), or the like. In some embodiments, the material of the second spacer layer 82 has a different etch rate than the material of the first spacer layer 80, such that the first spacer layer 80 may act as an etch stop layer when patterning the second spacer layer 82 and such that the second spacer layer 82 may act as a mask when patterning the first spacer layer 80. For example, the second spacer layer 82 may be etched using an anisotropic etch process wherein the first spacer layer 80 acts as an etch stop layer, wherein remaining portions of the second spacer layer 82 form second spacers 83 as illustrated in FIG. 8A. Thereafter, the second spacers 83 acts as a mask while etching exposed portions of the first spacer layer 80, thereby forming first spacers 81 as illustrated in FIG. 8A.

As illustrated in FIG. 8A, the first spacers 81 and the second spacers 83 are disposed on sidewalls of the fins 66 and/or nanostructures 55. As illustrated in FIG. 8B, in some embodiments, the second spacer layer 82 may be removed from over the first spacer layer 80 adjacent the masks 78, the dummy gates 76, and the dummy gate dielectrics 71, and the first spacers 81 are disposed on sidewalls of the masks 78, the dummy gates 76, and the dummy gate dielectrics 71. In other embodiments, a portion of the second spacer layer 82 may remain over the first spacer layer 80 adjacent the masks 78, the dummy gates 76, and the dummy gate dielectrics 71.

It is noted that the above disclosure generally describes a process of forming spacers and LDD regions. Other processes and sequences may be used. For example, fewer or additional spacers may be utilized, different sequence of steps may be utilized (e.g., the first spacers 81 may be patterned prior to depositing the second spacer layer 82), additional spacers may be formed and removed, and/or the like. Furthermore, the n-type and p-type devices may be formed using different structures and steps.

Figure 9A:
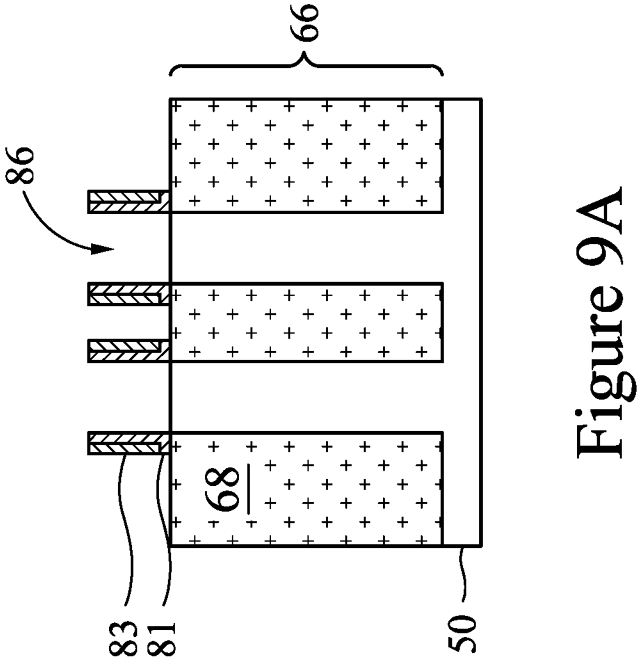
Figure 9B:
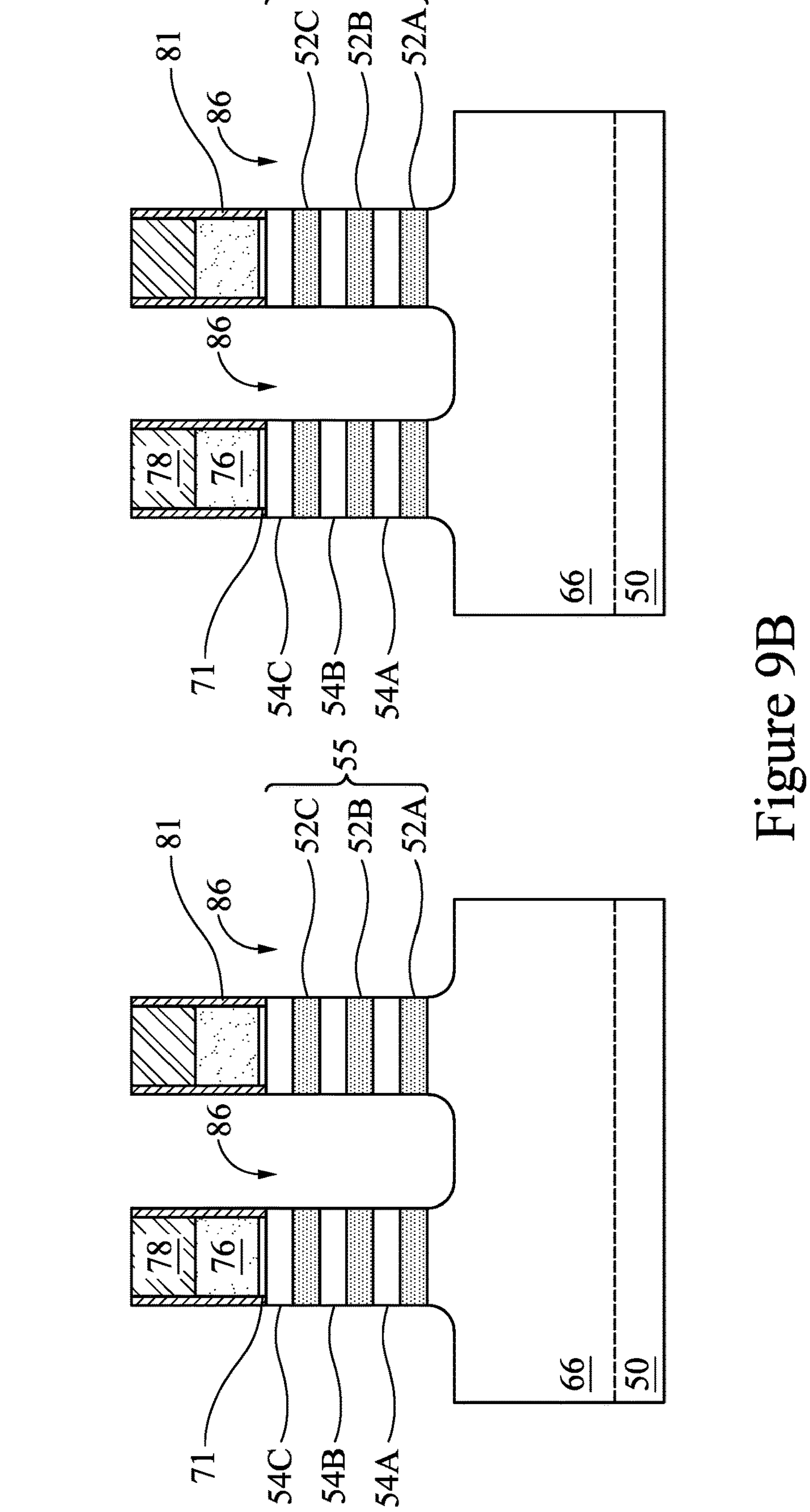

In FIGS. 9A and 9B, first recesses 86 are formed in the fins 66, the nanostructures 55, and the substrate 50, in accordance with some embodiments. Epitaxial source/drain regions will be subsequently formed in the first recesses 86. The first recesses 86 may extend through the first nanostructures 52 and the second nanostructures 54, and into the substrate 50. As illustrated in FIG. 9A, top surfaces of the STI regions 68 may be level with bottom surfaces of the first recesses 86. In various embodiments, the fins 66 may be etched such that bottom surfaces of the first recesses 86 are disposed below the top surfaces of the STI regions 68; or the like. The first recesses 86 may be formed by etching the fins 66, the nanostructures 55, and the substrate 50 using anisotropic etching processes, such as RIE, NBE, or the like. The first spacers 81, the second spacers 83, and the masks 78 mask portions of the fins 66, the nanostructures 55, and the substrate 50 during the etching processes used to form the first recesses 86. A single etch process or multiple etch processes may be used to etch each layer of the nanostructures 55 and/or the fins 66. Timed etch processes may be used to stop the etching of the first recesses 86 after the first recesses 86 reach a desired depth.

Figure 10A:
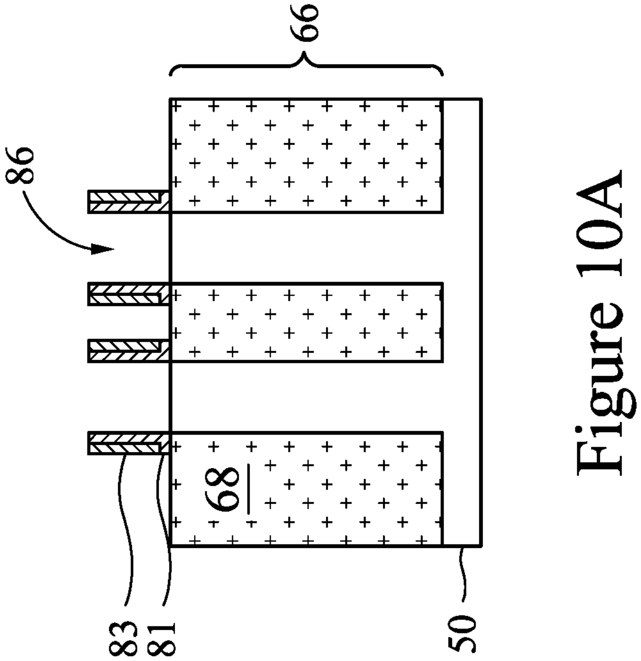
Figure 10B:
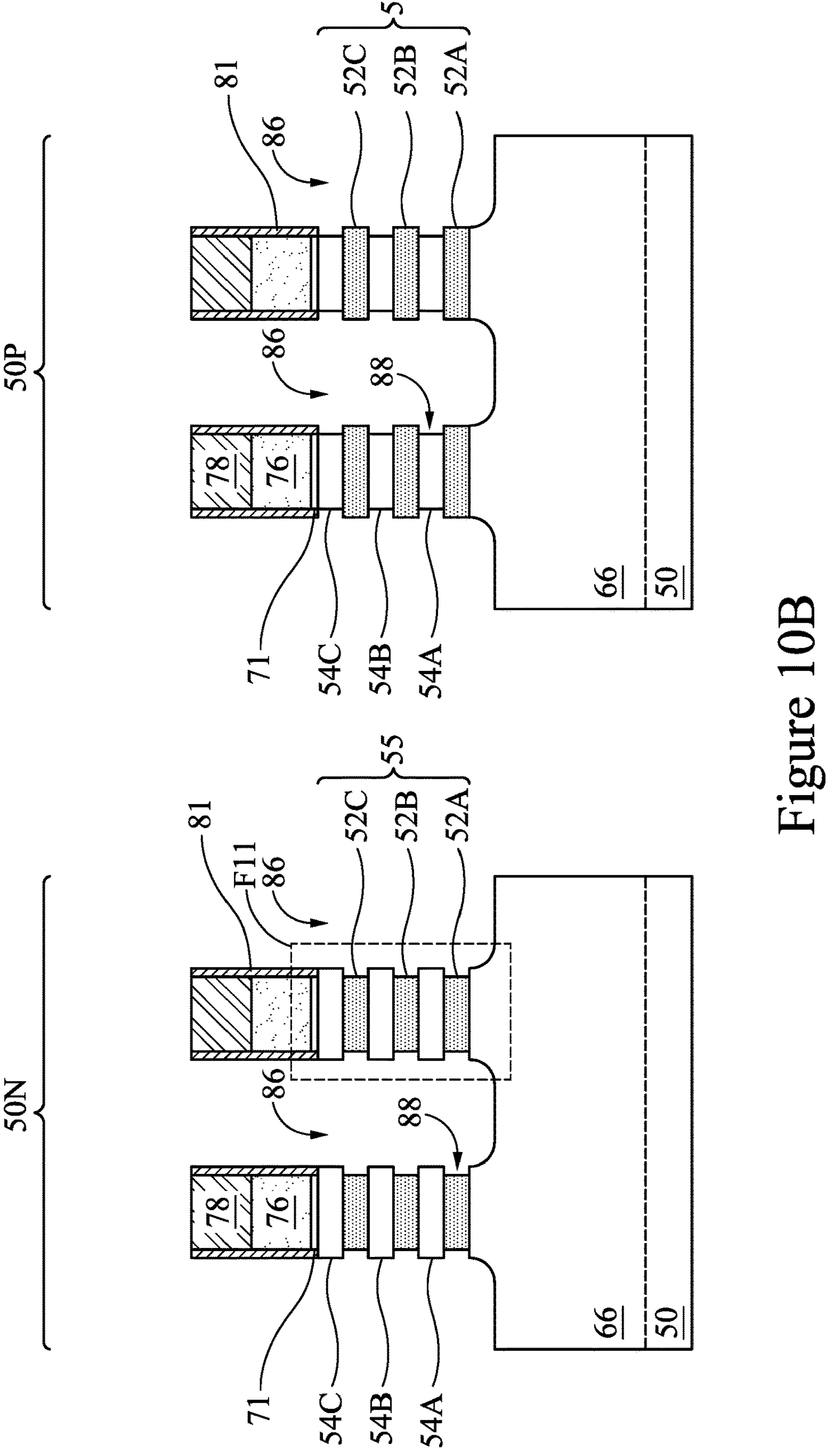

In FIGS. 10A and 10B, portions of sidewalls of the layers of the multi-layer stack 64 formed of the first semiconductor materials (e.g., the first nanostructures 52) exposed by the first recesses 86 are etched to form sidewall recesses 88 in the n-type region 50N, and portions of sidewalls of the layers of the multi-layer stack 56 formed of the second semiconductor materials (e.g., the second nanostructures 54) exposed by the first recesses 86 are etched to form sidewall recesses 88 in the p-type region 50P. As noted above, however, in some embodiments, both the n-type region 50N and p-type region 50P may utilize the same nanostructures, e.g., the second nanostructures 54 as the channel regions. In such embodiments, channel regions of n-type nano-FETs and p-type nano-FETS may have a same material composition, such as silicon, silicon germanium, or the like. Accordingly, the sidewall recesses 88 in such embodiments would be made in the nanostructures to be later removed. For example, if both the n-type region 50N and the p-type region 50P utilize the second nanostructures 54 as the channel regions, then the sidewall recesses 88 are formed in the first nanostructures 52. FIGS. 35A, 35B, 35C, 35D, and 35E illustrate a structure resulting from such embodiments where the channel regions in both the p-type region 50P and the n-type region 50N are provided by the second nanostructures 54 and comprise silicon, for example.

Although sidewalls of the first nano structures 52 and the second nanostructures 54 in sidewall recesses 88 are illustrated as being straight in FIG. 10B, the sidewalls may be concave or convex. The sidewalls may be etched using isotropic etching processes, such as wet etching or the like. The p-type region 50P may be protected using a mask (not shown) while etchants selective to the first semiconductor materials are used to etch the first nanostructures 52 such that the second nanostructures 54 and the substrate 50 remain relatively unetched as compared to the first nanostructures 52 in the n-type region 50N. Following etching the first nanostructures 52, the tips of the remaining second nanostructures 54 may have residue remaining on the tips. For example, where the first nanostructures 52 are made of SiGe and the second nanostructures 54 are made of Si or SiC, SiGe residue may remain on the tips of the second nanostructures 54. The residue may interfere with the etching process and the remaining tips of the second nanostructures 54 may also have a rough surface texture.

Similarly, the n-type region 50N may be protected using a mask (not shown) while etchants selective to the second semiconductor materials are used to etch the second nanostructures 54 such that the first nanostructures 52 and the substrate 50 remain relatively unetched as compared to the second nanostructures 54 in the p-type region 50P.

In an embodiment in which the first nanostructures 52 include, e.g., SiGe, and the second nanostructures 54 include, e.g., Si or SiC, a dry etch process with tetramethylammonium hydroxide (TMAH), ammonium hydroxide ($NH_4OH$), or the like may be used to etch sidewalls of the first nanostructures 52 in the n-type region 50N. Although the etching process may be effective to recess the first nanostructures 52 to form the sidewall recesses 88, a residue of SiGe may be left behind on the exposed surfaces of the second nanostructures 54. A wet or dry etch process with hydrogen fluoride, another fluorine-based etchant, or the like may be used to etch sidewalls of the second nanostructures 54 in the p-type region 50P.

Figures 11, 12, 13:
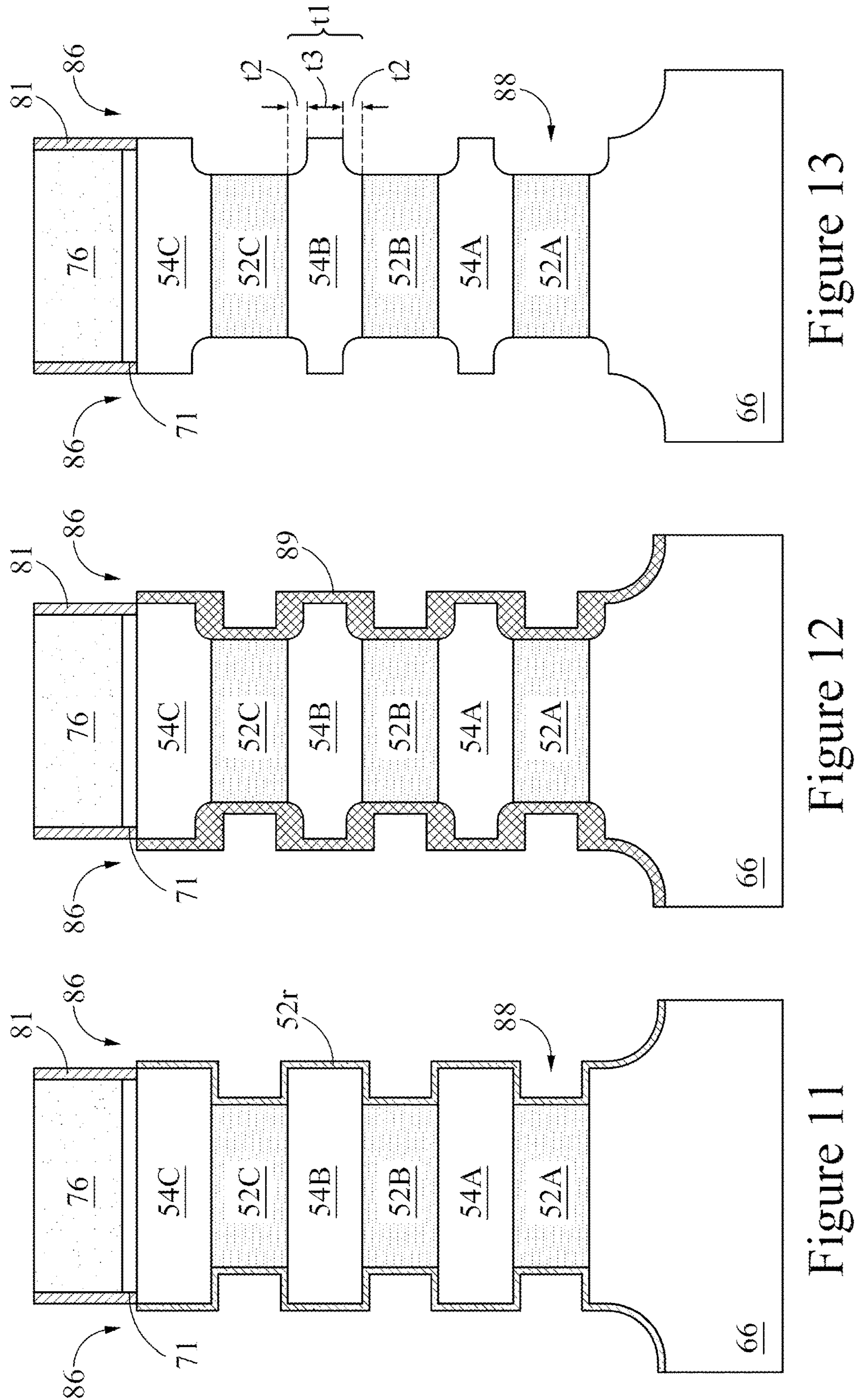

FIG. 11 illustrates enlarged portion F11 of the structure illustrated in FIG. 10B following the etching process to form the sidewall spacers 90. This illustration is of the n-type region 50N, but may also be applicable to the p-type region 50P in embodiments which utilize the second nanostructures 54 as the channel region in both the n-type region 50N and p-type region 50P (see, e.g., FIGS. 35A, 35B, 35C, 35D, and 35E). As seen in FIG. 11, following the etching process, an etching residue layer 52*r* may remain on exposed portions of the second nanostructures 54. The residue layer 52*r* includes a film-like residue comprising SiGe and may also include native oxide (e.g., SiO and/or SiGeO) covering the exposed first nanostructures 52 and exposed second nanostructures 54. Although, the material of the first nanostructures 52 may comprise SiGe, the SiGe in the residue layer 52*r* is distinct from the second nanostructures 52 and may be observed chemically by the presence of etchant materials at the interface of the residue layer 52*r* and the first nanostructures 54, including for example SiGeO. The thickness of the residue layer 52*r* may be between about 8 Å and 12 Å, though other values are contemplated. The surface texture of the exposed second nanostructures 54 may also be rough from the etching process.

In FIGS. 12 and 13, in some embodiments, an optional smoothing and residue removal process may be applied to the exposed second nanostructures 54 before forming subsequent sidewall spacers 90 in the sidewall recesses 88. The optional smoothing and residue removal process includes a process of forming an oxidation layer 89 by oxidizing the residue and exposed faces of the first nanostructures 52 and second nanostructures 54, then removing the oxidation layer.

FIG. 12 illustrates the structure of FIG. 11 after performing an oxidation process to oxidize the residue 52*r* as well as the exposed first nanostructures 52 in the sidewall recesses 88 and exposed second nanostructures 54 at the channel tips to create the oxidation layer 89. The oxidation process may use any suitable oxidation mechanism for oxidizing the residue 52*r*, the first nanostructures 52, and the second nanostructures 54.

In some embodiments, the oxidation process may use a plasma treatment process where a plasma is created from oxygen to form oxygen radicals. The residue 52*r*, first nanostructures 52, and second nanostructures 54 are then exposed to the oxygen radicals which combine with the Si (or SiC) and SiGe to form silicon oxide (or SiOC) or SiGeO.

In other embodiments, the oxidation process may use thermal oxidation. In such embodiments, the thermal oxidation process may be conducted in an oxygen ambient. In another embodiment, the thermal oxidation process is conducted in a combination of steam ambient and oxygen ambient. For example, the thermal oxidation may be performed in a $H_2O$ reaction gas or in an $O_2$ or diluted $O_2$ reaction gas, with a temperature ranging from about 600° C. to about 800° C. and under a pressure ranging from about 10 torr to about 760 torr.

In yet other embodiments, the oxidation process may use wet ozone oxidation. In such embodiments, the oxidation layer 99 is produced by applying a combination of ozone (03) and deionized water.

Other suitable oxidation processes may also be used, resulting in the oxidation layer 99.

The oxidation process may use different times and/or concentrations of oxygen source to achieve a thicker oxidation layer 89 (i.e., penetrating further into the second nanostructures 54). A thicker oxidation layer 89 may help provide a smoother final finish to the surface of the second nanostructures 54.

In FIG. 13, the oxidation layer 89 is removed by any suitable etching process to form the residue free (or residue reduced) sidewall recesses 88. In some embodiments, the etching process may use a dry etch or wet etch process using any suitable etchant, such as a fluorine containing etchant, such as diluted HF (dHF) or the like to remove the oxidized portions of the residue 52*r*, the first nanostructures 52, and the second nanostructures 54. In some embodiments, the total amount of the residue 52*r* may be reduced by 60-100%. In addition, because the oxidation layer 89 includes portions of the first nanostructures 52 and second nanostructures 54, when the oxidation layer 89 is removed by the etching process, the sidewall recesses 88 are further recessed and the exposed tips of the second nanostructures 54 are trimmed down. In some embodiments, the thickness t1 of each of the second nanostructures 54 (e.g., nanostructure 54B) is between about 8 nm and 17 nm, the thickness t2 of the removed portion of the second nanostructures 54 is between about 0.5 nm and about 2 nm, and the thickness t3 of the remaining trimmed tips of each of the second nanostructures 54 are between about 5 nm and 15 nm, depending on the initial thickness t1.

In addition, the oxidation layer 89 removal causes the remaining exposed surfaces of the first nanostructures 52 and second nanostructures 54 to become smoothed. In some embodiments, the RMS roughness of the surface of the second nanostructures 54 is reduced between about 50% and 90%.

In FIGS. 14A-14D, first inner spacers 90 are formed in the sidewall recess 88. The first inner spacers 90 may be formed by depositing an inner spacer layer (not separately illustrated) over the structures illustrated in FIGS. 10A and 10B (e.g., after the optional smoothing and residue removal process of FIGS. 12-13). The first inner spacers 90 act as isolation features between subsequently formed source/drain regions and a gate structure. As will be discussed in greater detail below, source/drain regions will be formed in the first recesses 86, while the first nanostructures 52 in the n-type region 50N and the second nanostructures 54 in the p-type region 50P will be replaced with corresponding gate structures.

The inner spacer layer may be deposited by a conformal deposition process, such as CVD, ALD, or the like. The inner spacer layer may comprise a material such as silicon nitride or silicon oxynitride, although any suitable material, such as low-dielectric constant (low-k) materials having a k-value less than about 3.5, may be utilized. The inner spacer layer may then be anisotropically etched to form the first inner spacers 90. Although outer sidewalls of the first inner spacers 90 are illustrated as being flush with sidewalls of the second nanostructures 54 in the n-type region 50N and flush with the sidewalls of the first nanostructures 52 in the p-type region 50P, the outer sidewalls of the first inner spacers 90 may extend beyond or be recessed from sidewalls of the second nanostructures 54 and/or the first nanostructures 52, respectively.

Figure 14A:
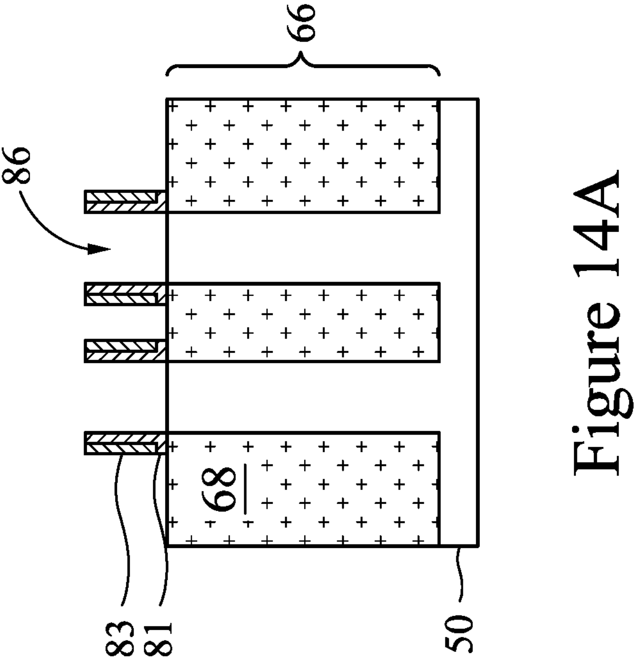
Figure 14B:
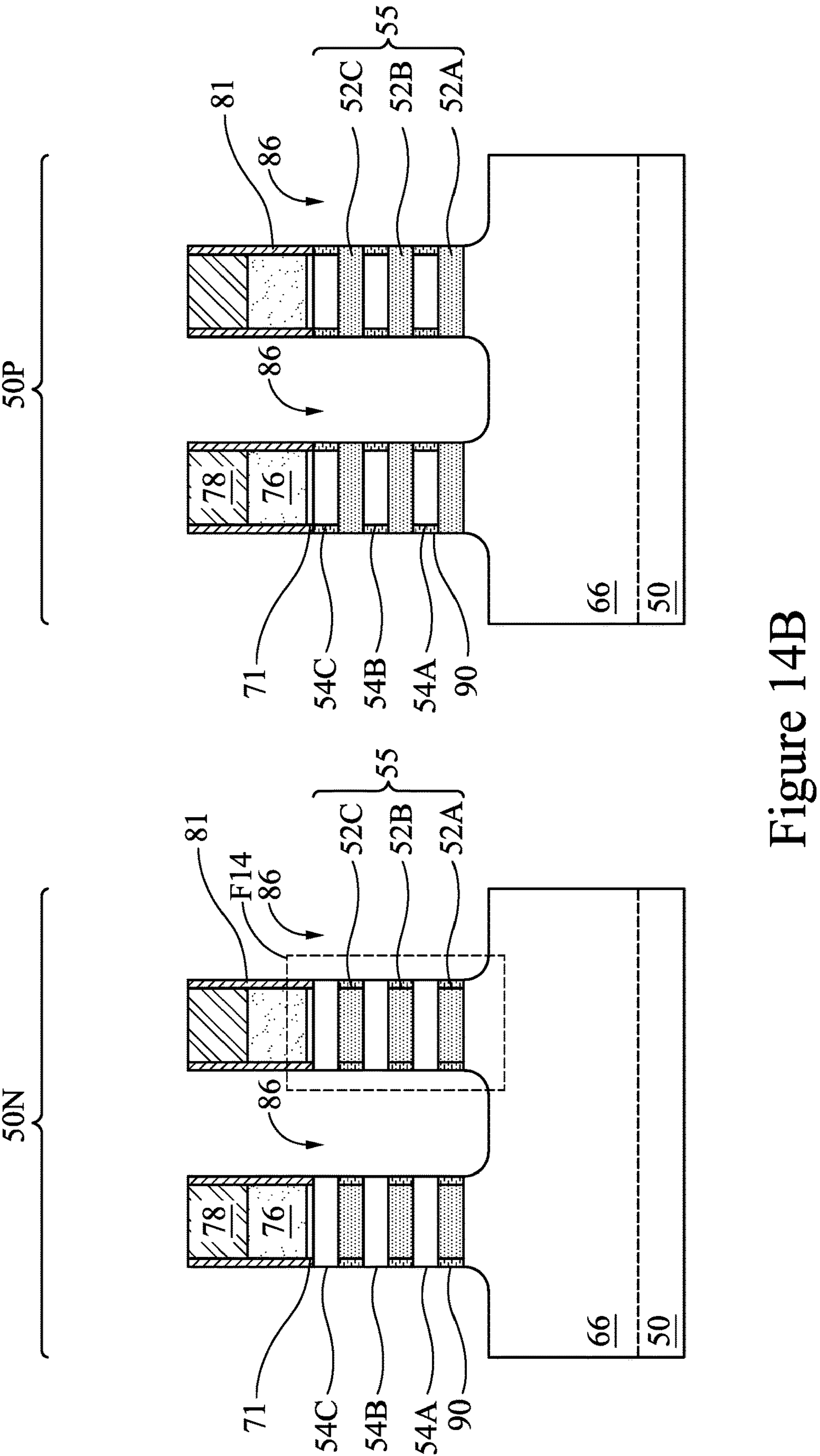
Figure 14C:
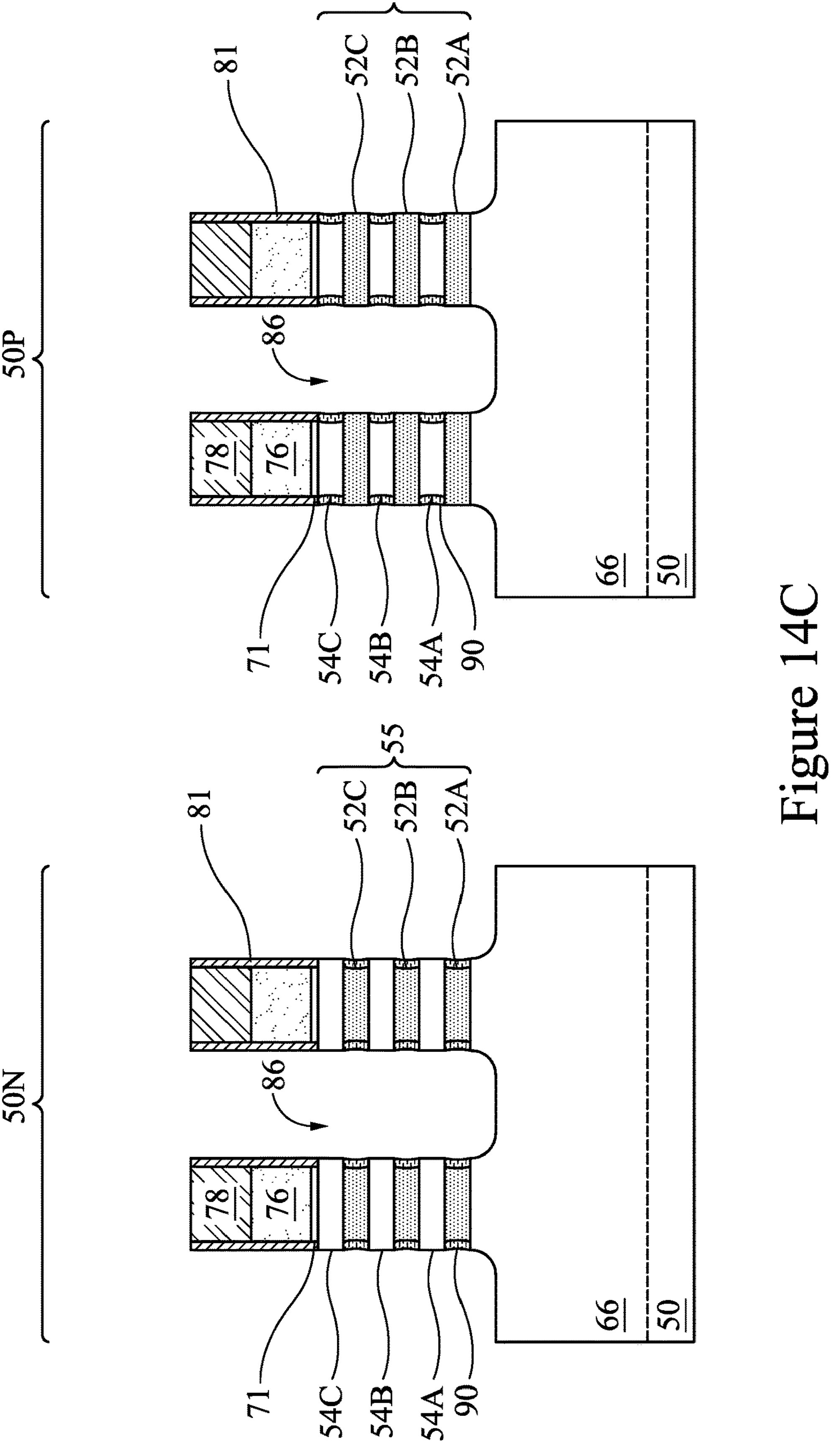

Moreover, although the outer sidewalls of the first inner spacers 90 are illustrated as being straight in FIG. 14B, the outer sidewalls of the first inner spacers 90 may be concave or convex. As an example, FIG. 14C illustrates an embodiment in which sidewalls of the first nanostructures 52 are concave, outer sidewalls of the first inner spacers 90 are concave, and the first inner spacers 90 are recessed from sidewalls of the second nanostructures 54 in the n-type region 50N. Also illustrated are embodiments in which sidewalls of the second nanostructures 54 are concave, outer sidewalls of the first inner spacers 90 are concave, and the first inner spacers 90 are recessed from sidewalls of the first nanostructures 52 in the p-type region 50P. The inner spacer layer may be etched by an anisotropic etching process, such as RIE, NBE, or the like. The first inner spacers 90 may be used to prevent damage to subsequently formed source/drain regions (such as the epitaxial source/drain regions 92, discussed below with respect to FIGS. 15A-15B) by subsequent etching processes, such as etching processes used to form gate structures.

Figure 14D:
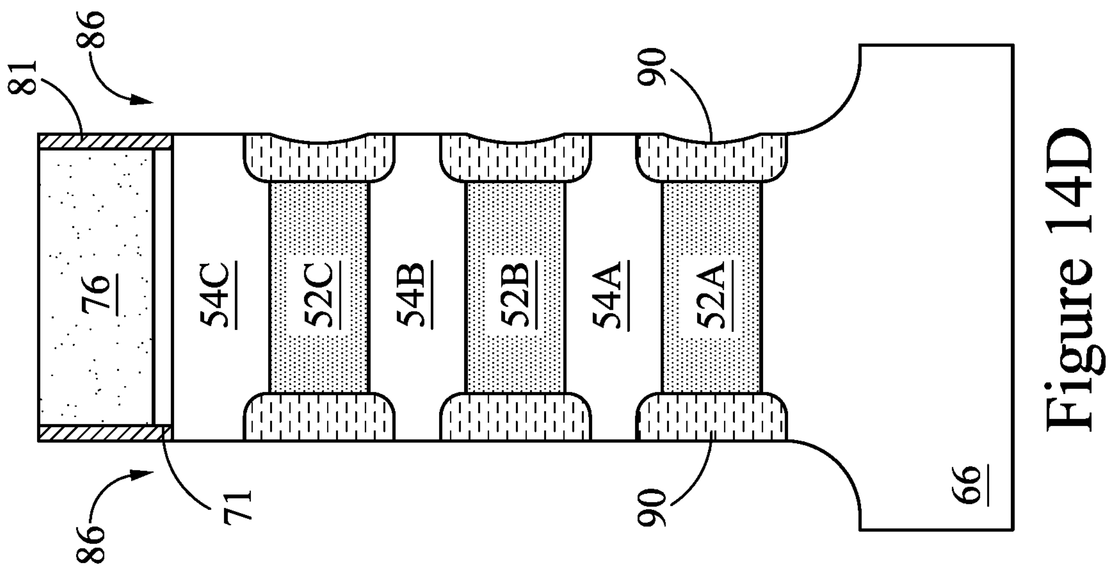

FIG. 14D illustrates an enlarged portion F14 of FIG. 14B. The left side of first inner spacers 90 have outer sidewalls which are flush with sidewalls of the second nanostructures 54, while the right side of first inner spacers 90 have outer sidewalls which are concave. These two embodiments are depicted in the same structure for convenience and may not actually be present in the same structure.

Figure 15A:
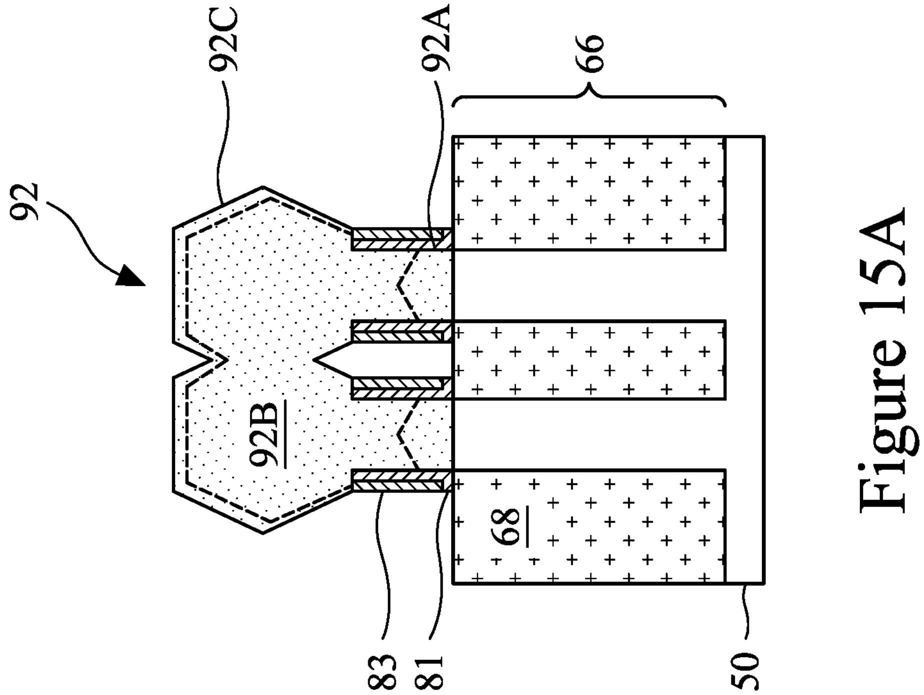
Figure 15B:
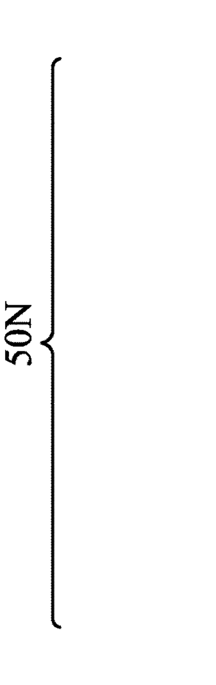
Figure 15B:
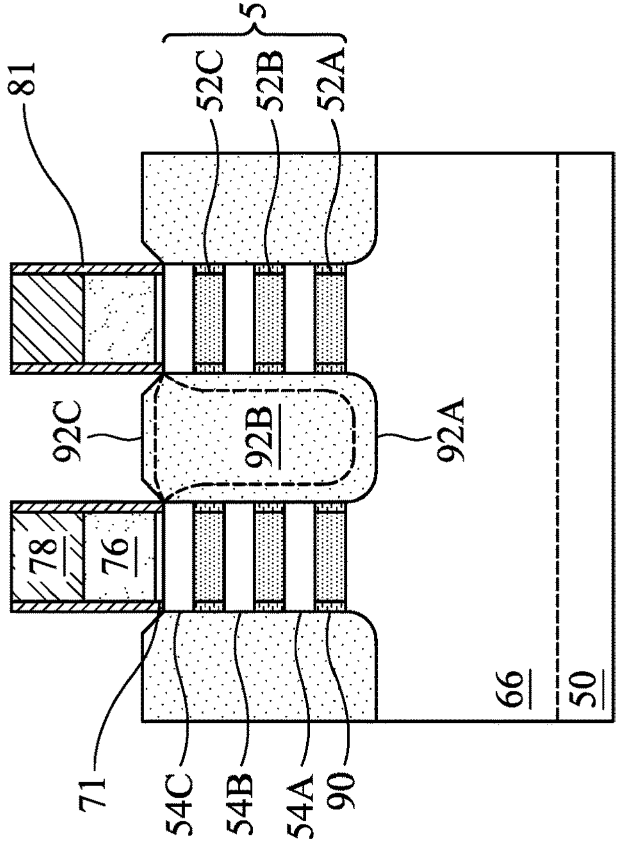

In FIGS. 15A-15B, epitaxial source/drain regions 92 are formed in the first recesses 86. In some embodiments, the epitaxial source/drain regions 92 may exert stress on the second nanostructures 54 in the n-type region 50N and on the first nanostructures 52 in the p-type region 50P, thereby improving performance. As illustrated in FIG. 12B, the epitaxial source/drain regions 92 are formed in the first recesses 86 such that each dummy gate 76 is disposed between respective neighboring pairs of the epitaxial source/drain regions 92. In some embodiments, the first spacers 81 are used to separate the epitaxial source/drain regions 92 from the dummy gates 76 and the first inner spacers 90 are used to separate the epitaxial source/drain regions 92 from the nanostructures 55 by an appropriate lateral distance so that the epitaxial source/drain regions 92 do not short out with subsequently formed gates of the resulting nano-FETs.

The epitaxial source/drain regions 92 in the n-type region 50N, e.g., the NMOS region, may be formed by masking the p-type region 50P, e.g., the PMOS region. Then, the epitaxial source/drain regions 92 are epitaxially grown in the first recesses 86 in the n-type region 50N. The epitaxial source/drain regions 92 may include any acceptable material appropriate for n-type nano-FETs. For example, if the second nanostructures 54 are silicon, the epitaxial source/drain regions 92 may include materials exerting a tensile strain on the second nanostructures 54, such as silicon, silicon carbide, phosphorous doped silicon carbide, silicon phosphide, or the like. The epitaxial source/drain regions 92 may have surfaces raised from respective upper surfaces of the nanostructures 55 and may have facets.

The epitaxial source/drain regions 92 in the p-type region 50P, e.g., the PMOS region, may be formed by masking the n-type region 50N, e.g., the NMOS region. Then, the epitaxial source/drain regions 92 are epitaxially grown in the first recesses 86 in the p-type region 50P. The epitaxial source/drain regions 92 may include any acceptable material appropriate for p-type nano-FETs. For example, if the first nanostructures 52 are silicon germanium, the epitaxial source/drain regions 92 may comprise materials exerting a compressive strain on the first nanostructures 52, such as silicon-germanium, boron doped silicon-germanium, germanium, germanium tin, or the like. The epitaxial source/drain regions 92 may also have surfaces raised from respective surfaces of the multi-layer stack 56 and may have facets.

The epitaxial source/drain regions 92, the first nanostructures 52, the second nanostructures 54, and/or the substrate 50 may be implanted with dopants to form source/drain regions, similar to the process previously discussed for forming lightly-doped source/drain regions, followed by an anneal. The source/drain regions may have an impurity concentration of between about $1\times10^{19}$ atoms/cm$^3$ and about $1\times10^{21}$ atoms/cm$^3$. The n-type and/or p-type impurities for source/drain regions may be any of the impurities previously discussed. In some embodiments, the epitaxial source/drain regions 92 may be in situ doped during growth.

As a result of the epitaxy processes used to form the epitaxial source/drain regions 92 in the n-type region 50N and the p-type region 50P, upper surfaces of the epitaxial source/drain regions 92 have facets which expand laterally outward beyond sidewalls of the nanostructures 55. In some embodiments, these facets cause adjacent epitaxial source/drain regions 92 of a same nano-FET to merge as illustrated by FIG. 15A. In other embodiments, adjacent epitaxial source/drain regions 92 remain separated after the epitaxy process is completed. In the embodiments illustrated in FIG. 15A, the first spacers 81 may be formed to a top surface of the STI regions 68 thereby blocking the epitaxial growth. In some other embodiments, the first spacers 81 may cover portions of the sidewalls of the nanostructures 55 further blocking the epitaxial growth. In some other embodiments, the spacer etch used to form the first spacers 81 may be adjusted to remove the spacer material to allow the epitaxially grown region to extend to the surface of the STI regions 68.

The epitaxial source/drain regions 92 may comprise one or more semiconductor material layers. For example, the epitaxial source/drain regions 92 may comprise a first semiconductor material layer 92A, a second semiconductor material layer 92B, and a third semiconductor material layer 92C. Any number of semiconductor material layers may be used for the epitaxial source/drain regions 92. Each of the first semiconductor material layer 92A, the second semiconductor material layer 92B, and the third semiconductor material layer 92C may be formed of different semiconductor materials and may be doped to different dopant concentrations. In some embodiments, the first semiconductor material layer 92A may have a dopant concentration less than the second semiconductor material layer 92B and greater than the third semiconductor material layer 92C. In embodiments in which the epitaxial source/drain regions 92 comprise three semiconductor material layers, the first semiconductor material layer 92A may be deposited, the second semiconductor material layer 92B may be deposited over the first semiconductor material layer 92A, and the third semiconductor material layer 92C may be deposited over the second semiconductor material layer 92B.

In embodiments in which the outer sidewalls of the first inner spacers 90 are concave, and the first inner spacers 90 are recessed from sidewalls of the second nanostructures 54 and the first nanostructures 52, the epitaxial source/drain regions 92 may be formed in contact with the first inner spacers 90 and may extend past sidewalls of the second nanostructures 54 in the n-type region 50N and past sidewalls of the first nanostructures 52 in the p-type region 50P.

Figure 16A:
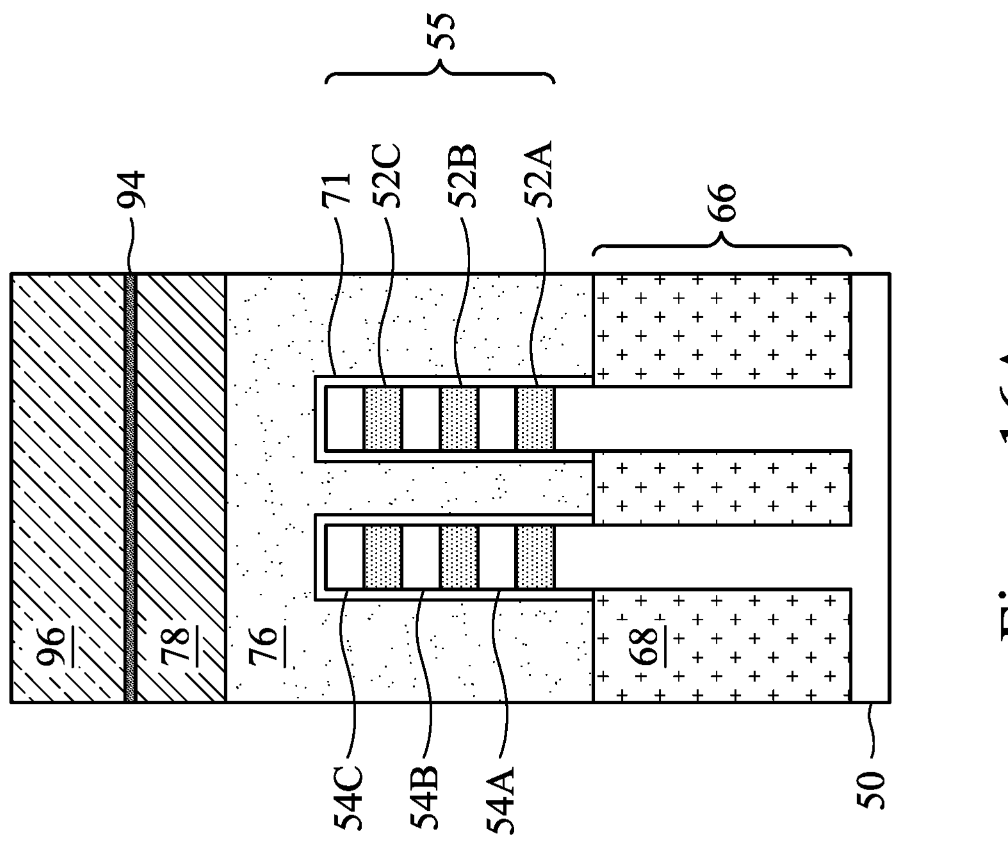
Figure 16B:
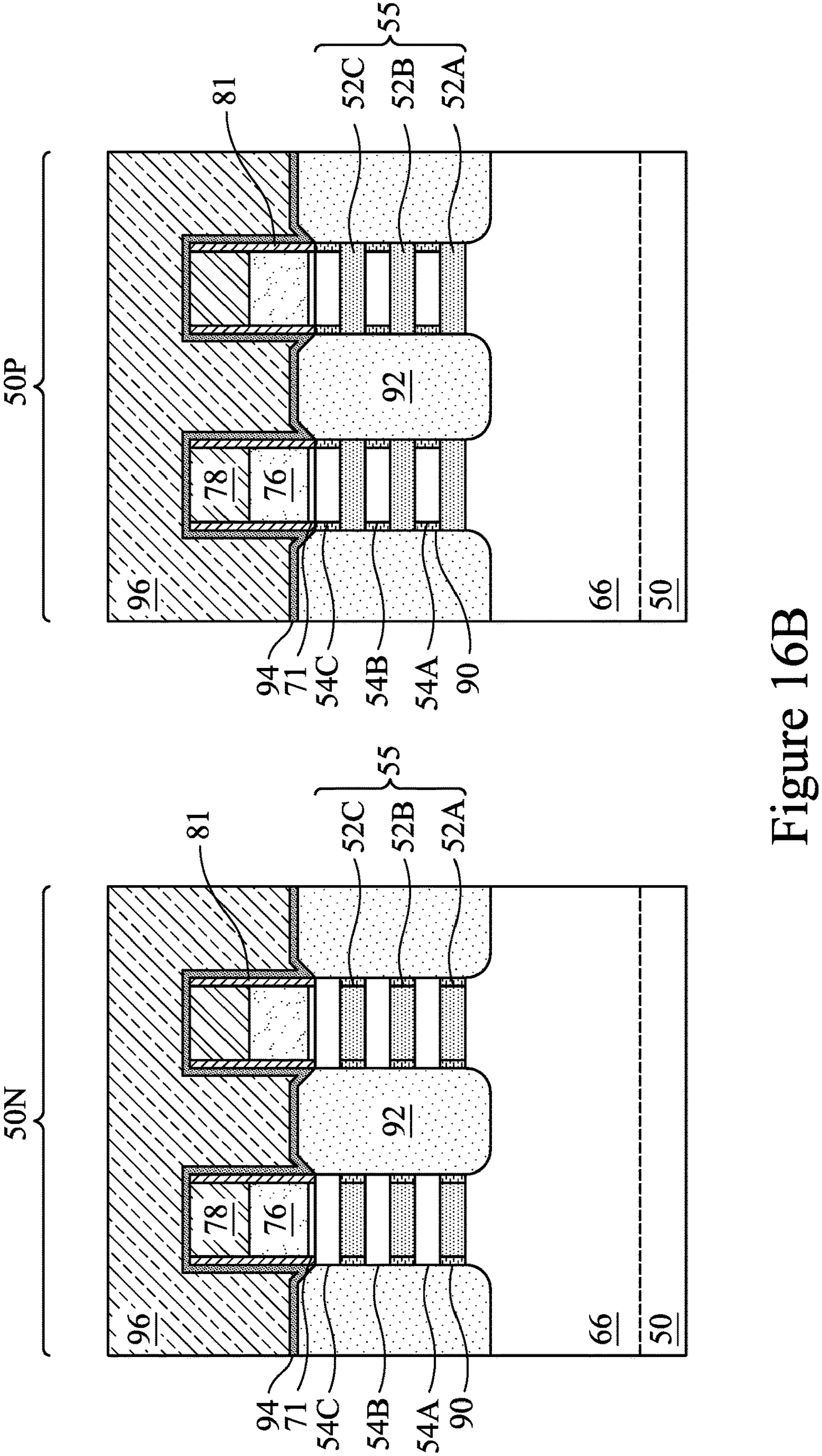
Figure 16C:
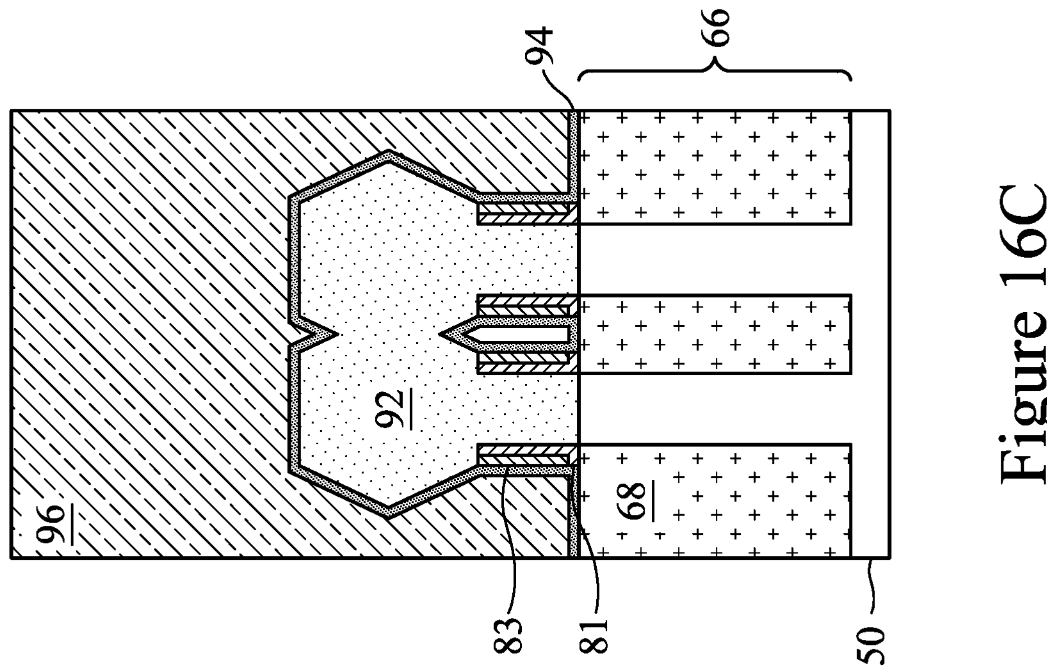

In FIGS. 16A-16C, a first interlayer dielectric (ILD) 96 is deposited over the structure illustrated in FIGS. 6A, 15B, and 15A (the processes of FIGS. 7A-15B do not alter the cross-section illustrated in FIGS. 6A), respectively. The first ILD 96 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) 94 is disposed between the first ILD 96 and the epitaxial source/drain regions 92, the masks 78, and the first spacers 81. The CESL 94 may comprise a dielectric material, such as, silicon nitride, silicon oxide, silicon oxynitride, or the like, having a different etch rate than the material of the overlying first ILD 96.

Figure 17A:
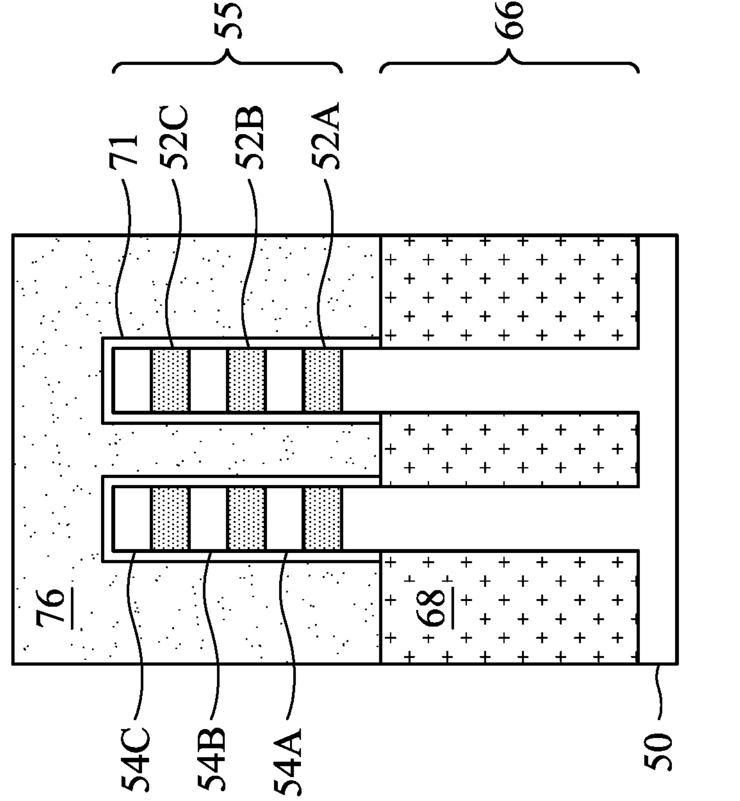
Figure 17B:
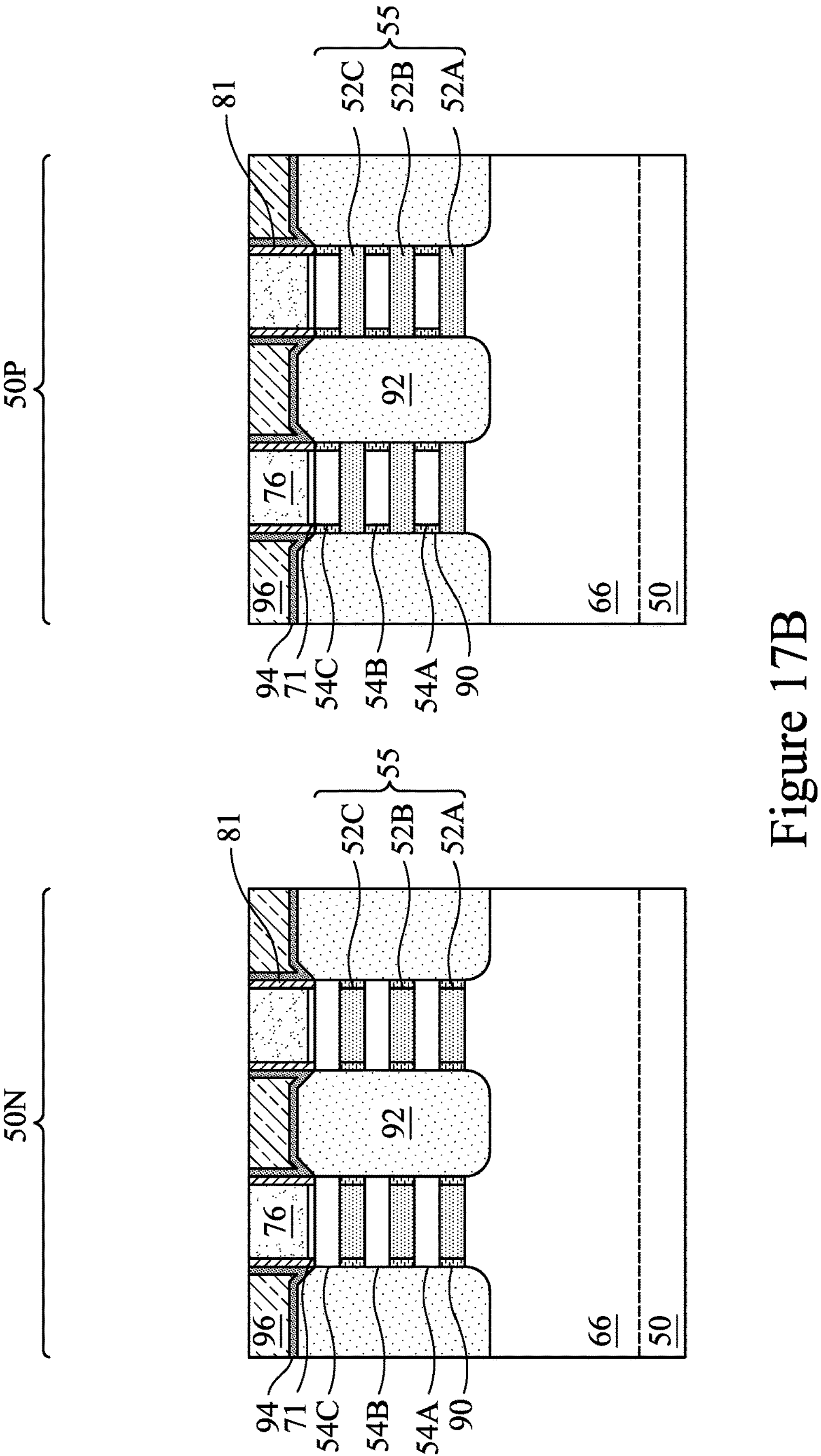
Figure 17C:
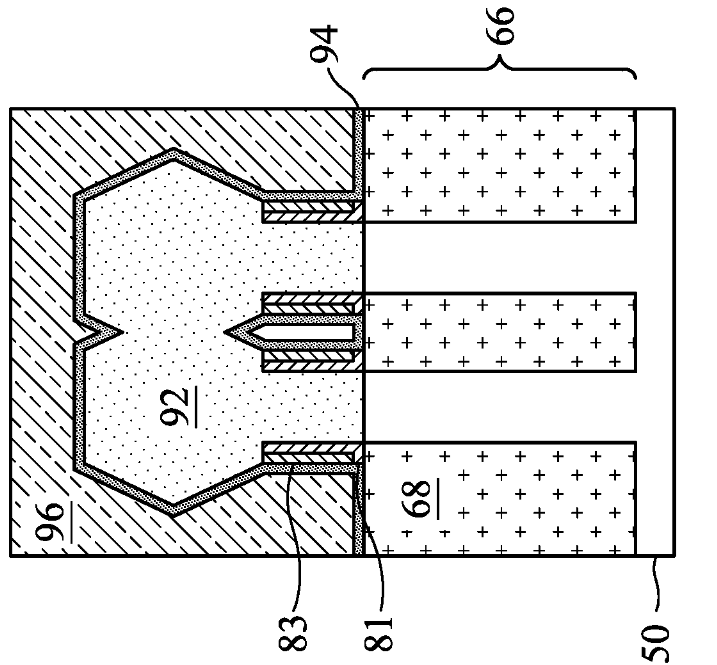

In FIGS. 17A-17C, a planarization process, such as a CMP, may be performed to level the top surface of the first ILD 96 with the top surfaces of the dummy gates 76 or the masks 78. The planarization process may also remove the masks 78 on the dummy gates 76, and portions of the first spacers 81 along sidewalls of the masks 78. After the planarization process, top surfaces of the dummy gates 76, the first spacers 81, and the first ILD 96 are level within process variations. Accordingly, the top surfaces of the dummy gates 76 are exposed through the first ILD 96. In some embodiments, the masks 78 may remain, in which case the planarization process levels the top surface of the first ILD 96 with top surface of the masks 78 and the first spacers 81.

Figure 18A:
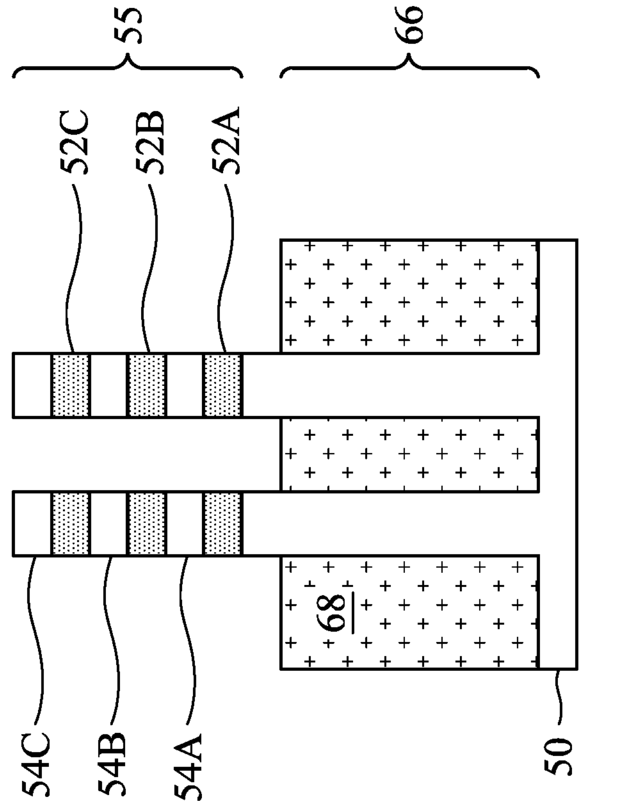
Figure 18B:
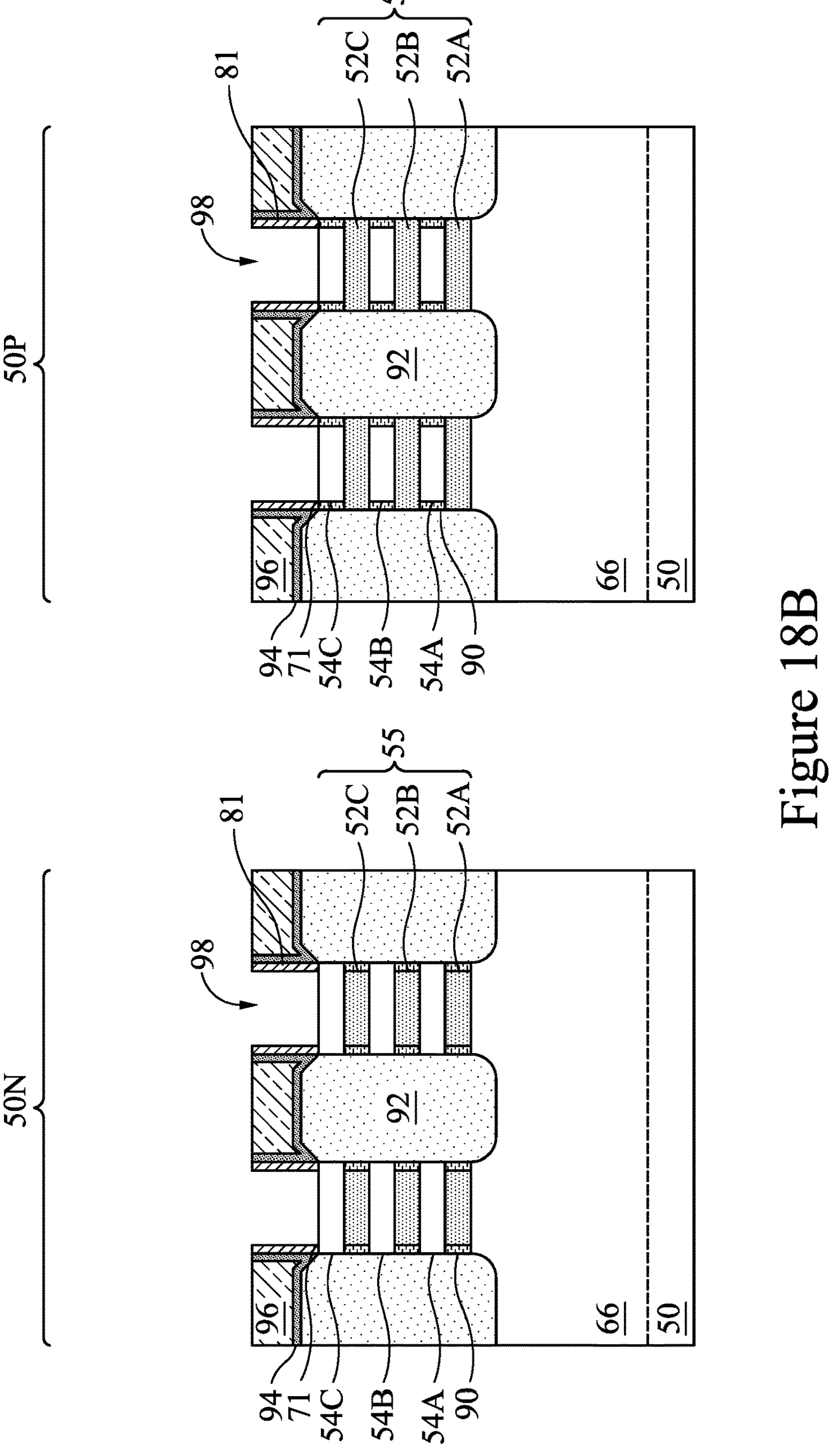

In FIGS. 18A and 18B, the dummy gates 76, and the masks 78 if present, are removed in one or more etching steps, so that second recesses 98 are formed. Portions of the dummy dielectric layers 60 in the second recesses 98 are also be removed. In some embodiments, the dummy gates 76 and the dummy dielectric layers 60 are removed by an anisotropic dry etch process. For example, the etching process may include a dry etch process using reaction gas(es) that selectively etch the dummy gates 76 at a faster rate than the first ILD 96 or the first spacers 81. Each second recess 98 exposes and/or overlies portions of nanostructures 55, which act as channel regions in subsequently completed nano-FETs. Portions of the nanostructures 55 which act as the channel regions are disposed between neighboring pairs of the epitaxial source/drain regions 92. During the removal, the dummy dielectric layers 60 may be used as etch stop layers when the dummy gates 76 are etched. The dummy dielectric layers 60 may then be removed after the removal of the dummy gates 76.

Figure 19B:
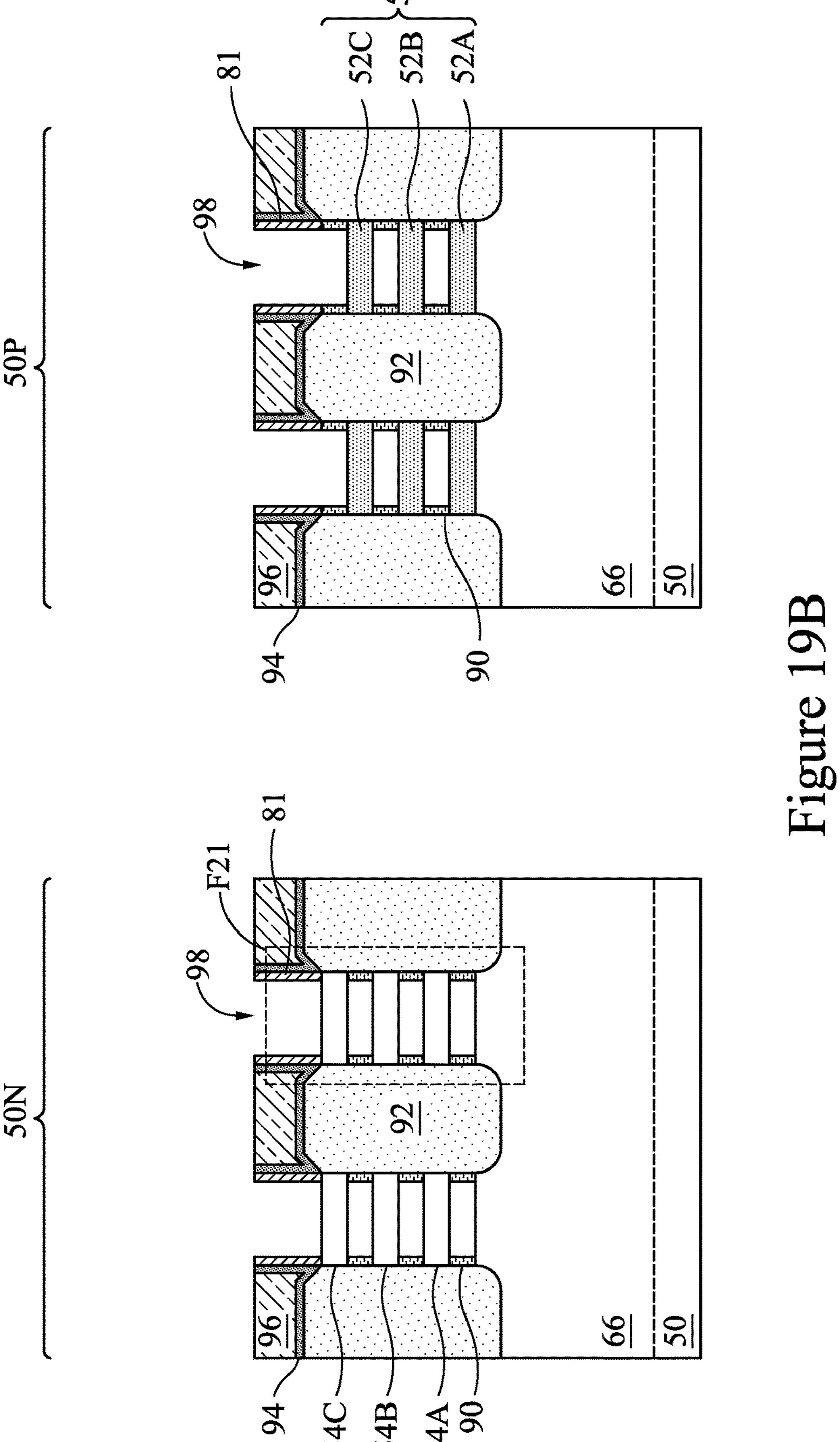

In FIGS. 19A and 19B, the first nanostructures 52 in the n-type region 50N and the second nanostructures 54 in the p-type region 50P are removed extending the second recesses 98. The first nanostructures 52 may be removed by forming a mask (not shown) over the p-type region 50P and performing an isotropic etching process such as wet etching or the like using etchants which are selective to the materials of the first nanostructures 52, while the second nanostructures 54, the substrate 50, the STI regions 68 remain relatively unetched as compared to the first nanostructures 52. In embodiments in which the first nanostructures 52 include, e.g., SiGe, and the second nanostructures 54A-54C include, e.g., Si or SiC, tetramethylammonium hydroxide (TMAH), ammonium hydroxide ($NH_4OH$), or the like may be used to remove the first nanostructures 52 in the n-type region 50N.

Following etching the first nanostructures 52, the remaining second nanostructures 54 may have residue remaining on the exposed surfaces of the second nanostructures 54. For example, where the first nanostructures 52 are made of SiGe and the second nanostructures 54 are made of Si or SiC, SiGe residue may remain on the surfaces of the second nanostructures 54. The residue may interfere with the etching process and the surfaces of the second nanostructures 54 may have a rough surface texture following the etching. Especially in the channel region interfacing with the subsequently formed work function layers, the residue and rough surfaces may cause reduced performance and/or reduced uniformity in functional performance among the various like-formed transistors on the workpiece. For example, the Ge residue in the SiGe may alter voltage threshold, causing voltage threshold fluctuations among like transistors.

The second nanostructures 54 in the p-type region 50P may be removed by forming a mask (not shown) over the n-type region 50N and performing an isotropic etching process such as wet etching or the like using etchants which are selective to the materials of the second nanostructures 54, while the first nanostructures 52, the substrate 50, the STI regions 68 remain relatively unetched as compared to the second nanostructures 54. In embodiments in which the second nanostructures 54 include, e.g., SiGe, and the first nanostructures 52 include, e.g., Si or SiC, hydrogen fluoride, another fluorine-based etchant, or the like may be used to remove the second nanostructures 54 in the p-type region 50P.

In other embodiments, the channel regions in the n-type region 50N and the p-type region 50P may be formed simultaneously, for example by removing the first nanostructures 52 in both the n-type region 50N and the p-type region 50P or by removing the second nanostructures 54 in both the n-type region 50N and the p-type region 50P. In such embodiments, channel regions of n-type nano-FETs and p-type nano-FETS may have a same material composition, such as silicon, silicon germanium, or the like. FIGS. 35A, 35B, 35C, 35D, and 35E illustrate a structure resulting from such embodiments where the channel regions in both the p-type region 50P and the n-type region 50N are provided by the second nanostructures 54 and comprise silicon, for example.

FIGS. 20 through 25A, 25B, 25C, 25D, and 25E illustrate enlarged views of the dashed box labeled F20 in FIG. 19B and a channel smoothing and residue removal process performed on the structure of FIG. 19B after removing the first nanostructures 52. The structures illustrated in FIGS. 20 through 25A, 25B, 25C, 25D, and 25E include the optional smoothing and residue removal process discussed above with respect to FIGS. 12 and 13. FIGS. 26 through 31A, 31B, 31C, 31D, and 31E illustrate enlarged views of the dashed box labeled F20 in FIG. 19B and channel smoothing and residue removal processes performed on the structure of FIG. 19B after removing the first nanostructures 52, however, the structures illustrated in FIGS. 26 through 31A, 31B, 31C, 31D, and 31E do not include the optional smoothing and residue removal process discussed above.

Figure 21:
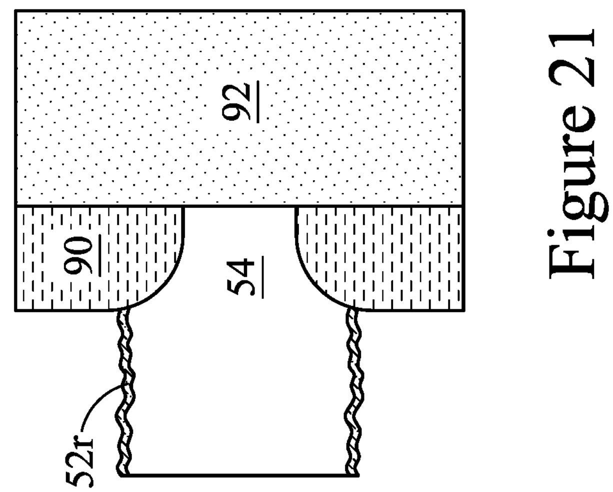
Figure 20:
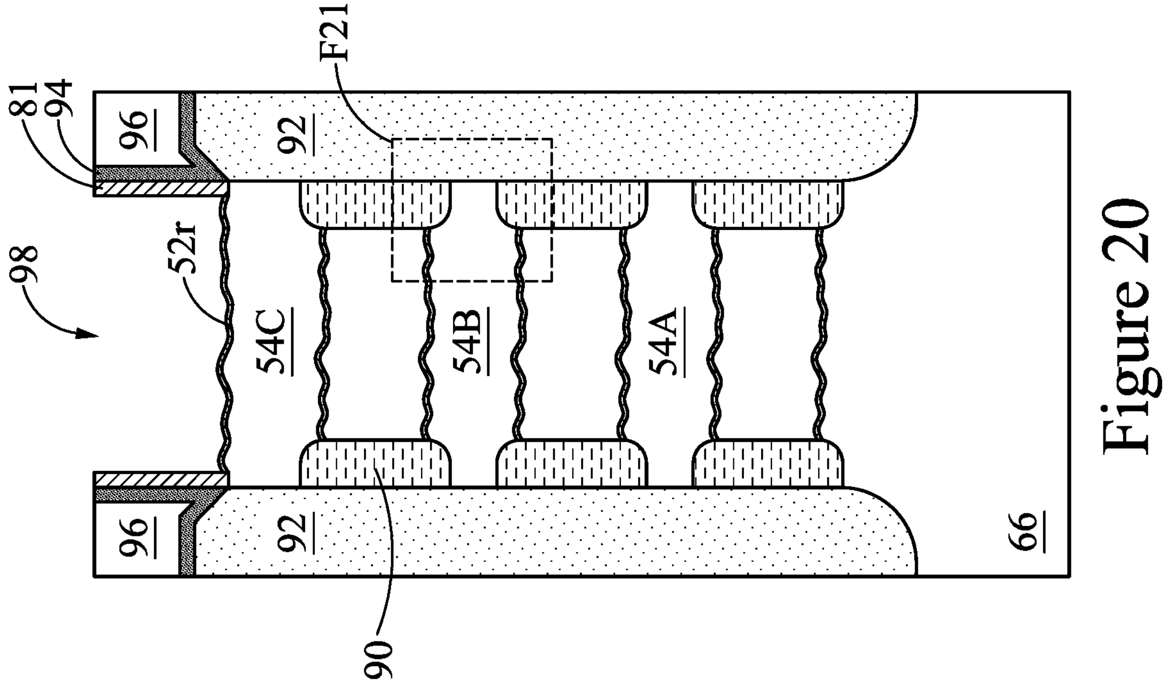

FIGS. 20 and 21 illustrate an enlarged view of the dashed box labeled F20 in FIG. 19B just after performing the etch process noted above to remove the first nanostructures 52. FIG. 21 illustrates an enlarged view of the dashed box labeled F21 in FIG. 20. As seen in FIGS. 20 and 21 a residue **52*r* is left behind after removing the first nanostructures 52. When the first nanostructures 52 are made of SiGe, the residue 52*r* is also SiGe. In addition, the surface of the second nanostructures 54** is rough from the etching process.

FIGS. 22, 23A, and 23B illustrate the structure of FIG. 20 after an oxidation process is used to oxidize the residue **52*r* and the exposed surfaces of the second nanostructures 54 to form an oxidation layer 99. FIGS. 23A and 23B illustrate enlarged views of the dashed box labeled F23 in FIG. 22. FIGS. 23A and 23B illustrate different levels of oxidation. The oxidation layer 99 in FIG. 23A is thinner than the oxidation layer 99 in FIG. 23B. When the oxidation layer 99 is subsequently removed, more of the material of the second nanostructures 54 will be removed in the FIG. 23B than in the FIG. 23A. The thickness of the oxidation layer 99 may be varied by the duration and/or intensity of the oxidation process. Removing the oxidation layer 99 causes the surfaces of the second nanostructures 54 to become smoother and removes residue remaining from the etching process which removes the first nanostructures 52**.

The oxidation process may use any suitable oxidation process for forming the oxidation layer 99, including any of those discussed above with respect to the oxidation process of FIG. 12.

Figure 25E:
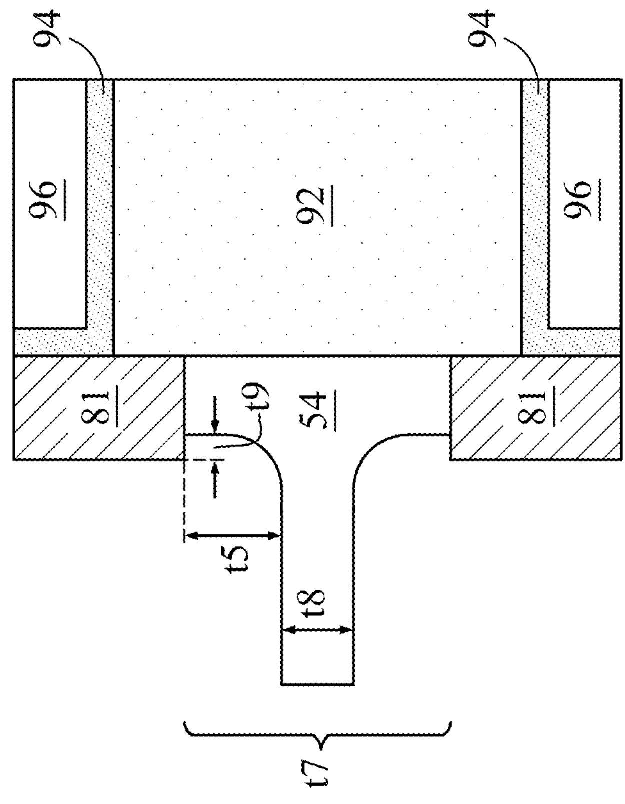
Figure 25D:
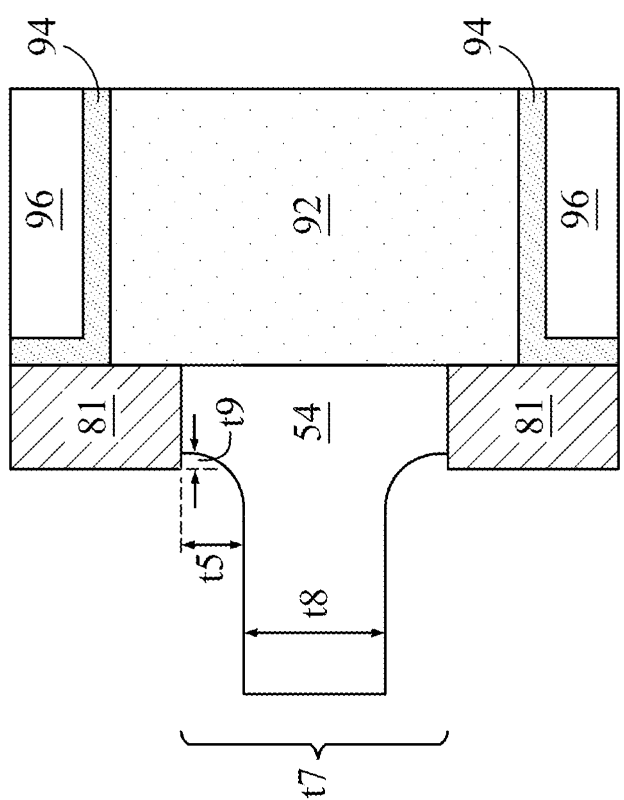

FIGS. 24, 25A, 25B, 25C, 25D, and 25E illustrate the enlarged view structure of FIG. 22 after the oxidation layer 99 is removed. In particular, FIGS. 25A and 25B illustrate enlarged views of the dashed box labeled F25 in FIG. 24. FIG. 25C illustrates an isolated perspective view of the end of the second nanostructure 54 in that area. FIGS. 25D and 25E correspond to FIGS. 25A and 25B, respectively, and illustrate horizontal cross-sections in the area of the dashed box labeled F25, the horizontal cross-sections being through the second nanostructures 54. FIG. 25A follows from FIG. 23A, where the oxidation layer 99 is not as thick as it is in FIG. 23A. Likewise, FIG. 25B follows from FIG. 23B where the oxidation layer 99 is thicker than in FIG. 23A.

FIG. 24 illustrates that the second nanostructures 54 include horn protrusions 54*h* where the ends of the second nanostructures meet the first inner spacers 90. For the lower nanostructures (e.g., nanostructures 54A and 54B), the horn protrusions 54*h* are on the tops and bottoms of the second nanostructures 54. As illustrated in FIG. 24, however, the uppermost second nanostructure 54 (i.e., second nanostructure 54C), the horn protrusions 54*h* are only located on the bottom of the second nanostructure 54C. The upper surface of the second nanostructure 54C instead illustrates a rounded portion transitioning from the horizontal upper surface to a vertical inner sidewall surface of the second nanostructure 54C. It is also notable that at the bottom of the second recesses 98 where the fin 66 is exposed, horn protrusions 54*h* are produced where the fin 66 meets the first inner spacers 90, on the upper surface of the fin 66.

Referring to FIGS. 25A and 25B, after the oxidation layer 99 is removed, the second nanostructures 54 have vertical extents corresponding to vertical protrusions 54*h* (which may also be referred to as horn protrusions 54*h*). As noted above, the thickness t1 is the original thickness of the second nanostructures 54. The thickness t4 of the vertical extents of each of the second nanostructures 54 may correspond to about 70% to 100% of the thickness t1 (see FIG. 13). The thickness t5 is removed from the tops and bottoms of the second nanostructures 54 by the channel smoothing and residue removal process. The thickness t5 removed from the tops and bottoms of the second nanostructures 54 may be between about 0.5 nm and 2 nm. The resulting thickness t6 of the channel may be between about 6 nm and about 15 nm, depending on the initial thickness t1 of the channel. The horn protrusions 54*h* result from the combined optional smoothing and residue removal process discussed above with respect to FIGS. 12 and 13 and the channel smoothing and residue removal process of FIG. 24. The optional smoothing and residue removal process trims the ends of the second nanostructures 54 and the channel smoothing and residue removal process of FIG. 24 trims the channel body of the second nanostructures 54, however, a portion of the second nanostructures 54 is not likewise trimmed, resulting in the horn protrusions 54*h*. The horn protrusions 54*h* also correspond to an interface between the inner surface of the first inner spacers 90 and the second nanostructures 54.

FIG. 25C illustrates a perspective view of an end portion of the second nanostructures 54 after performing the channel smoothing and residue removal process. As seen in FIG. 25C, the peak of the horn protrusions 54*h* extend across the width of the second nanostructures 54, forming a ramp on each side of the horn protrusions 54*h*. The side walls at the ends of the second nanostructures 54 are flat and then recess where exposed from the first nanostructures 52 due to the channel smoothing and residue removal process.

FIGS. 25D and 25E illustrate horizontal cross-sections through the structures of FIGS. 25A and 25B, respectively. As seen in FIGS. 25D and 25E, the sidewalls of the second nanostructures are flat where they interface with the first spacers 81. The thickness t7 of the width of the second nanostructures 54 is reduced by the thickness t5 (see FIGS. 25A and 25B) on each side by the channel smoothing and residue removal process so that the width of the channel becomes the thickness t8. In some embodiments, the thickness t7 may be between about 1 nm and 150 nm and the thickness t8 may be less than t7, between about 1 nm and 150 nm, though other values may be used and depend on the initial value of the thickness t7. It is noted that the original lateral thickness t7 is maintained on the ends of the second nanostructures. The end thickness of the second nanostructures 54 may be reduced by a thickness t9, which may be between about 3 Å and 20 Å, thereby causing an indentation in the ends of the second nanostructures 54.

FIGS. 26 through 31A, 31B, 31C, 31D, and 31E illustrate enlarged views of the dashed box labeled F20 in FIG. 19B where a channel smoothing and residue removal processes is performed on the structure of FIG. 19B after removing the first nanostructures 52. FIGS. 26 through 31A, 31B, 31C, 31D, and 31E differ from FIGS. 20 through 25A, 25B, 25C, 25D, and 25E, however, in that the structures illustrated in FIGS. 26 through 31A, 31B, 31C, 31D, and 31E do not include the optional smoothing and residue removal process discussed above.

Figure 27:
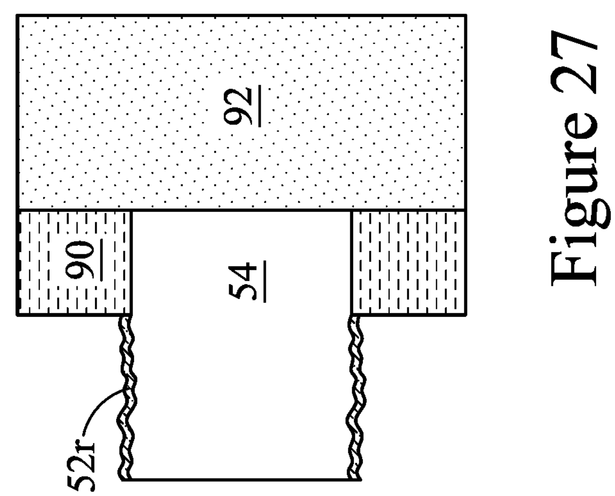
Figure 26:
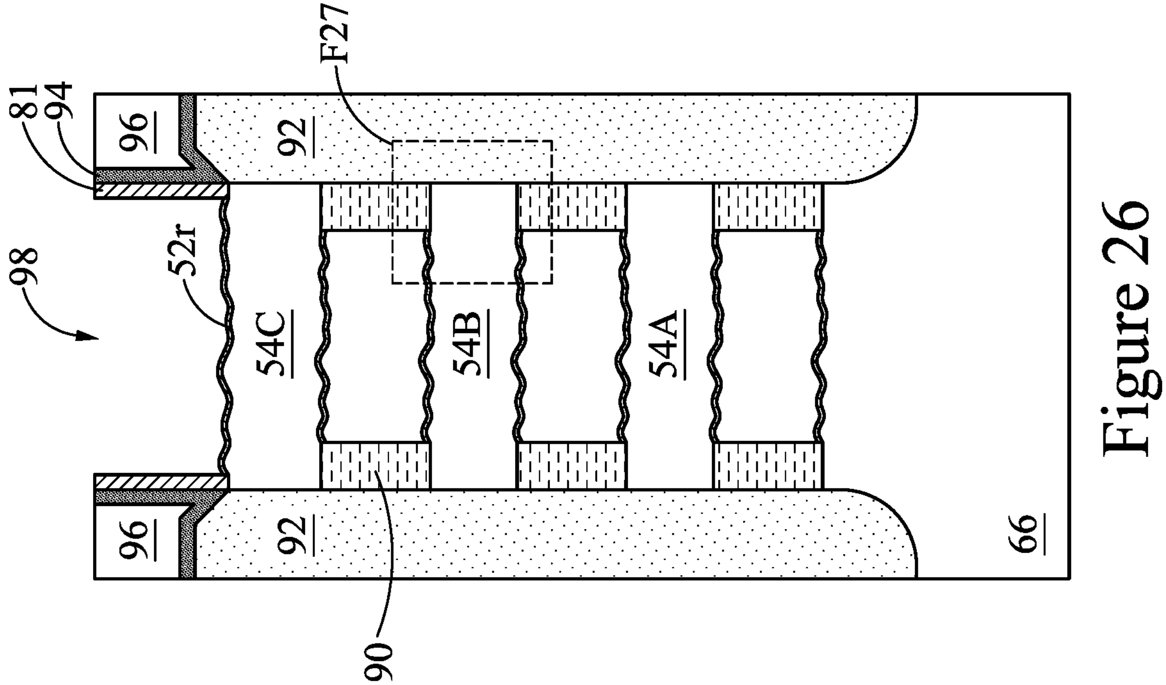

FIGS. 26 and 27 illustrate an enlarged view of the dashed box labeled F20 in FIG. 19B just after performing the etch process noted above to remove the first nanostructures 52. FIG. 27 illustrates an enlarged view of the dashed box labeled F27 in FIG. 26. As seen in FIGS. 26 and 27 a residue 52*r* is left behind after removing the first nanostructures 52. When the first nanostructures 52 are made of SiGe, the residue 52*r* is also SiGe. In addition, the surface of the second nanostructures 54 is rough from the etching process. FIGS. 26 and 27 differ from FIGS. 20 and 21 in that the optional smoothing and residue removal process was not performed prior to the removal of the first nanostructures 52 and release of the second nanostructures 54 as channel regions. The residue 52*r* and roughness of the surface of the second nanostructures 54 can cause performance issues. Accordingly, embodiments use a channel smoothing and residue removal process to remove the residue 52*r* and smooth the exposed surfaces of the second nanostructures 54.

FIGS. 28, 29A, and 29B illustrate the enlarged view FIG. 26 after an oxidation process is used to oxidize the residue 52*r* and the exposed surfaces of the second nanostructures 54 to form an oxidation layer 99. FIGS. 29A and 29B illustrate enlarged views of the dashed box labeled F29 in FIG. 22. FIGS. 29A and 29B illustrate different levels of oxidation. The oxidation layer 99 in FIG. 29A is thinner than the oxidation layer 99 in FIG. 29B. When the oxidation layer 99 is subsequently removed, more of the material of the second nanostructures 54 will be removed in the FIG. 29B than in the FIG. 29A. The thickness of the oxidation layer 99 may be varied by the duration and/or intensity of the oxidation process. Removing the oxidation layer 99 causes the surfaces of the second nanostructures 54 to become smoother and removes residue 52*r* remaining from the etching process which removes the first nanostructures 52.

The oxidation process may use any suitable oxidation process for forming the oxidation layer 99, including any of those discussed above with respect to the oxidation process of FIG. 12.

Figure 31C:
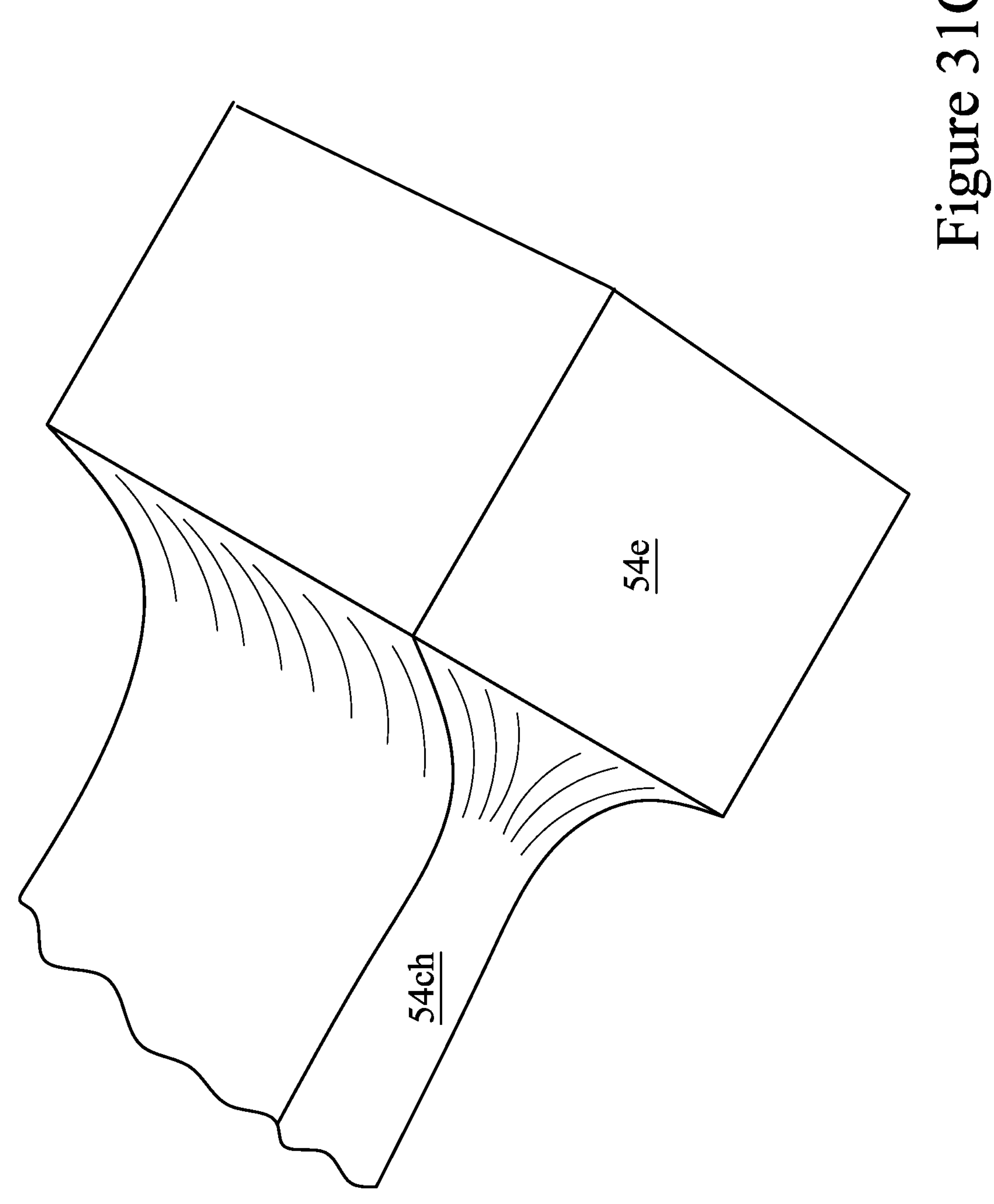
Figure 31E:
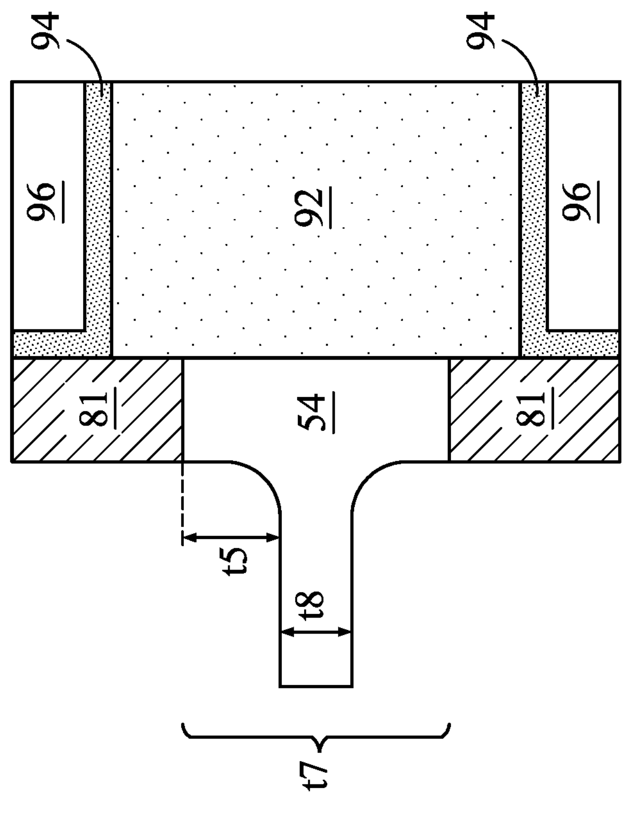
Figure 31D:
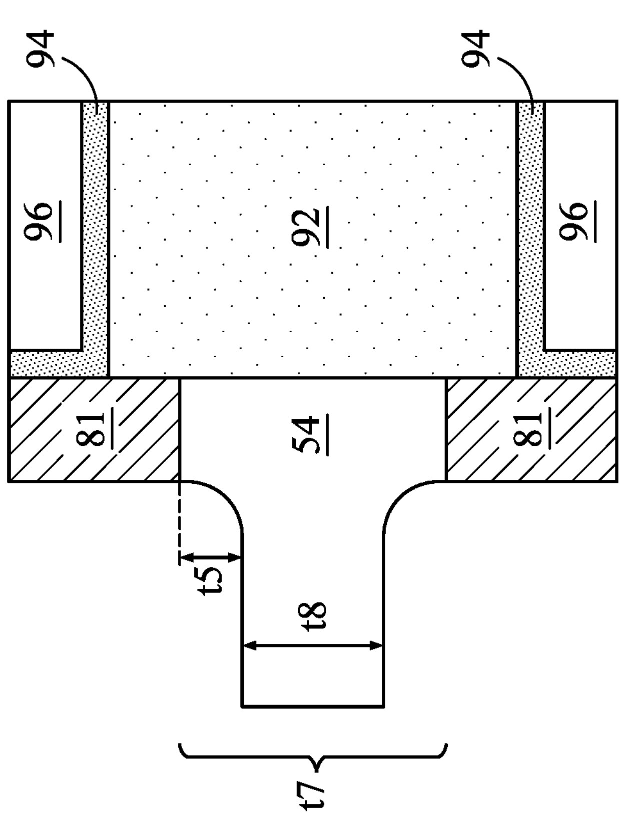

FIGS. 30, 31A, 31B, 31C, 31D, and 31E illustrate the enlarged view structure of FIG. 28 after the oxidation layer 99 is removed. In particular, FIGS. 31A and 31B illustrate enlarged views of the dashed box labeled F31 in FIG. 30. FIG. 31C illustrates an isolated perspective view of the end of the second nanostructure 54 in that area. FIGS. 31D and 31E correspond to FIGS. 31A and 31B, respectively, and illustrate horizontal cross-sections in the area of the dashed box labeled F31, the horizontal cross-sections being through the second nanostructures 54. FIG. 31A follows from FIG. 29A, where the oxidation layer 99 is not as thick as it is in FIG. 29B. Likewise, FIG. 31B follows from FIG. 29B where the oxidation layer 99 is thicker than in FIG. 29A. In addition, the oxidation layer 99 removal causes the remaining exposed surfaces of the second nanostructures 54 to become smoothed. In some embodiments, the RMS roughness of the surface of the second nanostructures 54 is reduced between about 50% and 90%.

Referring to FIGS. 31A, 31B, 31C, 31D, and 31E, after the oxidation layer 99 is removed, the second nanostructures 54 result in a dog-bone shape, having vertical protrusions at the ends of the second nanostructures 54 which correspond to the original thickness t1 (see FIG. 13) of the second nanostructures 54 and lateral extents corresponding to the thickness t7 of the width of the second nanostructures 54. The thickness t5 is removed from the tops, bottoms, and sides of the second nanostructures 54 by the channel smoothing and residue removal process. The thickness t5 may be between about 1 Å and 20 Å. The resulting thickness t6 of the channel may be between about 6 nm and about 15 nm, depending on the initial thickness t1 of the channel. The resulting lateral width t8 may be between about 1 nm and 150 nm.

FIG. 31C illustrates a perspective view of an end portion of the second nanostructures 54 after performing the channel smoothing and residue removal process. As seen in FIG. 31C, the end portion 54*e* of the second nanostructures is unaffected by the channel smoothing and residue removal process. In contrast, where the channel is exposed from the first nanostructures 52, the channel smoothing and residue removal process trims all around the second nanostructures 54, causing a ramped transition from the width/height of the end portion 54*e* to the channel portion 54*ch*. In addition, the oxidation layer 99 removal causes the remaining exposed surfaces of the second nanostructures 54 to become smoothed. In some embodiments, the RMS roughness of the surface of the second nanostructures 54 is reduced between about 50% and 90%.

FIGS. 31D and 31E illustrate horizontal cross-sections through the structures of FIGS. 31A and 31B, respectively. As seen in FIGS. 31D and 31E, the sidewalls of the second nanostructures are flat where they interface with the first spacers 81. The thickness t7 of the width of the second nanostructures 54 is reduced by the thickness t5 (see FIGS. 31A and 31B) by the channel smoothing and residue removal process so that the width of the channel becomes the thickness t8. In some embodiments, the thickness t7 may be between about 1 nm and 150 nm and the thickness t8 may be less than the thickness t7, between about 1 nm and 150 nm. It is noted that the original lateral thickness t7 is maintained on the ends of the second nanostructures. The end thickness of the second nanostructures 54 (see FIGS. 25D and 25E) may be reduced by a thickness t9, which may be between about 3 Å and 20 Å, thereby causing an indentation in the ends of the second nanostructures 54.

In FIGS. 32A, 32B, 33A, and 33B gate dielectric layers 100 and gate electrodes 102 are formed for replacement gates. The gate dielectric layers 100 are deposited conformally in the second recesses 98. In the n-type region 50N, the gate dielectric layers 100 may be formed on top surfaces and sidewalls of the substrate 50 and on top surfaces, sidewalls, and bottom surfaces of the second nanostructures 54, and in the p-type region 50P, the gate dielectric layers 100 may be formed on top surfaces and sidewalls of the substrate 50 and on top surfaces, sidewalls, and bottom surfaces of the first nanostructures 52. The gate dielectric layers 100 may also be deposited on top surfaces of the first ILD 96, the CESL 94, the first spacers 81, and the STI regions 68. Because of the smoothing and residue removal process, the interface between the gate dielectric layers 100 and the gate channels (corresponding to the second nanostructures 54) has a reduced residue content and a smoother profile. For example, where the first nanostructures 52 were made of silicon germanium, the amount of germanium-based residue at the interface of the gate dielectric layers 100 and the second nanostructures 54 may be reduced between 20% and 60%, in some embodiments, as compared with an untreated sample piece. The interface may include a germanium concentration between $10^{22}$ $cm^{-3}$ and $3*10^{22}$ $cm^{-3}$.

In accordance with some embodiments, the gate dielectric layers 100 comprise one or more dielectric layers, such as an oxide, a metal oxide, the like, or combinations thereof. For example, in some embodiments, the gate dielectrics may comprise a silicon oxide layer and a metal oxide layer over the silicon oxide layer. In some embodiments, the gate dielectric layers 100 include a high-k dielectric material, and in these embodiments, the gate dielectric layers 100 may have a k value greater than about 7.0, and may include a metal oxide or a silicate of hafnium, aluminum, zirconium, lanthanum, manganese, barium, titanium, lead, and combinations thereof. The structure of the gate dielectric layers 100 may be the same or different in the n-type region 50N and the p-type region 50P. The formation methods of the gate dielectric layers 100 may include molecular-beam deposition (MBD), ALD, PECVD, and the like.

Figure 32A:
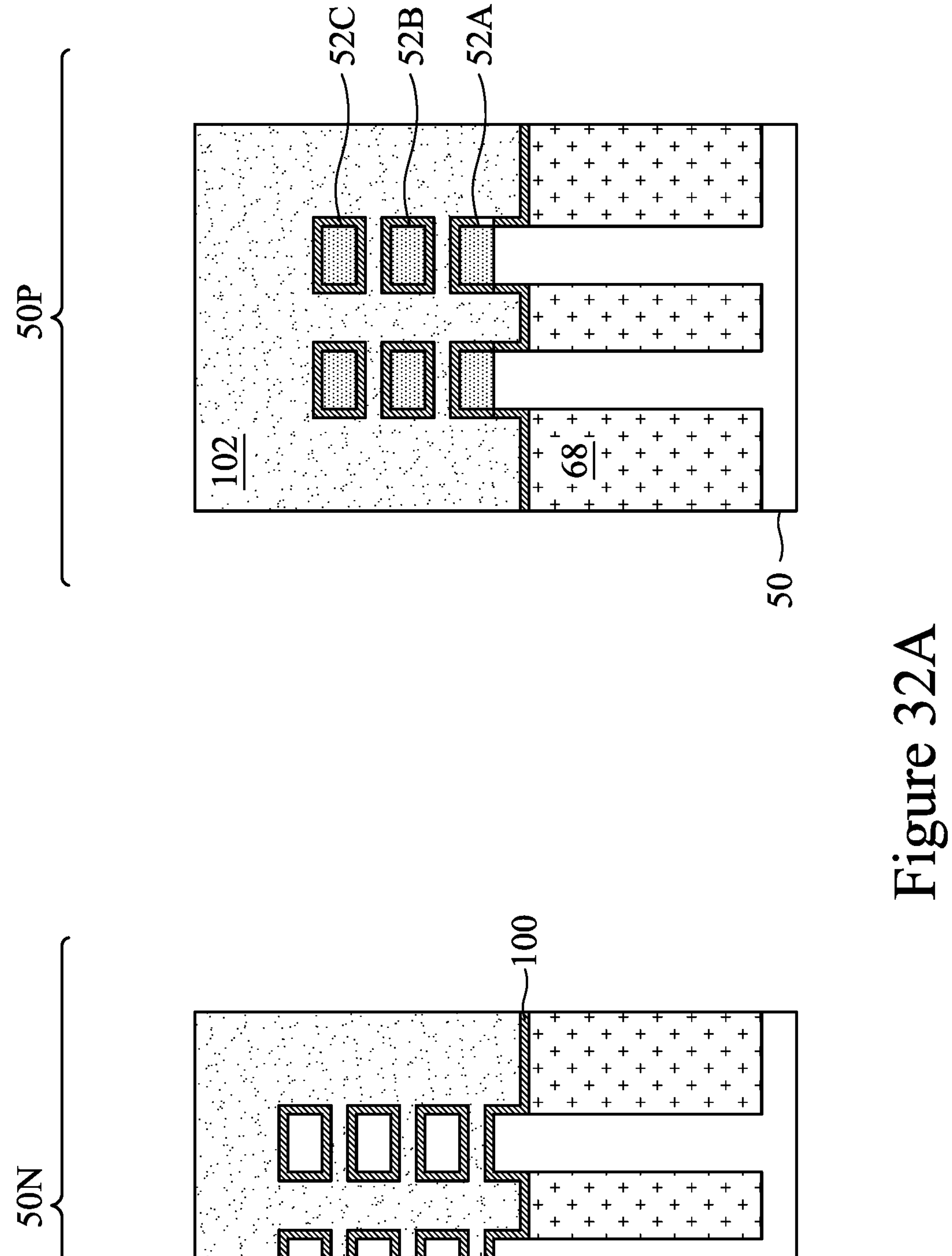
Figure 32B:
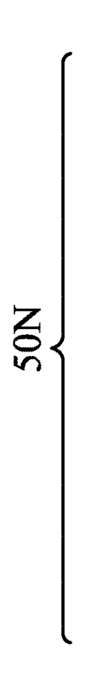
Figure 32B:
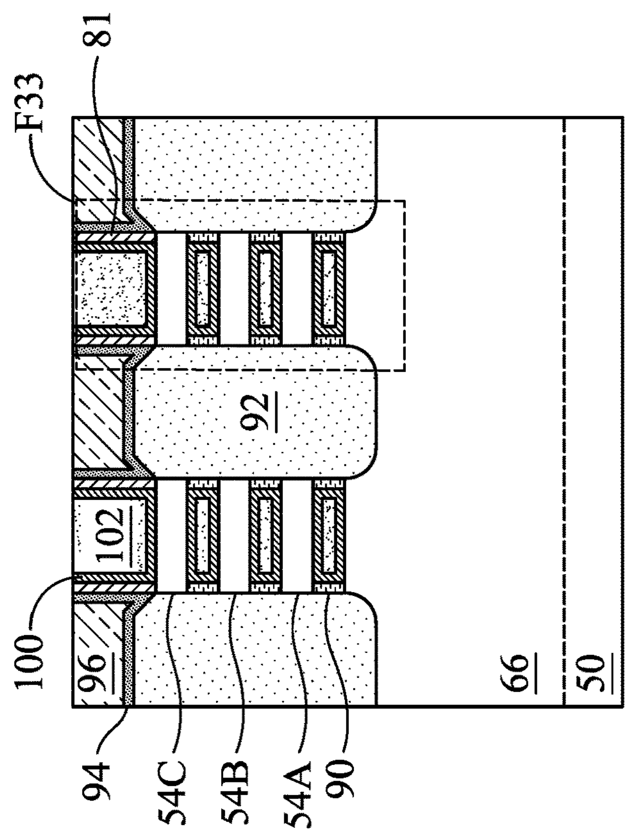

The gate electrodes 102 are deposited over the gate dielectric layers 100, respectively, and fill the remaining portions of the second recesses 98. The gate electrodes 102 may include a metal-containing material such as titanium nitride, titanium oxide, tantalum nitride, tantalum carbide, cobalt, ruthenium, aluminum, tungsten, combinations thereof, or multi-layers thereof. For example, although single layer gate electrodes 102 are illustrated in FIGS. 32A and 32B, the gate electrodes 102 may comprise any number of liner layers, any number of work function tuning layers, and a fill material. Any combination of the layers which make up the gate electrodes 102 may be deposited in the n-type region 50N between adjacent ones of the second nanostructures 54 and between the second nanostructure 54A and the substrate 50, and may be deposited in the p-type region 50P between adjacent ones of the first nanostructures 52.

The formation of the gate dielectric layers 100 in the n-type region 50N and the p-type region 50P may occur simultaneously such that the gate dielectric layers 100 in each region are formed from the same materials, and the formation of the gate electrodes 102 may occur simultaneously such that the gate electrodes 102 in each region are formed from the same materials. In some embodiments, the gate dielectric layers 100 in each region may be formed by distinct processes, such that the gate dielectric layers 100 may be different materials and/or have a different number of layers, and/or the gate electrodes 102 in each region may be formed by distinct processes, such that the gate electrodes 102 may be different materials and/or have a different number of layers. Various masking steps may be used to mask and expose appropriate regions when using distinct processes.

After the filling of the second recesses 98, a planarization process, such as a CMP, may be performed to remove the excess portions of the gate dielectric layers 100 and the material of the gate electrodes 102, which excess portions are over the top surface of the first ILD 96. The remaining portions of material of the gate electrodes 102 and the gate dielectric layers 100 thus form replacement gate structures of the resulting nano-FETs. The gate electrodes 102 and the gate dielectric layers 100 may be collectively referred to as "gate structures."

Figure 33B:
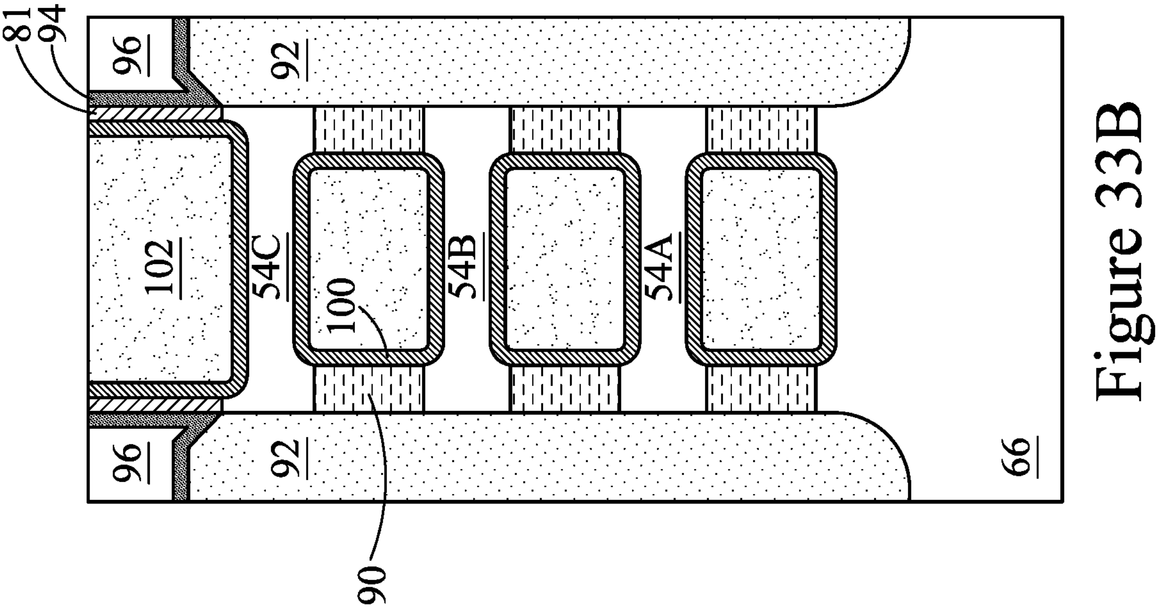
Figure 33A:
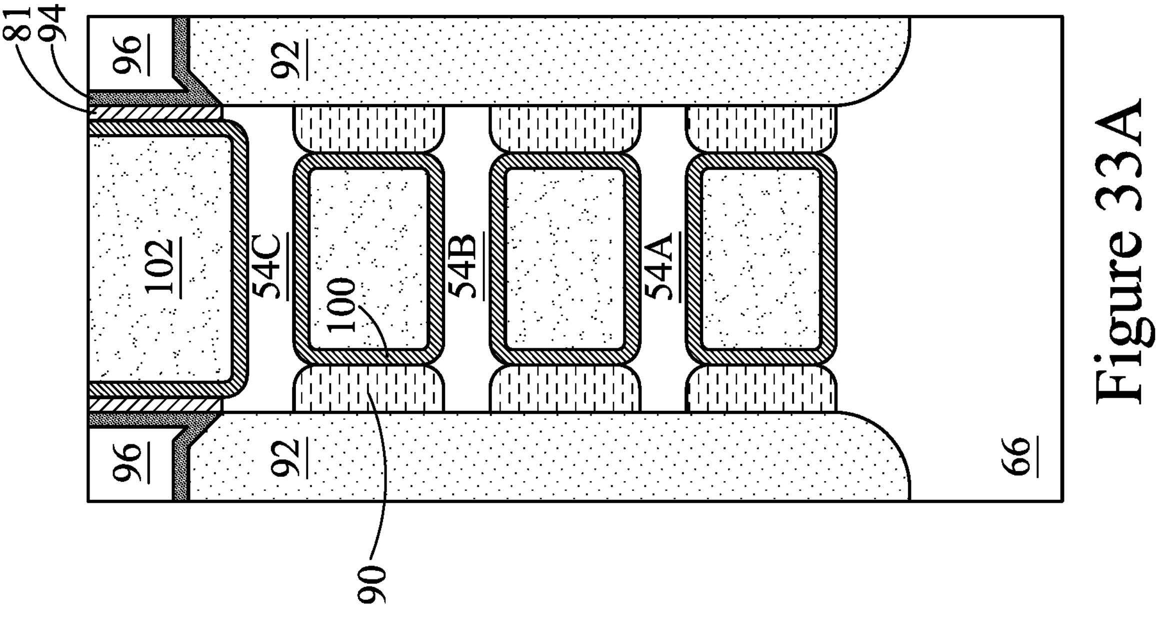

Referring to FIGS. 33A and 33B, an enlarged view of the dashed box of FIG. 32B labeled F33 is illustrated, illustrating the gate dielectric layers 100 and gate electrodes 102. In FIG. 33A, the optional smoothing and residue removal process described above with respect to FIGS. 11 through 13 has been utilized. In FIG. 33B, the optional smoothing and residue removal process described above with respect to FIGS. 11 through 13 has not been utilized.

In FIG. 33A, due to the optional smoothing and residue removal process, first inner spacers 90 may extend into the end portion of the second nanostructures 54 (e.g., the end portion 54*e*) more than the gate dielectric layers 100. In other words, the vertical extent of one of the first inner spacers 90 between second nanostructures 54 (e.g., between nanostructures 54A and 54B) may be greater than the vertical extent of the gate dielectric layers 100 between the same second nanostructures 54. This arrangement has the benefit of providing better protection between the gate dielectric layers 100 and epitaxial source/drain regions 92. In FIG. 33B, the vertical extent of the gate dielectric layers 100 between adjacent second nanostructures 54 is greater than the vertical extent of the first inner spacers 90. This arrangement has the benefit of providing more contact between the channel end (corresponding to one of the second nanostructures 54) and the epitaxial source/drain region 92 while still providing a smoother channel surface and reduce residue at the interface of the gate dielectric layers 100 and the channels corresponding to the second nanostructures 54.

Figure 34A:
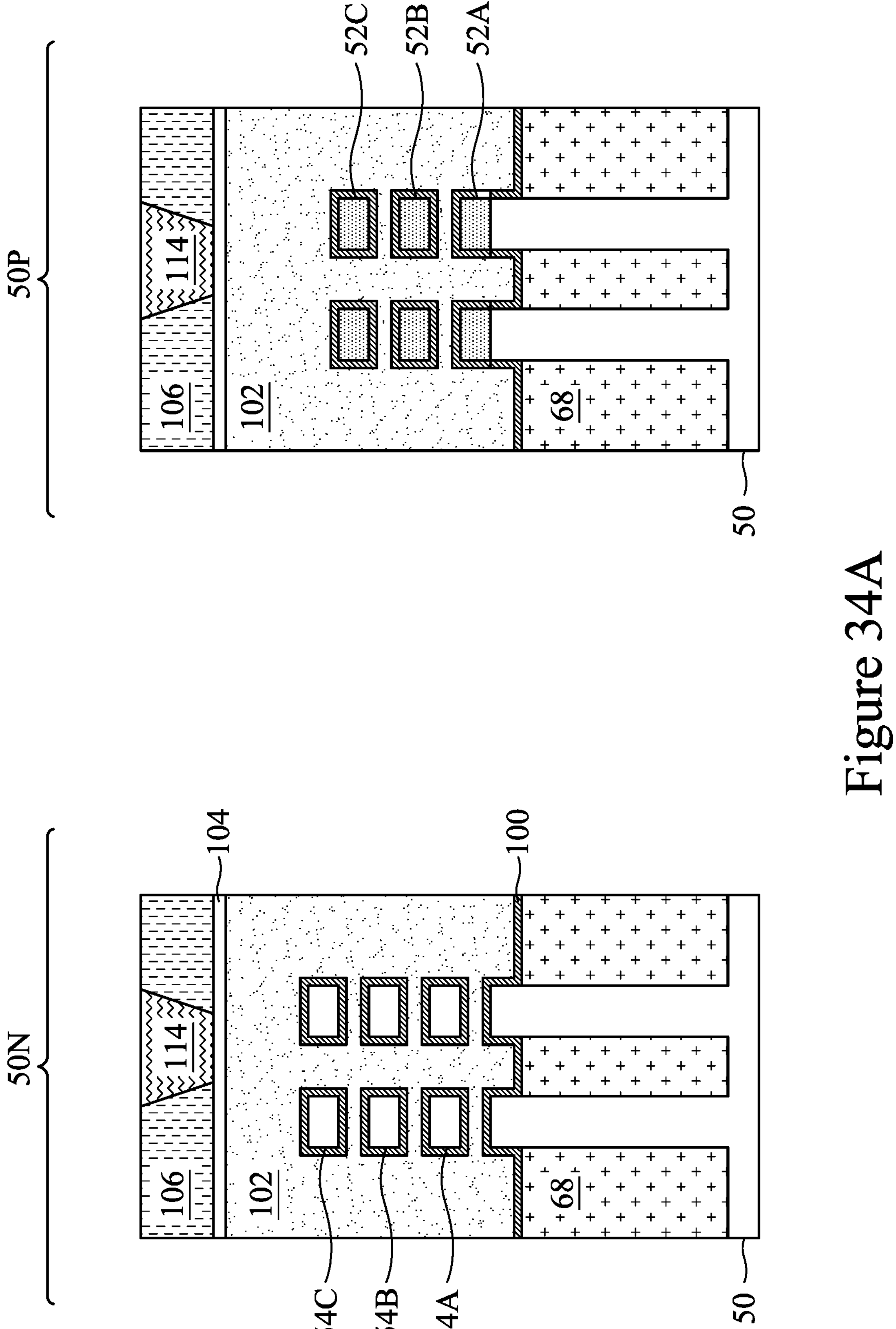
Figure 34B:
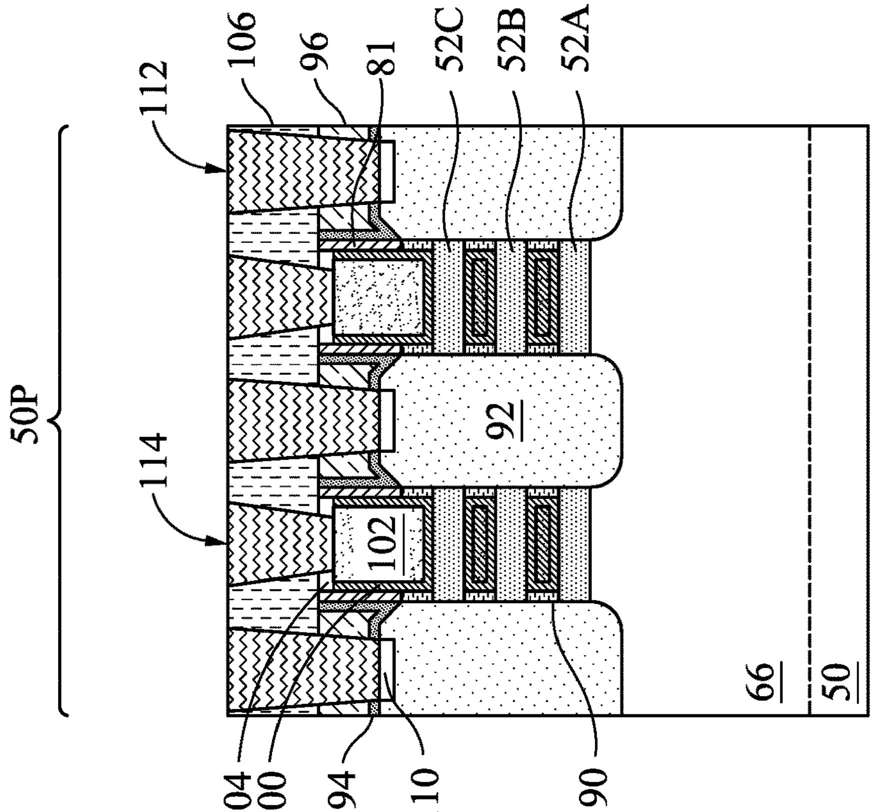
Figure 34B:
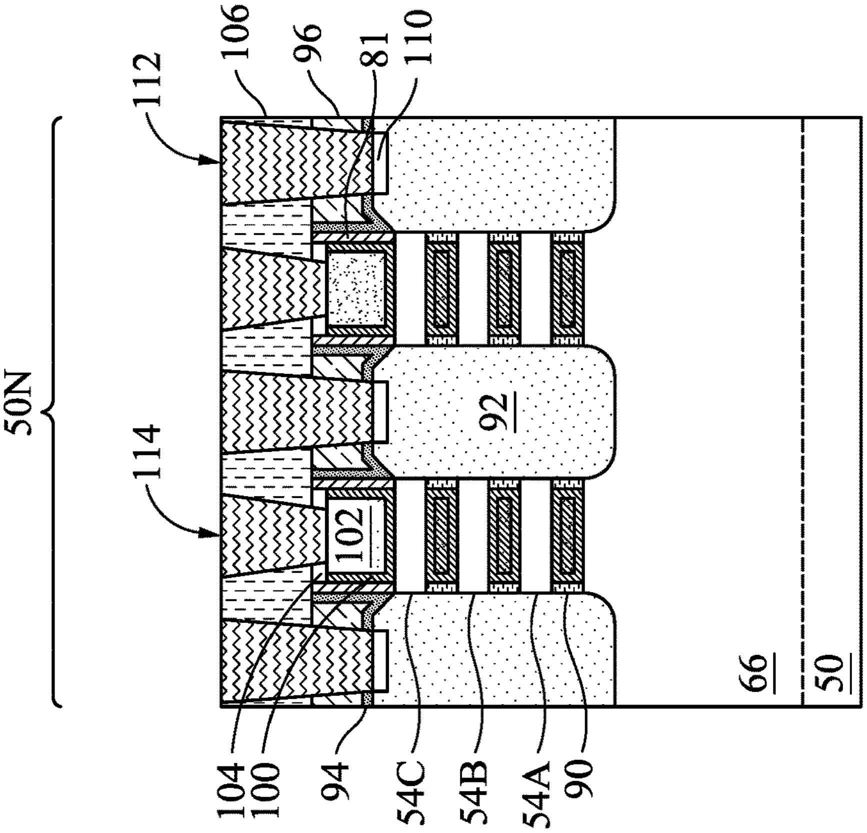
Figure 34C:
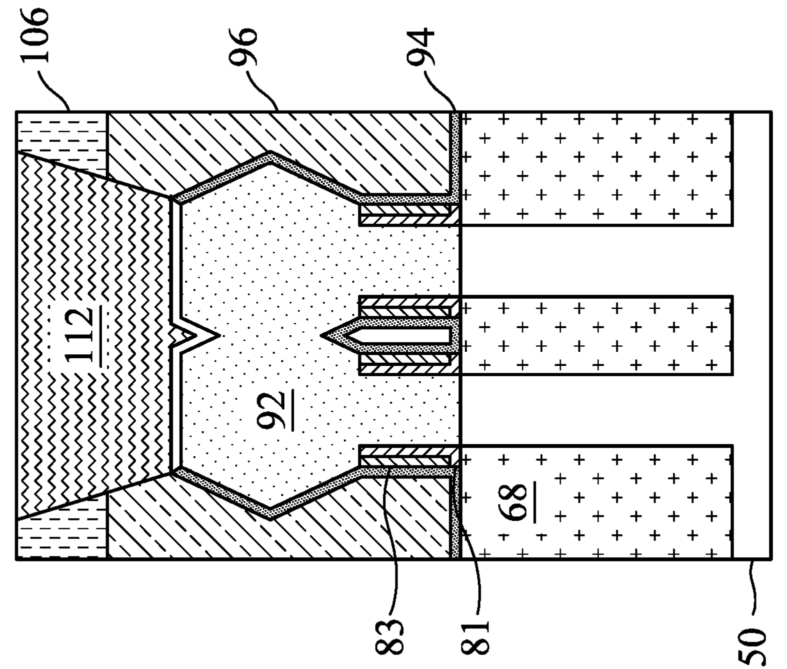

In FIGS. 34A-34C, the gate structure (including the gate dielectric layers 100 and the corresponding overlying gate electrodes 102) is recessed, so that a recess is formed directly over the gate structure and between opposing portions of first spacers 81. A gate mask 104 comprising one or more layers of dielectric material, such as silicon nitride, silicon oxynitride, or the like, is filled in the recess, followed by a planarization process to remove excess portions of the dielectric material extending over the first ILD 96. Subsequently formed gate contacts (such as the contacts 114) penetrate through the gate mask 104 to contact the top surface of the recessed gate electrodes 102.

As further illustrated by FIGS. 34A-34C, a second ILD 106 is deposited over the first ILD 96 and over the gate mask 104. In some embodiments, the second ILD 106 is a flowable film formed by FCVD. In some embodiments, the second ILD 106 is formed of a dielectric material such as PSG, BSG, BPSG, USG, or the like, and may be deposited by any suitable method, such as CVD, PECVD, or the like.

After depositing the second ILD 106, the second ILD 106, the first ILD 96, the CESL 94, and the gate masks 104 are etched to form third recesses exposing surfaces of the epitaxial source/drain regions 92 and/or the gate structure. The third recesses may be formed by etching using an anisotropic etching process, such as RIE, NBE, or the like. In some embodiments, the third recesses may be etched through the second ILD 106 and the first ILD 96 using a first etching process; may be etched through the gate masks 104 using a second etching process; and may then be etched through the CESL 94 using a third etching process. A mask, such as a photoresist, may be formed and patterned over the second ILD 106 to mask portions of the second ILD 106 from the first etching process and the second etching process. In some embodiments, the etching process may over-etch, and therefore, the third recesses may extend into the epitaxial source/drain regions 92 and/or the gate structure, and a bottom of the third recesses may be level with (e.g., at a same level, or having a same distance from the substrate), or lower than (e.g., closer to the substrate) the epitaxial source/drain regions 92 and/or the gate structure. Although FIG. 34B illustrates the resulting contacts 112 and 114 formed in the third recesses in a same cross section, in various embodiments, the epitaxial source/drain regions 92 and the gate structure may be exposed in different cross-sections, thereby reducing the risk of shorting subsequently formed contacts.

After the third recesses are formed, silicide regions 110 are formed over the epitaxial source/drain regions 92. In some embodiments, the silicide regions 110 are formed by first depositing a metal (not shown) capable of reacting with the semiconductor materials of the underlying epitaxial source/drain regions 92 (e.g., silicon, silicon germanium, germanium) to form silicide or germanide regions, such as nickel, cobalt, titanium, tantalum, platinum, tungsten, other noble metals, other refractory metals, rare earth metals or their alloys, over the exposed portions of the epitaxial source/drain regions 92, then performing a thermal anneal process to form the silicide regions 110. The un-reacted portions of the deposited metal are then removed, e.g., by an etching process. Although silicide regions 110 are referred to as silicide regions, silicide regions 110 may also be germanide regions, or silicon germanide regions (e.g., regions comprising silicide and germanide). In an embodiment, the silicide region 110 comprises TiSi, and has a thickness in a range between about 2 nm and about 10 nm.

Still referring to FIGS. 34A-34C, next, contacts 112 and 114 (may also be referred to as contact plugs) are formed in the third recesses. The contacts 112 and 114 may each comprise one or more layers, such as barrier layers, diffusion layers, and fill materials. For example, in some embodiments, the contacts 112 and 114 each include a barrier layer and a conductive material, and is electrically coupled to the underlying conductive feature (e.g., gate electrodes 102 and/or silicide region 110 in the illustrated embodiment). The contacts 114 are electrically coupled to the gate electrodes 102 and may be referred to as gate contacts, and the contacts 112 are electrically coupled to the silicide regions 110 and may be referred to as source/drain contacts. The barrier layer may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the second ILD 106.

FIGS. 35A-35E illustrate cross-sectional views of a device according to some alternative embodiments. FIG.

Figure 35A:
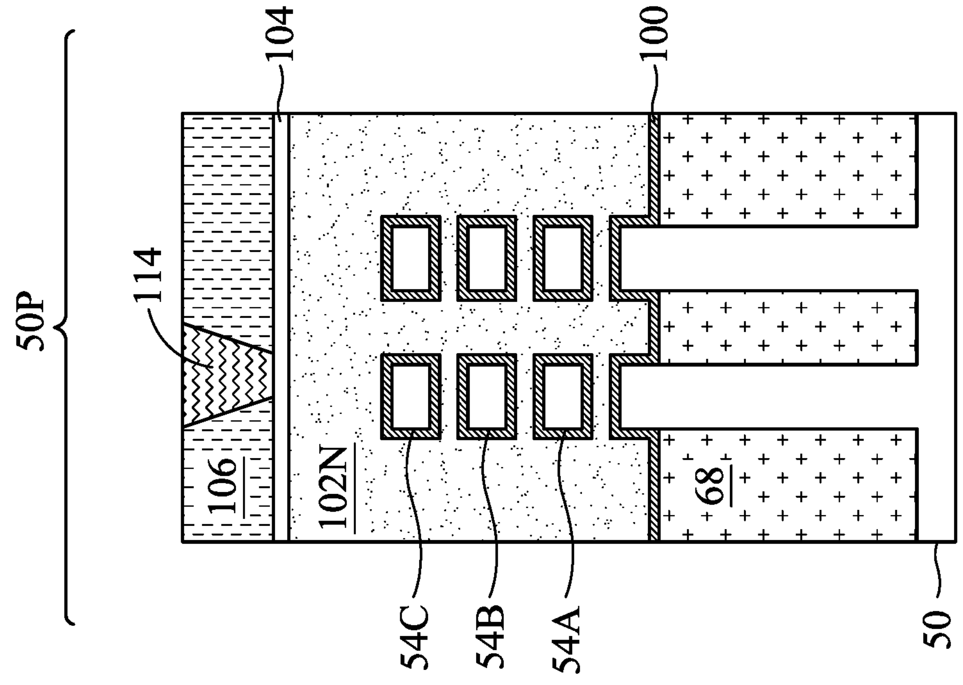
FIGS. 35A, 35B, 35C, 35D, and 35E are cross-sectional views of a nano-FET, in accordance with some embodiments.
Figure 35A:
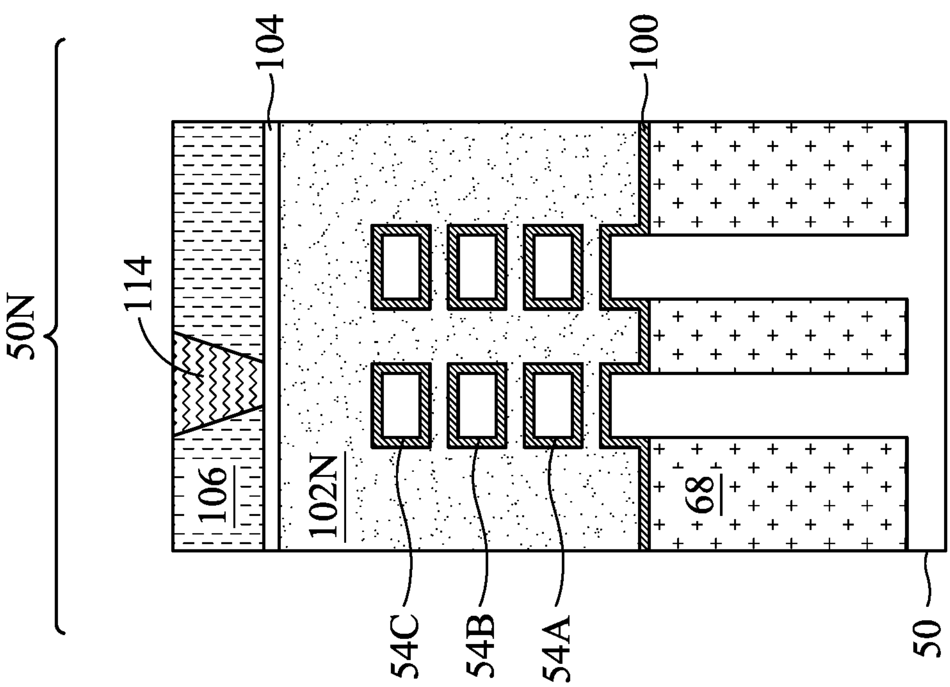
Figure 35B:
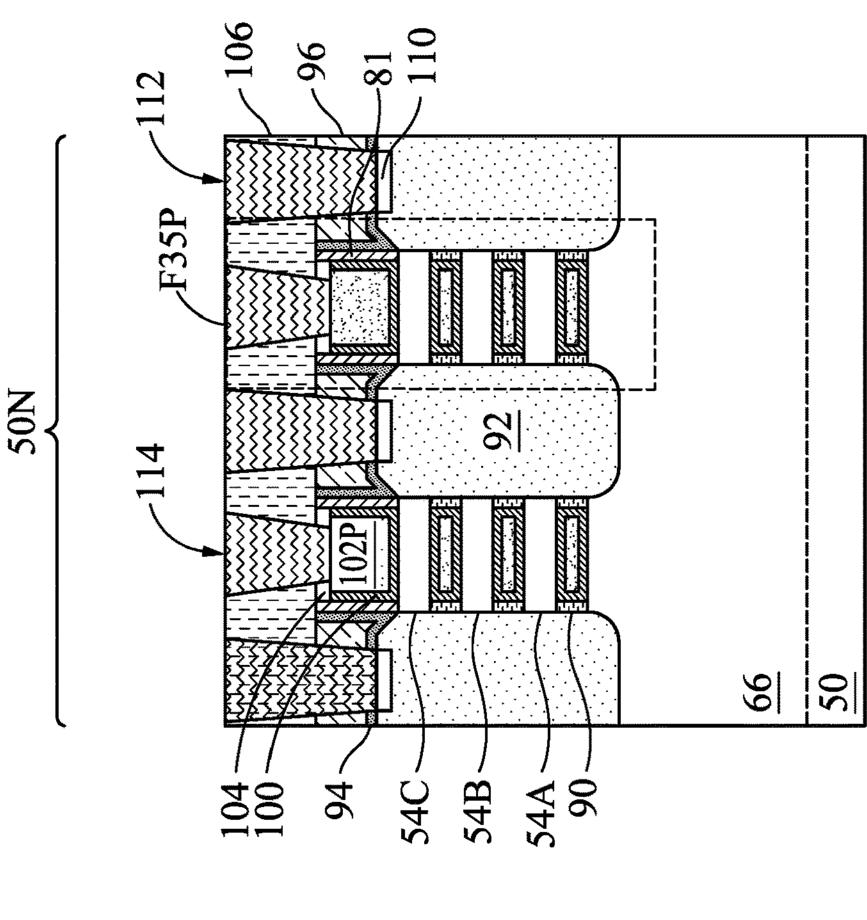
Figure 35B:
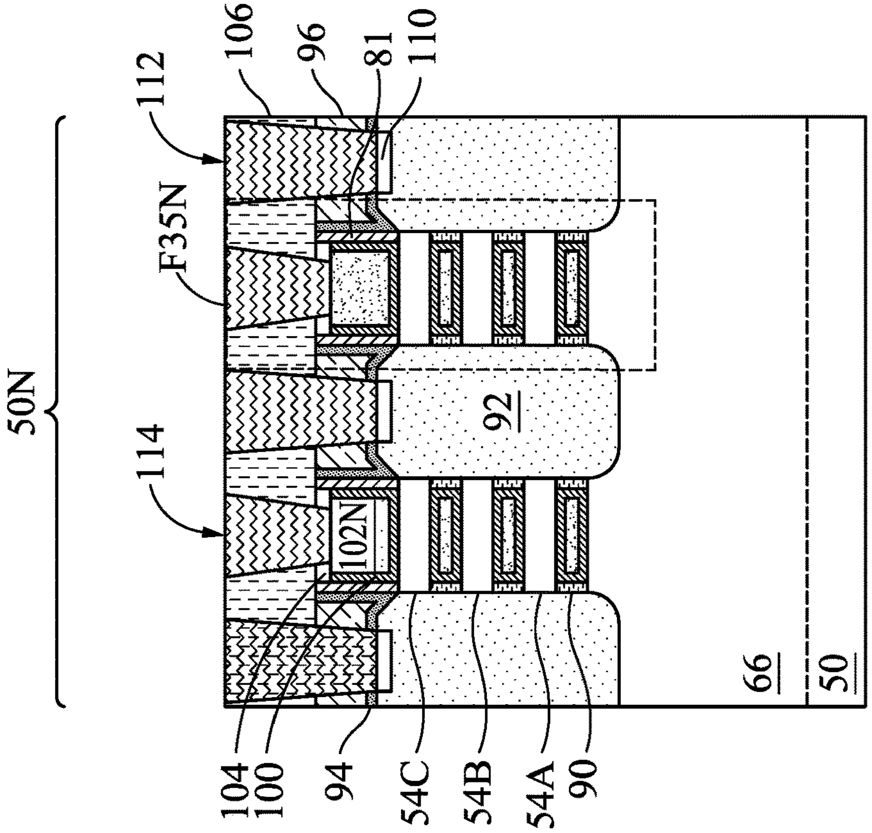
Figure 35C:
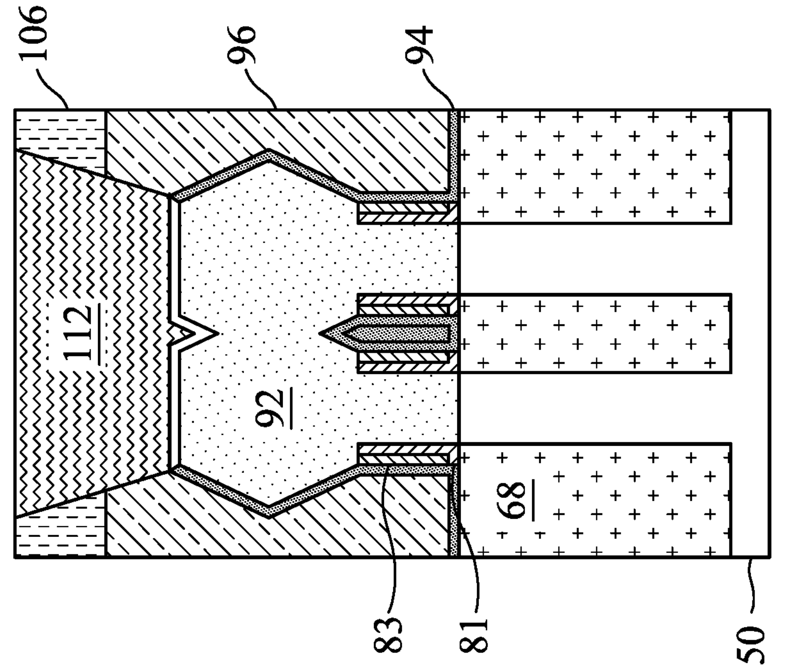
Figure 35D:
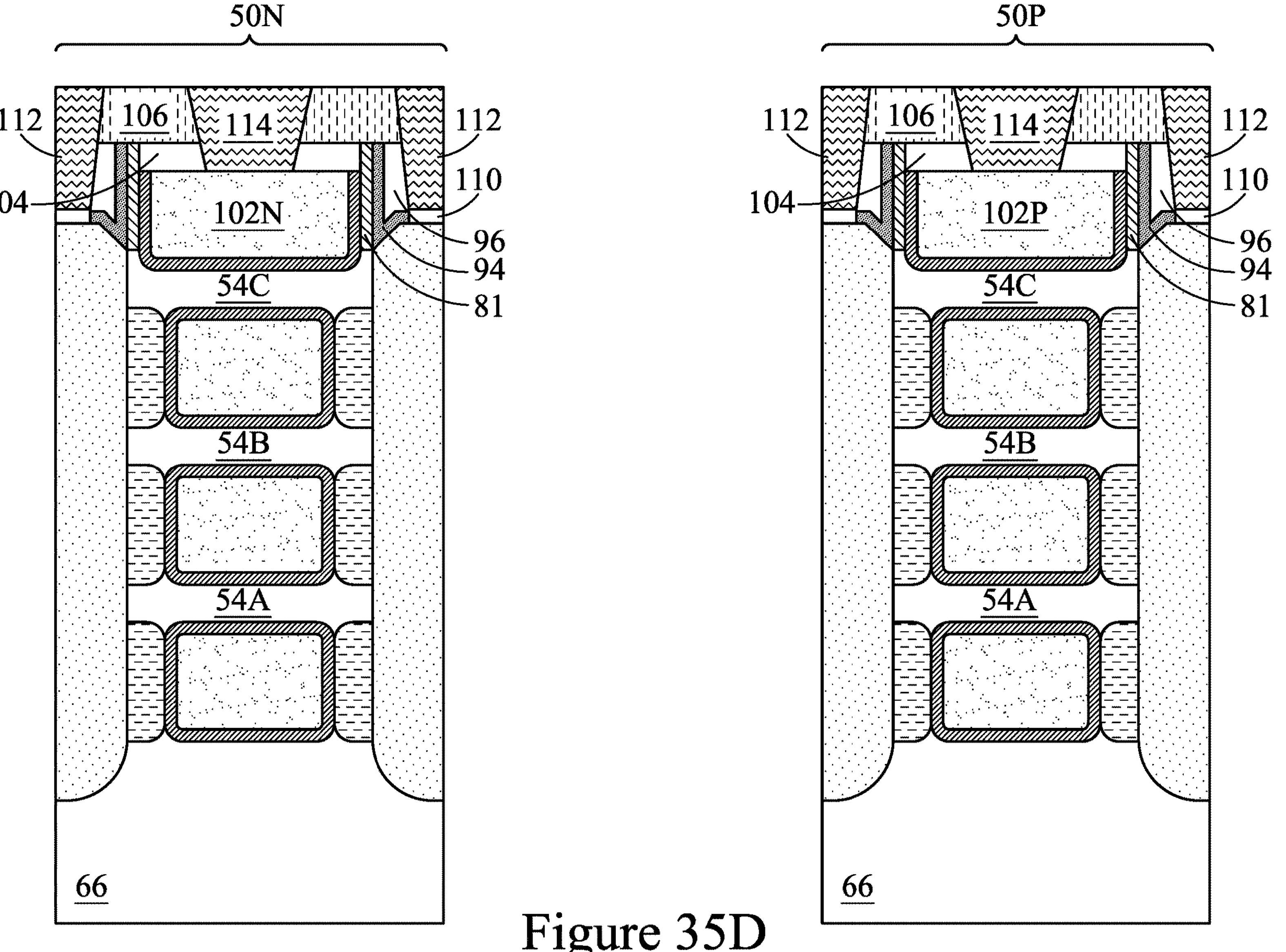
Figure 35E:
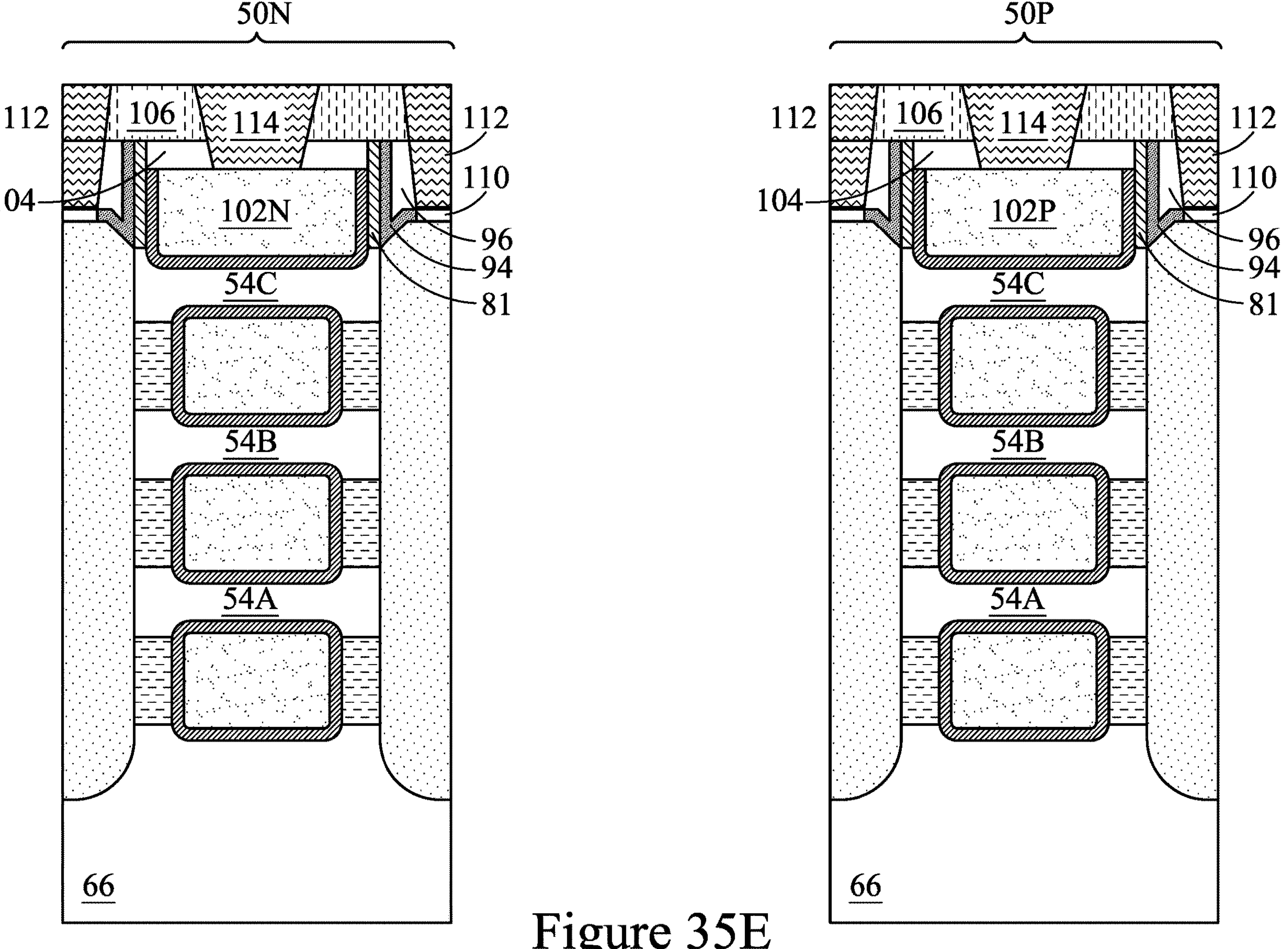

35A illustrates reference cross-section A-A' illustrated in FIG. 1. FIG. 35B illustrates reference cross-section B-B' illustrated in FIG. 1. FIG. 35C illustrates reference cross-section C-C' illustrated in FIG. 1. FIG. 35D illustrates an enlarged view of the areas n-type region 50N marked by the dashed box F35N of FIG. 35B and the p-type region 50P marked by the dashed box F35P of FIG. 35B, in accordance with embodiments which utilize the optional smoothing and residue removal process described above with respect to FIGS. 11-13. FIG. 35E illustrates an enlarged view of the areas n-type region 50N marked by the dashed box F35N of FIG. 35B and the p-type region 50P marked by the dashed box F35P of FIG. 35B, in accordance with embodiments which do not utilize the optional smoothing and residue removal process described above with respect to FIGS. 11-13.

In FIGS. 35A-35E, like reference numerals indicate like elements formed by like processes as the structure of FIGS. 34A-34C. However, in FIGS. 35A-35C, channel regions in the n-type region 50N and the p-type region 50P comprise a same material. For example, the second nanostructures 54, which comprise silicon, provide channel regions for p-type nano-FETs in the p-type region 50P and for n-type nano-FETs in the n-type region 50N. The structure of FIGS. 35A-35E may be formed, for example, by removing the first nanostructures 52 from both the p-type region 50P and the n-type region 50N simultaneously; depositing the gate dielectric layers 100 and the gate electrodes 102P (e.g., gate electrode suitable for a p-type nano-FET) around the second nanostructures 54 in the p-type region 50P; and depositing the gate dielectric layers 100 and the gate electrodes 102N (e.g., a gate electrode suitable for a n-type nano-FET) around the second nanostructures 54 in the n-type region 50N. In such embodiments, materials of the epitaxial source/drain regions 92 may be different in the n-type region 50N compared to the p-type region 50P as explained above.

In such embodiments, the optional smoothing and residue removal process and the channel smoothing and residue removal process may be used in both the n-type region and the p-type region 50P.

Embodiments may achieve advantages. For example, processes use an oxidation and removal process to remove remaining residue which is on the channel nanostructures of a nanosheet transistor. When a channel nanostructure is released from surrounding silicon germanium nanosheets, the roughness of the channel nanostructure and the germanium residue can affect the subsequently formed gate dielectric and work function layers. For example, the roughness and germanium residue can impact channel mobility and interface state density, and cause voltage threshold fluctuation. In short, the integrity of the gate oxide dielectric would be degraded due to germanium impurity in the gate dielectric layer. Embodiments remove this residue and smooth the channel surface to provide more consistent device performance characteristics. Embodiments may also use an optional smoothing and residue removal process to remove residue at the ends of the channels when sidewall recess are made for the first inner spacers. Embodiments may cause a channel to be formed which is a dog bone shape or which has horns at the channel ends where the channel interfaces with the interior wall of the first channel spacers.

One embodiment is a device including a first nanostructure and a second nanostructure under the first nanostructure, the second nanostructure having vertical protrusions at opposite ends of the second nanostructure. The device also includes a gate structure disposed over the first nanostructure and the second nanostructure, the gate structure extending between the first nanostructure and the second nanostructure. The device also includes a source/drain region adjacent the gate structure, the source/drain region contacting the first nanostructure and the second nanostructure.

In an embodiment, the device further includes: an inner spacer disposed at an end of the second nanostructure, the inner spacer interposed between the first nanostructure and the second nanostructure, the inner spacer interfacing with one of the vertical protrusions. In an embodiment, a distance between an upper surface of the inner spacer to a lower surface of the inner spacer is greater than a distance between a lower surface of the first nanostructure and an upper surface of the second nanostructure. In an embodiment, a vertical extent of the inner spacer is greater than a vertical extent of a portion of the gate structure extending between the first nanostructure and the second nanostructure. In an embodiment, a thickness of the second nanostructure is greater at the vertical protrusions than at tips of the second nanostructure. In an embodiment, the first nanostructure includes vertical protrusions at opposite ends of the first nanostructure, where the vertical protrusions of the first nanostructure only protrude downward. In an embodiment, a vertical distance between a vertical extent of one of the vertical protrusions and a middle of the second nanostructure is between 0.5 nm and 2 nm. In an embodiment, the second nanostructure is treated, where the second nanostructure comprises silicon, and where germanium at an interface of the second nanostructure and the gate structure is 20% to 60% less than germanium at an interface of an untreated sample.

Another embodiment is a transistor including a first nanostructure and a second nanostructure under the first nanostructure, the second nanostructure separated from the first nanostructure by a first distance. The transistor also includes a gate structure disposed over the first nanostructure and the second nanostructure, a first portion of the gate structure extending between the first nanostructure and the second nanostructure, the first portion having a height that is a second distance, the second distance greater than the first distance. The transistor also includes a source/drain region adjacent the gate structure, the source/drain region contacting the first nanostructure and the second nanostructure.

In an embodiment, the transistor further includes: a first inner spacer disposed between a first end of the first nanostructure and a second end of the second nanostructure, the first inner spacer having a first interface with the second nanostructure at a bottom of the first inner spacer, the first inner spacer having a second interface with the second nanostructure at a sidewall of the first inner spacer. In an embodiment, a thickness of the second nanostructure is greatest at the second interface between the second nanostructure and the sidewall of the first inner spacer. In an embodiment, a width of the second nanostructure at a tip of the second nanostructure transitions from a first width to a second smaller width at a center of the second nano structure.

Another embodiment is a method including forming first nanostructures and second nanostructures over a substrate, each of the first nanostructures alternating with each of the second nanostructures. The method also includes forming a dummy gate structure over the first nanostructures and the second nanostructures. The method also includes performing a first etch process to remove an upper portion of the dummy gate structure and expose the first nanostructures. The method also includes performing a second etch process to remove the first nanostructures under the dummy gate structure, a residue from the second etch process remaining on exposed surfaces of the second nanostructures. The method also includes oxidizing the residue to form an oxidation layer. The method also includes removing the oxidation layer by a third etch process.

In an embodiment, following the third etch process a surface of the second nanostructures is smoothed by 50% to 90% RMS. In an embodiment, a residue from etching the sidewall recesses remains on the tip portion of the second nanostructures. In an embodiment, the method further includes: oxidizing the residue to form a second oxidation layer; and removing the oxidation layer by a fourth etch process. In an embodiment, the second oxidation layer includes an oxidized tip of the second nanostructures. In an embodiment, the method further includes oxidizing a surface of the second nanostructures and including the oxidized surface in the oxidation layer. In an embodiment, oxidizing the residue includes performing a thermal oxidation, a wet ozone oxidation, or an oxygen radical plasma process. In an embodiment, following removing the oxidation layer, portions of the second nanostructures are removed, causing vertical protrusions of the second nanostructures to form at ends of the second nanostructures.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
- forming first nanostructures and second nanostructures over a substrate, each of the first nanostructures alternating with each of the second nanostructures;
- forming a dummy gate structure over the first nanostructures and the second nanostructures;
- performing a first etch process to remove an upper portion of the dummy gate structure and expose the first nanostructures;
- performing a second etch process to remove the first nanostructures under the dummy gate structure, a first residue from the second etch process remaining on exposed surfaces of the second nanostructures;
- after performing the second etch process, oxidizing the first residue to form an oxidation layer; and
- removing the oxidation layer by a third etch process.

2. The method of claim 1, wherein following the third etch process a surface of the second nanostructures is smoothed by 50% to 90% RMS roughness.

3. The method of claim 1, further comprising:
- etching the first nanostructures and the second nanostructures to form a first recess in the first nanostructures and the second nanostructures; and
- etching sidewall recesses through the first recess in the first nanostructures, a tip portion of the second nanostructures exposed by the sidewall recesses, wherein a second residue from etching the sidewall recesses remains on the tip portion of the second nanostructures.

4. The method of claim 3, further comprising:
- oxidizing the second residue to form a second oxidation layer; and
- removing the second oxidation layer by a fourth etch process.

5. The method of claim 4, wherein the second oxidation layer includes an oxidized tip of the second nanostructures.

6. The method of claim 1, further comprising oxidizing a surface of the second nanostructures and including the oxidized surface in the oxidation layer.

7. The method of claim 1, wherein oxidizing the first residue comprises performing a thermal oxidation, a wet ozone oxidation, or an oxygen radical plasma process.

8. The method of claim 1, wherein following removing the oxidation layer, portions of the second nanostructures are removed, causing vertical protrusions of the second nanostructures to form at ends of the second nanostructures.

9. A method comprising:
- forming a stack of first nanostructures and second nanostructures over a substrate, each of the first nanostructures alternating with each of the second nanostructures;
- forming a dummy gate structure over the stack of the first nanostructures and the second nanostructures;
- forming a first recess in the stack adjacent the dummy gate structure;
- recessing sidewalls of the first nanostructures to form second recesses;
- after recessing the sidewalls of the first nanostructures, smoothing upper and lower surfaces of the second nanostructures exposed in the second recesses;
- forming a source/drain structure in the first recess;
- removing the dummy gate structure to form a third recess;
- removing the first nanostructures exposed in the third recess to form fourth recesses between adjacent ones of the second nanostructures;
- after removing the first nanostructures, smoothing upper and lower surfaces of the second nanostructures exposed in the fourth recesses; and
- forming a replacement gate structure in the third recess and the fourth recesses.

10. The method of claim 9, wherein after forming the replacement gate structure, the second nanostructures have vertical protrusions offset from ends of the second nanostructures.

11. The method of claim 9, wherein a height of individual ones of the second nanostructures under the replacement gate structure is less than a height of the individual ones of the second nanostructures along the source/drain structure.

12. The method of claim 9, wherein smoothing upper and lower surfaces of the second nanostructures exposed in the second recesses comprises an oxidation process and an oxidation removal process.

13. The method of claim 9, wherein smoothing upper and lower surfaces of the second nanostructures exposed in the fourth recesses comprises an oxidation process and an oxidation removal process.

14. The method of claim 9, wherein after forming the replacement gate structure, a height of ends of the second nanostructures are uniform.

15. A method comprising:
- forming a nanostructure stack of a first nanostructure, a second nanostructure over the first nanostructure, and a third nanostructure over the second nanostructure;
- forming a first gate structure over the nanostructure stack;
- forming a first recess in the nanostructure stack adjacent the first gate structure;
- recessing sidewalls of the first nanostructure and the third nanostructure to expose a first upper surface and a first lower surface of the second nanostructure;

forming a first inner spacer adjacent an end of the first nanostructure on the first lower surface of the second nanostructure and a second inner spacer adjacent an end of the third nanostructure on the first upper surface of the second nanostructure;

forming a source/drain structure in the first recess;

removing the first gate structure to form a second recess;

removing the first nanostructure and the third nanostructure in the second recess;

smoothing exposed surfaces of the second nanostructure in the second recess; and forming a replacement gate structure in the second recess, wherein the second nanostructure has a first height at a first location under the replacement gate structure, a second height at a second location adjacent the source/drain structure, and a third height at a location between the first location and the second location, wherein the third height is greater than the first height, wherein the third height is greater than the second height.

16. The method of claim 15, further comprising:

prior to forming the first inner spacer and the second inner spacer, smoothing the first upper surface and the first lower surface of the second nanostructure in the first recess.

17. The method of claim 15, wherein a width of the second nanostructure under the replacement gate structure is less than a width of the second nanostructure under the second inner spacer in a plan view.

18. The method of claim 15, wherein smoothing the exposed surfaces of the second nanostructure comprises oxidizing the exposed surfaces to form an oxidation layer and removing the oxidation layer.

19. The method of claim 18, wherein removing the first nanostructure and the third nanostructure leaves a residue on the exposed surfaces of the second nanostructure, and wherein oxidizing the exposed surfaces oxidizes the residue.

20. The method of claim 15, wherein smoothing the exposed surfaces of the second nanostructure reduces an RMS roughness of the exposed surfaces by 50% to 90%.

* * * * *